US012690212B2

(12) United States Patent
    Taylor

(10) Patent No.: US 12,690,212 B2
(45) Date of Patent: Jul. 21, 2026

(54) SEMICONDUCTOR OPTOELECTRONIC INTEGRATED CIRCUIT AND METHODOLOGY FOR MAKING SAME EMPLOYING GATE-ALL-AROUND EPITAXIAL STRUCTURES

(71) Applicant: Geoff W. Taylor, Wilton, NH (US)

(72) Inventor: Geoff W. Taylor, Wilton, NH (US)

( * ) Notice: Subject to any disclaimer, the term of this patent is extended or adjusted under 35 U.S.C. 154(b) by 515 days.

(21) Appl. No.: 18/124,876

(22) Filed: Mar. 22, 2023

(65) Prior Publication Data

US 2023/0317819 A1     Oct. 5, 2023

Related U.S. Application Data

(60) Provisional application No. 63/418,835, filed on Oct. 24, 2022, provisional application No. 63/324,829, filed on Mar. 29, 2022.

(51) Int. Cl.
    *H10D 30/01*      (2025.01)
    *G02B 6/12*       (2006.01)
              (Continued)

(52) U.S. Cl.
    CPC ....... *H10D 30/015* (2025.01); *G02B 6/12007* (2013.01); *G02B 6/131* (2013.01);
              (Continued)

(58) Field of Classification Search
    CPC .... H10D 30/015; H10D 30/014; H10D 30/43; H10D 30/6735; H10D 30/6757;
              (Continued)

(56) References Cited

U.S. PATENT DOCUMENTS

| | | | |
|---|---|---|---|
| 6,031,243 | A | 2/2000 | Taylor |
| 6,479,844 | B2 | 11/2002 | Taylor |

(Continued)

FOREIGN PATENT DOCUMENTS

| | | |
|---|---|---|
| WO | 2002071490 | 9/2002 |
| WO | 2022031465 A1 | 2/2022 |

OTHER PUBLICATIONS

PCT Search Report and Written Opinion dated Jul. 21, 2023 of Application No. PCT/US23/15965.

(Continued)

*Primary Examiner* — Jay C Kim
*Assistant Examiner* — Woo K Lee
(74) *Attorney, Agent, or Firm* — Gordon & Jacobson, P.C.

(57)     ABSTRACT

Integrated circuitry is fabricated from semiconductor layers formed on a substrate, which include a p-type gate-all-around layer structure that includes a plurality of quantum well structures formed between a pair of p-type thin doped layers spaced vertically from one another. A p-type layer is formed above the p-type gate-all-around layer structure. An etch operation exposes the p-type layer. P-type ions are implanted into the exposed second p-type layer to a depth that extends through the p-type gate-all-around layer structure and contacts the p-type thin doped layers of the p-type gate-all-around layer structure. A gate electrode of an n-channel HFET device is formed in contact with the ion-implanted p-type region(s). Source and drain electrodes of the n-channel HFET device are formed in contact with ion-implanted n-type regions that contact the plurality of quantum well structures of the p-type gate-all-around layer structure. P-channel GAA HFET devices, complementary BICFET devices, stacked complementary HFET devices and circuits and/or logic gates based thereon, and a variety (Continued)

Stacked Complementary HFET Inverter X-X' Cross-section of optoelectronic devices and optical devices can also be formed as part of the integrated circuitry.

18 Claims, 55 Drawing Sheets

(51) Int. Cl.

| | | |
|---|---|---|
| *G02B 6/13* | (2006.01) |
| *H01S 5/062* | (2006.01) |
| *H01S 5/183* | (2006.01) |
| *H10D 30/43* | (2025.01) |
| *H10D 30/67* | (2025.01) |
| *H10D 62/10* | (2025.01) |
| *H10D 84/01* | (2026.01) |
| *H10F 77/14* | (2025.01) |

(52) U.S. Cl.
    CPC ...... *H01S 5/06203* (2013.01); *H01S 5/18377* (2013.01); *H10D 30/014* (2025.01); *H10D 30/43* (2025.01); *H10D 30/6735* (2025.01); *H10D 30/6757* (2025.01); *H10D 62/121* (2025.01); *H10D 84/01* (2025.01); *H10F 77/146* (2025.01); *G02B 2006/1215* (2013.01)

(58) Field of Classification Search
    CPC .. H10D 62/121; H10D 84/01; G02B 6/12007; G02B 6/131; G02B 2006/1215; H01S 5/06203; H01S 5/18377; H10F 77/146
    See application file for complete search history.

(56)                References Cited

U.S. PATENT DOCUMENTS

| | | | |
|---|---|---|---|
| 6,841,795 | B2 | 1/2005 | Taylor et al. |
| 6,849,866 | B2 | 2/2005 | Taylor |
| 6,853,014 | B2 | 2/2005 | Taylor et al. |
| 6,870,207 | B2 | 3/2005 | Taylor |
| 6,873,273 | B2 | 3/2005 | Taylor et al. |
| 6,954,473 | B2 | 10/2005 | Taylor et al. |
| 6,995,407 | B2 | 2/2006 | Taylor |
| 6,995,707 | B2 | 2/2006 | Taylor et al. |
| 7,332,752 | B2 | 2/2008 | Taylor et al. |
| 9,082,637 | B2 | 7/2015 | Taylor |
| 9,625,647 | B2 | 4/2017 | Taylor |
| 9,947,804 | B1 | 4/2018 | Frougier |
| 10,038,302 | B2 | 7/2018 | Taylor |
| 2020/0142037 | A1 | 5/2020 | Taylor |
| 2022/0059993 | A1 | 2/2022 | Taylor |

OTHER PUBLICATIONS

U.S. Appl. No. 60/376,238, filed Apr. 26, 2002, Geoff Taylor.
U.S. Appl. No. 08/949,504, filed Oct. 14, 1997, Geoff Taylor.
U.S. Appl. No. 09/710,217, filed Nov. 10, 2000, Geoff Taylor.
EP Search Report dated Feb. 12, 2026 of Application No. 2378-1587.3.

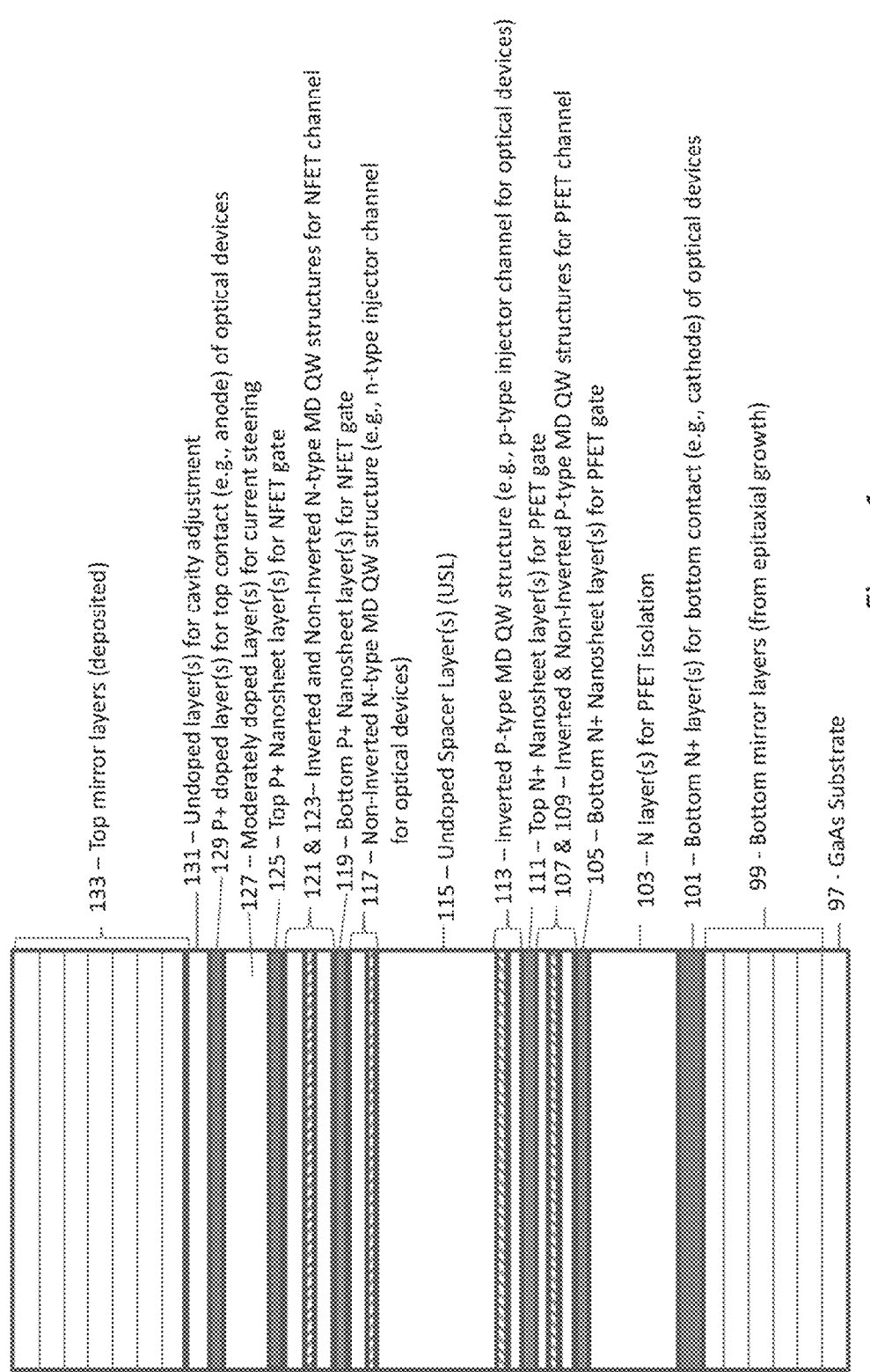

133 – Top mirror layers (deposited)

131 – Undoped layer(s) for cavity adjustment

129 P+ doped layer(s) for top contact (e.g., anode) of optical devices

127 – Moderately doped Layer(s) for current steering

125 – Top P+ Nanosheet layer(s) for NFET gate

121 & 123– Inverted and Non-Inverted N-type MD QW structures for NFET channel

119 – Bottom P+ Nanosheet layer(s) for NFET gate

117 – Non-Inverted N-type MD QW structure (e.g., n-type injector channel for optical devices)

115 – Undoped Spacer Layer(s) (USL)

113 – Inverted P-type MD QW structure (e.g., p-type injector channel for optical devices)

111 – Top N+ Nanosheet layer(s) for PFET gate

107 & 109 – Inverted & Non-Inverted P-type MD QW structures for PFET channel

105 – Bottom N+ Nanosheet layer(s) for PFET gate

103 – N layer(s) for PFET isolation

101 – Bottom N+ layer(s) for bottom contact (e.g., cathode) of optical devices

99 - Bottom mirror layers (from epitaxial growth)

97 - GaAs Substrate

Figure 1

PHFET TOP VIEW

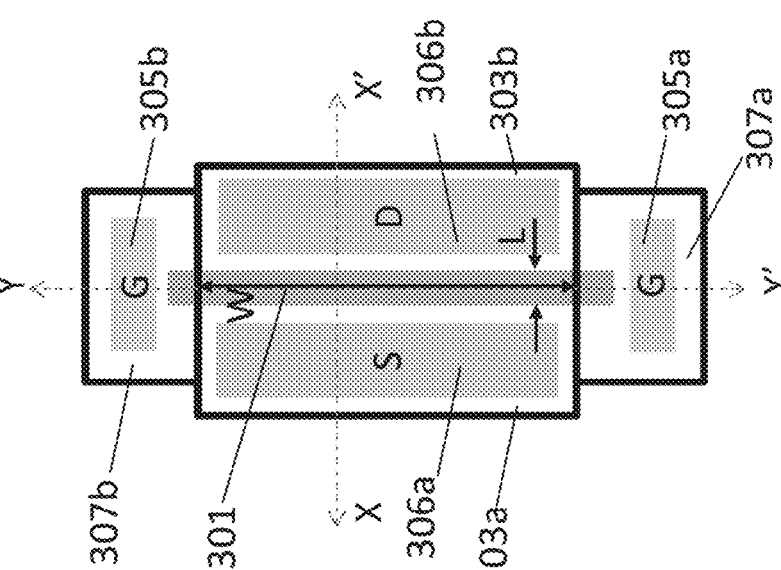

PHFET Features

301   Tungsten feature patterned on mesa formed by etch to layer 115 (Figures 3A, 3B, 3C); the feature overlies the channel of the PFET and is used to etch further into layer 115 about 200Å above the p-type mod doped QW structure 113

302a , 302b   N+ Ion implant regions for Gate-All-Around of PFET (Figure 3C)

303a , 303b   Mesas for S/D of PFET at layer 115 (Figures 3A, 3B)

304a, 304b   P+ Ion implant regions for Source (S)/Drain(D) Terminals (Figures 3B)

305a, 305b   N Au for Two Gate Terminals (Figures 3A, 3C)

306a, 306b   P Au for Source(S)/Drain(D) Terminals (Figures 3A, 3B)

307a, 307b   Mesas for Gate-All-Around of PFET at layer 115 (Figures 3A, 3C)

309 Etch to bottom mirror layers 103 (Figures 3B, 3C)

Figure 3A

PHFET X-X' Cross-section

NHFET Top View

Figure 3D

NFET Features

301  Tungsten feature patterned on mesa
      formed by etch to layer 127 (Figures 3D, 3E, 3F);
      the feature overlies the channel of the NFET
      and is used to etch into layer 127 about 200A
      above layer 125

312a, 312b  Mesas for S/D of NFET at layer 127
             (Figures 3D, 3E)

313a, 313b  N+ Ion Implant regions for Source(S)/Drain(D) Terminals
             (Figure 3E)

314a, 314b  P+ Ion Implant for Gate-All-Around of NFET
             (Figure 3F)

315a, 315b  P Au for Gate Terminals
             (Figures 3D and 3F)

316a, 316b  N Au for Source(S)/Drain(D) Terminals
             (Figures 3D, 3E)

317a, 317b  Mesa for Gate-All-Around of NFET in layer 127
             (Figures 3E, 3F)

309  Etch to bottom mirror layers 103 (Figures 3E, 3F)

NHFET Y-Y' Cross-section

STACKED COMPLEMENTARY
HFET INVERTER (NFET STACKED
ON PFET)

Vdd

PFET

IN

OUT

NFET

GND

Top View of Stacked Complementary HFET Inverter

IN

Y

Y'

X

X'

GND

OUT

VDD

Figure 4B

Stacked Complementary HFET Inverter X-X' Cross-section

Figure 4C

Stacked Complementary HFET Inverter Y-Y' Cross-section

Figure 4D

Top View of Alternative Stacked Complementary HFET Inverter

Top View of Alternative Stacked Complementary HFET Inverter

2 INPUT NAND GATE
with Stacked Complementary HFETs

2 INPUT NAND GATE
with Stacked Complementary HFETs

NFET2 STACKED ON PFET2

NFET1 STACKED ON PFET1

2-INPUT NOR GATE
with Stacked Complementary HFETs

Top View of 2-INPUT NOR GATE

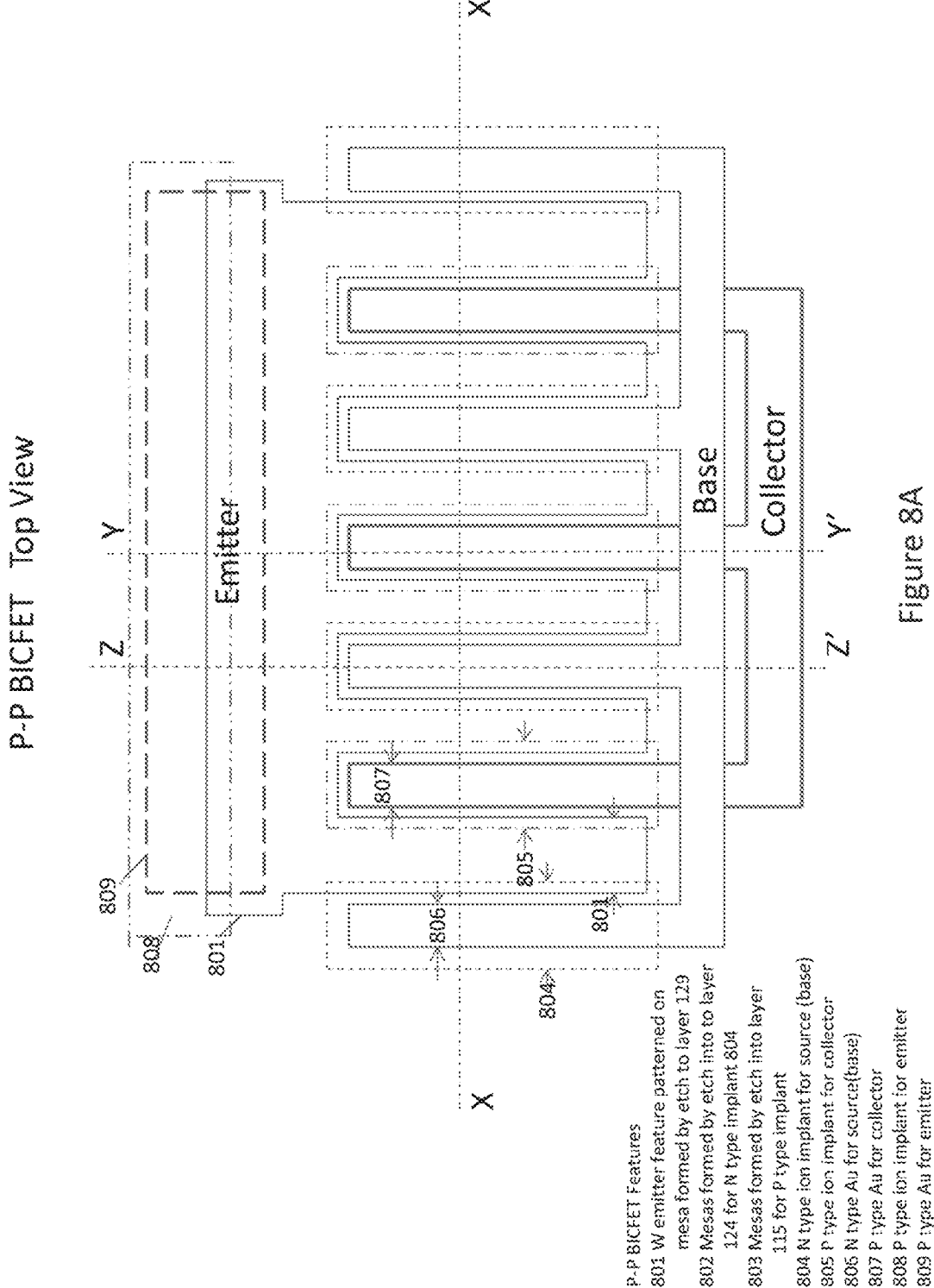

P-P BICFET  Top View

Emitter

Base

Collector

Figure 8A

P-P BICFET Features
801 W emitter feature patterned on
    mesa formed by etch to layer 129
802 Mesas formed by etch into to layer
    124 for N type implant 804
803 Mesas formed by etch into layer
    115 for P type implant
804 N type ion implant for source (base)
805 P type ion implant for collector
805 N type Au for source(base)
807 P type Au for collector
808 P type ion implant for emitter
809 P type Au for emitter P-P BICFET X-X' Cross-section W feature (801)

Collector (807)

Base (806)

N-type ion Implant (804)

P-type ion Implant (805)

129
127
125
123,121
119
117
115
113
111
109,107
105
103
101
99,97

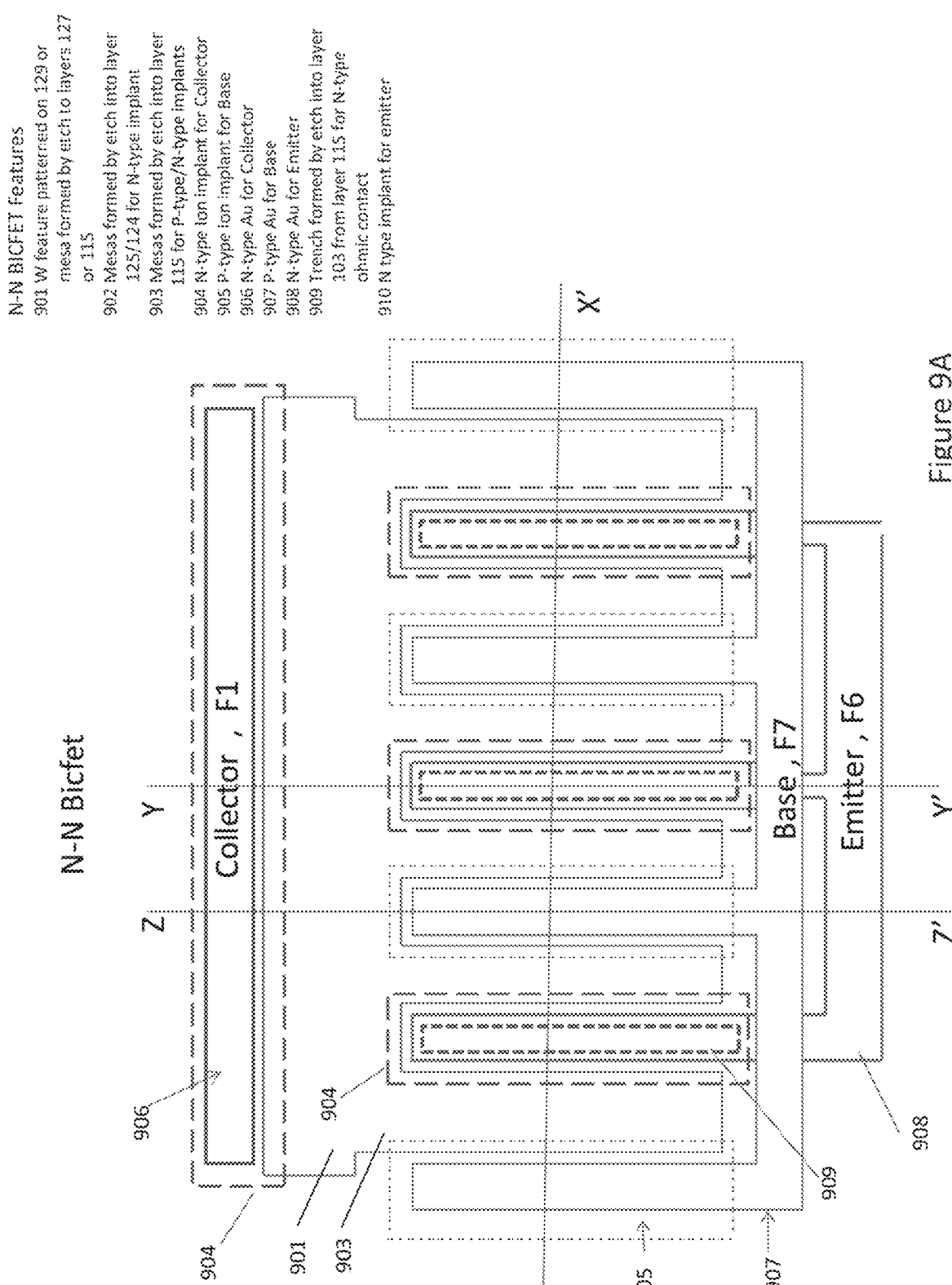

N-N BICFET features
901 W feature patterned on 129 or mesa formed by etch to layers 127 or 115
902 Mesas formed by etch into layer 125/124 for N-type implant
903 Mesas formed by etch into layer 115 for P-type/N-type implants
904 N-type Ion implant for Collector
905 P-type ion implant for Base
906 N-type Au for Collector
907 P-type Au for Base
908 N-type Au for Emitter
909 Trench formed by etch into layer 103 from layer 115 for N-type ohmic contact
910 N type implant for emitter N-N Bicfet Collector , F1

Base , F7

Emitter , F6

Figure 9A

N-N BICFET X-X' Cross-section 127
125
123,121
119
115 117
113
111
109,107
105
103
101
99,97

W feature
(901)

903

Base (907)

N-type ion
implant (910)

P-type ion
implant (905)

N-N BICFET Y-Y' Section

W feature (901)

Collector (906)

902

N-type ion Implant (904)

115

113
111
109, 107
105
103
101
99, 97

129
125
123, 121
119
117

903

Emitter (908)

N-type ion Implant (910)

909

Base (907)

dielectric

HFET VCSEL Diode Laser
Plan View

Aperture Implant
Mask

Tungsten

N+, O Implant

N Au contact

Thyristor VCSEL Top View

N+ Cathode

P-channel
(or P-source)

N-channel
or N-Source)

Tungsten Anode

Aperture implant mask

Figure 11A

Thyristor VCSEL Cross-section

Thyristor In-Plane Laser
(Single Frequency) – Plan View

Thyristor In-Plane Laser - Plan View

Thyristor In-Plane Laser Cross-section X-X'

Thyristor In-Plane Laser Cross-section Z-Z'

Top View of Dual Input Directional Coupler

Thyristor Optoelectronic Oscillator – Plan View

Linear Waveguide Optical Detector , Modulator or Optical Amplifier

Linear Waveguide Optical Detector, Modulator or Optical Amplifier

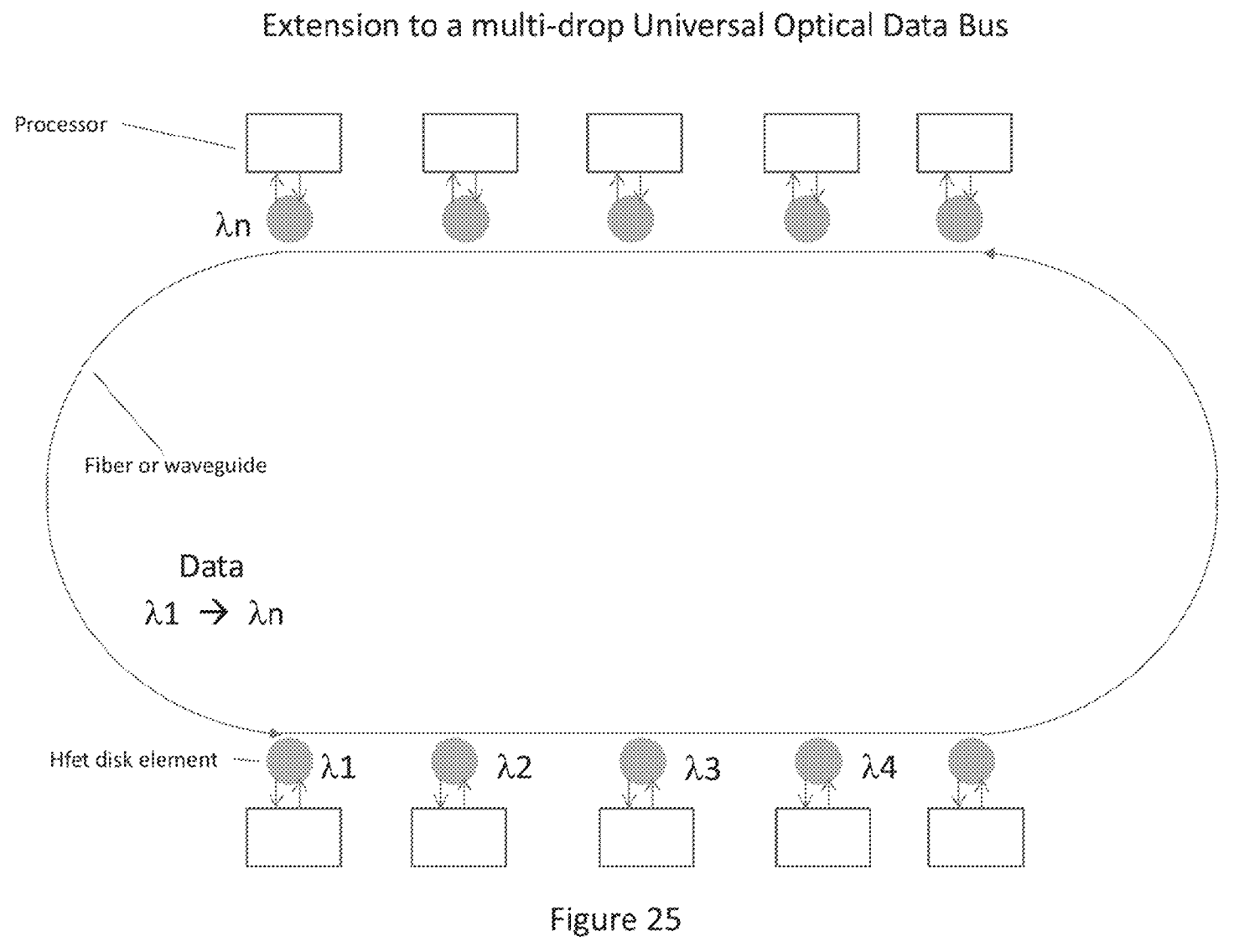

Extension to a multi-drop Universal Optical Data Bus

Processor $\lambda n$

Fiber or waveguide

Data
$\lambda 1 \rightarrow \lambda n$

Hfet disk element $\lambda 1$   $\lambda 2$   $\lambda 3$   $\lambda 4$

Figure 25

Thyristor Energy Diagram – Zero Bias

SEMICONDUCTOR OPTOELECTRONIC INTEGRATED CIRCUIT AND METHODOLOGY FOR MAKING SAME EMPLOYING GATE-ALL-AROUND EPITAXIAL STRUCTURES

This application claims benefit of U.S. Provisional Patent Application Ser. No. 63/324,829, filed on Mar. 29, 2022, and U.S. Provisional Patent Application Ser. No. 63/418,835, filed on Oct. 24, 2022, both of which are hereby incorporated herein by reference in their entireties.

BACKGROUND

Field

The present application relates to semiconductor opto-electronic integrated circuits that implement electronic functions (such as heterojunction field-effect transistors) and optoelectronic functions (such as optical emitters, optical detectors and optical switches, active waveguides) and optical functions (such as passive waveguides and couplers) as well as fabrications methods for such integrated circuits.

State of the Art

The present application builds upon technology (referred to as "Planar Optoelectronic Technology" or "POET") that provides for the realization of a variety of devices (opto-electronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002;

U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002: U.S. patent application Ser. No. 10/323,388, filed on Dec. 19, 2002; U.S. patent application Ser. No. 10/340,942, filed on Jan. 13, 2003; U.S. patent application Ser. No. 13/921,311, filed on Jun. 19, 2013; and U.S. patent application Ser. No. 14/222,841, filed on Mar. 24, 2014; and U.S. patent application Ser. No. 15/450,400 filed Mar. 6, 2017, all of which are hereby incorporated by reference in their entireties.

With these structures, a fabrication sequence can be used to make the devices on a common substrate. In other words, n-type and p-type contacts, critical etches, etc. can be used to realize all of these devices monolithically on a common substrate. The essential features of this device structure include 1) a non-inverted n-type modulation-doped structure offset vertically from an inverted p-type modulation-doped quantum well structure by an undoped spacer region, 2) self-aligned n-type channel contacts formed by implanted n-type ions that contact the non-inverted n-type modulation-doped structure, 3) self-aligned p-type channel contacts formed by implanted p-type ions that contact the inverted p-type modulation-doped structure, 4) n-type metal formed on the n-type channel contacts and on a bottom n-type layer disposed below the inverted p-type modulation-doped quantum well structure, and 5) p-type metal formed on the p-type channel contacts and on a top p-type layer disposed above the non-inverted n-type modulation-doped quantum well structure. The active device structures are preferably realized with a compound semiconductor system of group III-V materials (such as a GaAs/AlGaAs).

POET can be used to construct a variety of optoelectronic devices. POET can also be used to construct a variety of high-performance transistor devices, such as complementary NHFET and PHFET unipolar field-effect transistors, and complementary bipolar field-effect transistors.

The NHFET transistors (or n-channel HFET transistors) employ the non-inverted n-type modulation-doped quantum well structure, which includes an n-type charge sheet disposed above one or more quantum wells. The quantum well(s) of the non-inverted n-type modulation-doped quantum well structure form an active channel for conduction of electron charge carriers between source and drain electrode terminals. A heavily doped p-type layer spaced above the n-type charge sheet forms a gate region that applies an electric field that controls the flow of the electron charge carriers through the active channel formed by the quantum well(s). In this configuration, the inverted p-type modulation-doped quantum well structure functions as a back-gate terminal for the n-type HFET transistor device.

The PHFET transistors (or p-channel HFET transistors) employ an inverted p-type modulation-doped quantum well structure, which includes a p-type charge sheet disposed below one or more quantum wells. The quantum well(s) of the inverted p-type modulation-doped quantum well structure form an active channel for conduction of hole charge carriers between source and drain electrode terminals. A heavily doped n-type layer spaced below the p-type charge sheet forms a gate region that applies an electric field that controls the flow of the hole charge carriers through the active channel formed by the quantum well(s). In this configuration, the non-inverted n-type modulation-doped quantum well structure functions as a back-gate terminal for the p-type HFET transistor device.

In both the NFET and PHFET transistor devices, the channel charge is modulated by the gate from one side only and the back-gate is subjected to a dc bias to control the onset of inversion or channel conductivity. Such a structure is adequate for longer channel lengths in the range of greater than 100 nm. For aggressively scaled structures with gate lengths less than 100 nm, the presence of the back-gate region leads to a degraded value of output resistance and subthreshold turn-off slope as a result of drain-induced-barrier-lowering (dibl).

SUMMARY

In accordance with the present disclosure, semiconductor devices are formed from a novel epitaxial layer structure adapted to provide gate-all-around (GAA) layer structures for both NHFET and PHFET transistor devices. The gate-all-around (GAA) layer structures eliminate any influence from a back-gate region for these transistor devices.

In embodiments, the GAA layer structure for the PHFET transistor devices, which is referred to as the "first GAA layer structure" herein, includes a pair of quantum well structures (e.g., an inverted p-type modulation-doped quantum well structure disposed below a non-inverted p-type modulation-doped quantum well structure) disposed between thin n-type doped layers (e.g., nanosheets) spaced vertically from one another. One or more additional pair of quantum well structures (e.g., inverted p-type modulation-doped quantum well structure disposed below a non-inverted p-type modulation-doped quantum well structure) disposed between thin n-type doped layers (e.g., nanosheets) spaced vertically from one another can also be used. In this configuration, the thin n-type doped layers are disposed adjacent (and preferably contact) upper and lower boundaries of the p-type modulation-doped quantum well structures. The thin n-type doped layers form gate regions adjacent to the upper and lower boundaries of the p-type modulation-doped quantum well structures. These gate regions can be configured to apply an electric field that controls the flow of the hole charge carriers through the active channel formed by the quantum well(s) of the p-type modulation-doped quantum well structures for the NHFET transistor devices. Gate contacts for the PHFET transistor devices are provided by n-type ions that are implanted with sufficient depth to contact the thin n-type doped layers that are disposed above and below the quantum well structures of the first GAA layer structure. Source and drain contacts for the PHFET transistor devices are provided by p-type ions that are implanted with sufficient depth to contact the quantum well structures of the first GAA layer structure.

In embodiments, the GAA layer structure for the NHFET transistor devices, which is referred to as the "second GAA layer structure" herein, includes a pair of quantum well structures (e.g., an inverted n-type modulation-doped quantum well structure disposed below a non-inverted n-type modulation-doped quantum well structure) disposed between p-type thin doped layers (e.g., nanosheets) spaced vertically from one another. One or more additional pair of quantum well structures (e.g., an inverted n-type modulation-doped quantum well structure disposed below a non-inverted n-type modulation-doped quantum well structure) disposed between the thin p-type doped layers (e.g., nanosheets) spaced vertically from one another can also be used. In this configuration, the thin p-type doped layers are disposed adjacent (and preferably contact) upper and lower boundaries of the n-type modulation-doped quantum well structures. The thin p-type doped layers form gate regions adjacent to the upper and lower boundaries of the n-type modulation-doped quantum well structures. These gate regions can be configured to apply an electric field that controls the flow of the electron charge carriers through the active channel formed by the quantum well(s) of the n-type modulation-doped quantum well structures for NHFET transistor devices. Gate contacts for the NHFET transistor devices are provided by p-type ions that are implanted with sufficient depth to contact the p-type thin doped layers that are disposed above and below the quantum well structures of the second GAA layer structure. Source and drain contacts for the NHFET transistor devices are provided by n-type ions that are implanted with sufficient depth to contact the quantum well structures of the second GAA layer structure.

In embodiments, an intermediate layer structure is disposed between the first GAA layer structure and the second GAA layer structure. In one embodiment, the intermediate layer structure can include an inverted p-type modulation-doped quantum well structure spaced vertically below a non-inverted n-type modulation-doped quantum well structure by an undoped spacer layer. This one embodiment can be used to implement non-digital optical devices (e.g., lasers where decreasing voltage can produce increasing current, optical detectors where increasing current can produce decreasing voltage, or optical modulators that can operate in either mode). In another embodiment, the intermediate layer structure may include one or more undoped spacer layers and thus omit the inverted p-type modulation-doped quantum well structure spaced vertically below a non-inverted n-type modulation-doped quantum well structure. This other embodiment can be used to implement analog optical devices (e.g., lasers where increasing voltage can produce increasing current, optical detectors where decreasing current can produce decreasing voltage, or optical modulators that can operate in either mode).

Semiconductor devices formed from the novel epitaxial layer structure provide many advantages, including:

negligible dibl maximized gm lower HFET capacitance to realize higher speed operation, reduced footprint; and decoupling of certain layers structures that implement the HFET transistors from the layer structures that implement digital optical devices (e.g., lasers where decreasing voltage can produce increasing current, optical detectors where increasing current can produce decreasing voltage, or optical modulators that can operate in either mode) and complementary bipolar field-effect transistors to enable optimized design parameters for the different devices as well as scaling into the sub 100 nm range.

In embodiments, the HFET transistor devices implemented with the first and second GAA layer structures as described herein can be characterized by a lower threshold voltage than the corresponding quantum well channels of the non-inverted n-type modulation-doped quantum well structure and the inverted p-type modulation-doped quantum well structure of the intermediate layer structure. In this configuration, the quantum well channels of the non-inverted n-type modulation-doped quantum well structure and the inverted p-type modulation-doped quantum well structure of the intermediate layer structure do not turn on during the operation of the HFET transistor devices, but instead are used for the control and operation of digital optical devices (e.g., lasers where decreasing voltage can produce increasing current, optical detectors where increasing current can produce decreasing voltage, or optical modulators that can operate in either mode) and complementary bipolar field-effect transistors. Effectively, the novel epitaxial layer structure provides HFET transistor devices with multiple quantum well structures used for the electrical and optical operation of the HFET transistor devices and independent modulation-doped quantum well structures used for the control and operation of the digital optical devices and complementary bipolar field-effect transistors.

Methods of forming an integrated circuit and the resulting integrated circuitry employ a plurality of semiconductor layers formed on a substrate including i) at least one n-type layer, ii) the first GAA layer structure (for PHFET transistor devices) disposed above the at least one n-type layer, iii) the intermediate layer structure for optical devices and complementary bipolar field-effect transistors disposed above the first GAA layer structure, iv) the second GAA layer structure (for NHFET transistor devices) disposed above the intermediate layer structure; and v) at least one p-type layer disposed above the second GAA layer structure. The at least one p-type layer of v) includes a first p-type layer of relatively lower concentration of p-type doping formed below a second p-type layer of relatively higher concentration of p-type doping. An etch operation (E1) into the plurality of semiconductor layers exposes a portion of the first p-type layer. P-type ions are implanted into the exposed first p-type layer to a sufficient depth to penetrate through the second GAA layer structure and contact all the p-type nanosheets of the second GAA layer structure to form an ion-implanted p-type gate contact region that contacts all the p-type nanosheets of the second GAA layer structure. N-type ions are implanted into the exposed second p-type layer to a sufficient depth to penetrate into or through the second GAA layer structure and contact the quantum well structures of the second GAA layer structure to form ion-implanted p-type source and drain contact regions that contact the quantum well structures of the second GAA layer structure. A gate electrode of an NHFET transistor device is formed in contact with the ion-implanted p-type gate contact region. Source and drain electrodes of the NHFET transistor device are formed in contact with the ion-implanted n-type source and drain contact regions, respectively. PHFET transistor devices, complementary BICFET devices, stacked complementary HFET devices and circuits and/or logic gates based thereon, and a variety of optoelectronic devices and optical devices can also be formed as part of the integrated circuit.

BRIEF DESCRIPTION OF THE DRAWINGS

FIG. 1 is a schematic illustration of an exemplary epitaxial semiconductor layer structure for integrated circuit device structures described herein.

FIG. 3A is a schematic top view of an exemplary PHFET (or p-channel HFET) transistor device according to the present disclosure.

FIG. 3D is a schematic top view of an exemplary NHFET (or n-channel HFET) transistor device according to the present disclosure.

FIG. 4B is a schematic top view of an exemplary stacked complementary HFET inverter according to the present disclosure.

FIG. 4C is a schematic cross-section view of the exemplary stacked complementary HFET inverter of FIG. 4B along the section labeled X-X' in FIG. 4B.

FIG. 4D is a schematic cross-section view of the exemplary stacked complementary HFET of FIG. 4B along the section labeled Y-Y' in FIG. 4B.

FIG. 8A is a schematic top view of an exemplary P-P BICFET transistor device according to the present disclosure.

FIG. 9A is a schematic top view of an exemplary N-N BICFET device according to the present disclosure.

FIGS. 11A and 11B illustrate a thyristor VCSEL realized from the epitaxial layer structure and fabrication methodology as described herein

FIG. 25 illustrates a Universal Optical Data Bus with components realized from the epitaxial layer structure and fabrication methodology as described herein.

DETAILED DESCRIPTION OF THE PREFERRED EMBODIMENTS

Figure 2A:
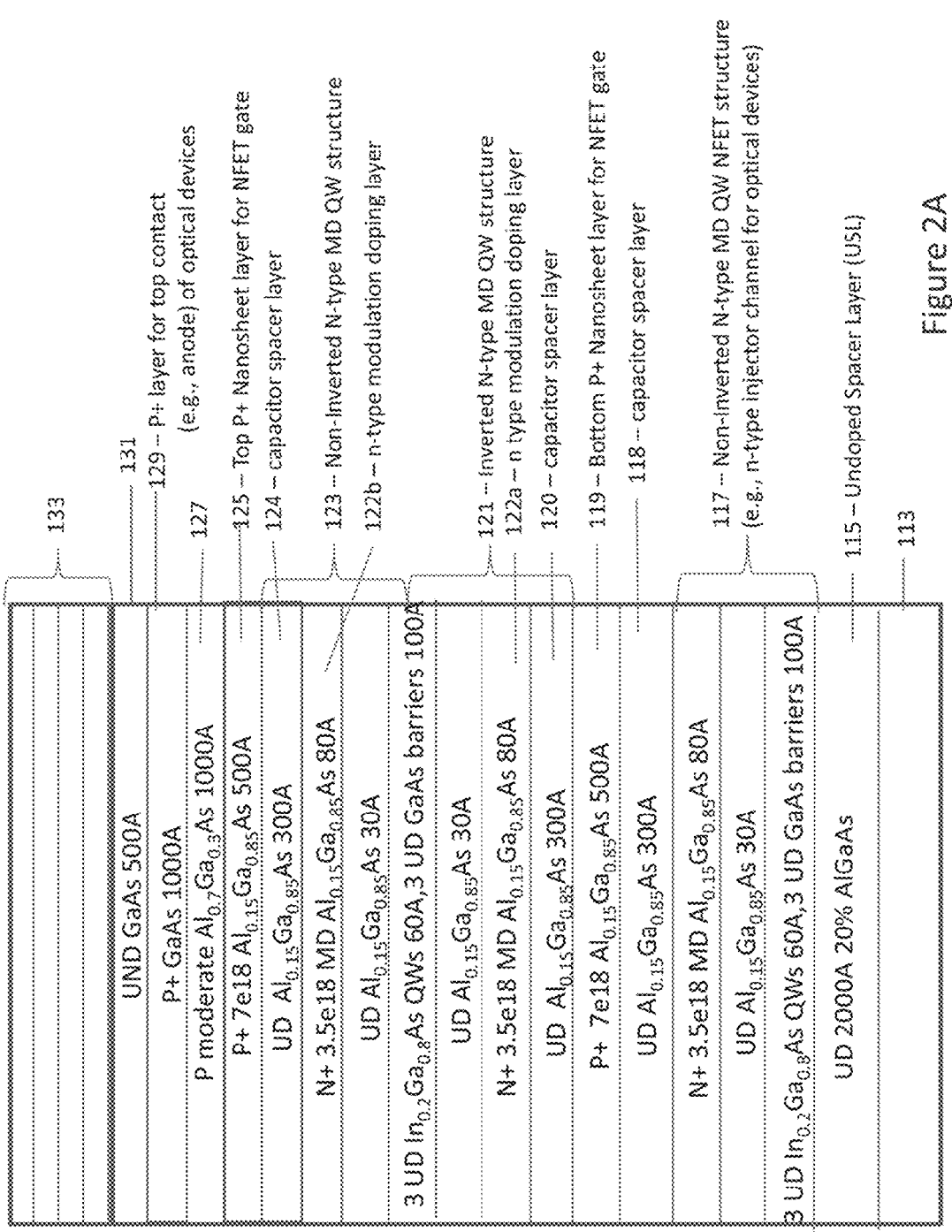
FIGS. 2A and 2B, collectively, is a chart illustrating an exemplary epitaxial semiconductor layer structure for realizing the integrated circuit device structures described herein.

Turning now to FIG. 1, an epitaxial semiconductor layer structure of the present application includes bottom mirror layers 103 formed on a substrate 101, such as a substrate realized from a compound semiconductor such as gallium arsenide (GaAs) or other suitable substrate. The bottom mirror layers 103 can form a distributed Bragg reflector (DBR) mirror which is typically constructed by epitaxial deposition of pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda$/4) optical thickness, the reflections from each of the boundaries will be added in phase to produce a large amount of reflected light (e.g., a large reflection coefficient) at the particular center wavelength $\lambda_C$. The layers in the mirror are typically undoped. However, it is possible to dope the top 1-3 layers with heavy n-type doping to a typical concentration of 3e18 cm-3 in order to reduce the parasitic cathode resistance of optical devices. Deposited upon the bottom mirror layers 99 is the active device structure suitable for realizing complementary heterostructure field-effect transistor (HFET) devices, possibly other electronic devices, optoelectronic devices, and optical devices.

First, one or more heavily doped n-type layer(s) 105 are formed on or above the bottom mirror layers 103. The heavily doped n-type layer(s) 105 has n-type doping of a concentration of at least 3.5e18 cm$^{-3}$, which causes an increase in electrical conduction such that the layer(s) 105 have metallic-like characteristics. The heavily doped n-type layer(s) 105 can provide a bottom n-type ohmic contact region for terminals (e.g., cathode terminals) of optoelectronic devices. One or more lightly doped n-type layer(s) 103 are formed on the heavily doped n-type layer(s) 101. The lightly doped n-type layer(s) 103 has n-type doping of a concentration in the range between 5e16 cm$^{-3}$ and 5e17 cm$^{-3}$. The lightly doped n-type layer(s) 103 provides for isolation between the bottom n-type ohmic contact region and the layers there above and also low capacitance for the P-channel HFET source and drain regions.

Layers for a first GAA layer structure are formed on or above the lightly doped n-type layer(s) 103. The first GAA layer structure includes a pair of quantum well structures (which includes the inverted p-type modulation-doped quantum well structure 107 with a bottom p-type modulation doping layer (108*a*) disposed below a non-inverted p-type modulation-doped quantum well structure 109 with a top p-type modulation doping layer (108*b*) disposed between heavily doped n-type layers 105, 111 (e.g., nanosheets) spaced vertically from one another. The inverted p-type modulation-doped quantum well structure 107 includes a heavily doped p-type modulation doping layer (p-type charge sheet 108*a*) spaced below one or more quantum wells by an undoped spacer layer. The quantum well(s) can be surrounded by barrier layers as is well known. The non-inverted p-type modulation-doped quantum well structure 109 includes a heavily doped p-type modulation doping layer (p-type charge sheet 108*b*) spaced above one or more quantum wells by an undoped spacer layer. The quantum well(s) can be surrounded by barrier layers as is well known. In this configuration, the thin n-type doped layers 105, 111 are disposed adjacent (and contact) upper and lower boundaries of the p-type modulation-doped quantum well structures 107, 109. The thin n-type doped layers 105, 111 form gate regions adjacent the upper and lower boundaries of the p-type modulation-doped quantum well structures 107,109. These gate regions can be configured to apply an electric field that controls the flow of the hole charge carriers through the active channel formed by the quantum well(s) of the p-type modulation-doped quantum well structures 107, 109 for PHFET transistor devices. The heavily doped p-type modulation doping layers (108*a*, 108*b*) can have p-type doping of a concentration of at least 7e18 cm-3. The n-type doped layers 105, 111 can have n-type doping of a concentration of at least 3.5e18 cm-3. The first GAA layer structure can also include an undoped capacitor spacer layer (106) disposed between the n-type nanosheet 105 and the p-type modulation doping layer (108*a*) as well as an undoped capacitor spacer layer (110) disposed between the p-type modulation doping layer (108*b*) and the n-type charge sheet 111.

Next, layers 113 for an inverted p-type modulation-doped QW structure are optionally deposited and spaced above the first GAA layer structure by an undoped spacer layer (112). The inverted p-type modulation-doped quantum well layer structure 113 includes a heavily doped p-type modulation doping layer (p-type charge sheet) spaced below one or more quantum wells by an undoped spacer layer. The heavily doped p-type modulation doping layer can have p-type doping of a concentration of at least 7e18 cm-3. The quantum well(s) can be surrounded by barrier layers as is well known. The layer structure 113 can be used for the case where digital optical devices and bipolar transistors are desired. In this embodiment, thyristor-like current voltage characteristics suitable for the digital optical devices (e.g., lasers where decreasing voltage can produce increasing current, optical detectors where increasing current can produce decreasing voltage, or optical modulators that can operate in either mode) can be obtained vertically through the bulk epitaxial layer structure. On the other hand, for the case where digital optical devices and bipolar transistors are not desired, the layer structure 113 can be omitted. In this alternate embodiment, PIN diode-like current-voltage characteristics suitable for analog optical devices (e.g., lasers where increasing voltage can produce increasing current, optical detectors where decreasing current can produce decreasing voltage, or optical modulators that can operate in either mode) can be obtained vertically through the bulk epitaxial layer structure.

One or more undoped spacer layers 115 can be formed on or above the inverted p-type modulation-doped QW structure 113 (if present), or optionally on or above the first GAA layer structure when the inverted p-type modulation-doped QW structure 113 is omitted.

Next, layers for a non-inverted n-type modulation-doped QW structure 117 are optionally formed on or above the undoped spacer layer(s) 115. The non-inverted n-type modulation-doped quantum well structure 117 includes a heavily doped n-type modulation doping layer (n-type charge sheet) spaced above one or more quantum wells by an undoped spacer layer. The heavily doped n-type modulation doping layer can have n-type doping of a concentration of at least 3.5e18 cm-3. The quantum well(s) can be surrounded by barrier layers as is well known. The layer structure 117 can be used for the case where digital optical devices and bipolar transistors are desired. In this embodiment, thyristor-like current voltage characteristics suitable for the digital optical devices (e.g., lasers where decreasing voltage can produce increasing current, optical detectors where increasing current can produce decreasing voltage, or optical modulators that can operate in either mode) can be obtained vertically through the bulk epitaxial layer structure. On the other hand, for the case where digital optical devices and bipolar transistors are not desired, the layer structure 117 can be omitted. In this alternate embodiment, PIN diode-like current-voltage characteristics suitable for analog optical devices (e.g., lasers where increasing voltage can produce increasing current, optical detectors where decreasing current can produce decreasing voltage, or optical modulators that can operate in either mode) can be obtained vertically through the bulk epitaxial layer structure.

Layers for a second GAA layer structure are spaced above the non-inverted n-type modulation-doped QW structure 117 (if present) by an undoped spacer layer (118), or optionally on or above the undoped spacer layer(s) 115 when the non-inverted n-type modulation-doped QW structure 117 is omitted. The second GAA layer structure includes a pair of quantum well structures (which includes the inverted n-type modulation-doped quantum well structure 121 with a bottom n-type modulation doping layer (122a) disposed below a non-inverted n-type modulation-doped quantum well structure 123 with a top n-type modulation doping layer (122b) disposed between heavily doped p-type doped layers 119, 125 (e.g., nanosheets) spaced vertically from one another. The inverted n-type modulation-doped quantum well structure 121 includes a heavily doped n-type modulation doping layer (n-type charge sheet 122a) spaced below one or more quantum wells by an undoped spacer layer. The quantum well(s) can be surrounded by barrier layers as is well known. The non-inverted n-type modulation-doped quantum well structure 122 includes a heavily doped n-type modulation doping layer (n-type charge sheet 122b) spaced above one or more quantum wells by an undoped spacer layer. The quantum well(s) can be surrounded by barrier layers as is well known. In this configuration, the thin p-type doped layers 119, 125 are disposed adjacent (and contact) upper and lower boundaries of the n-type modulation-doped quantum well structures 121, 123. The thin p-type doped layers 119, 125 form gate regions adjacent the upper and lower boundaries of the n-type modulation-doped quantum well structures 121,123. These gate regions can be configured to apply an electric field that controls the flow of the electron charge carriers through the active channel formed by the quantum well(s) of the n-type modulation-doped quantum well structures 121, 123 for NHFET transistor devices. The heavily doped n-type modulation doping layers (122a, 122b) can have n-type doping of a concentration of at least 3.5e18 cm-3. The p-type doped layers 105, 111 can have p-type doping of a concentration of at least 7e18 cm-3. The second GAA layer structure can also include an undoped capacitor spacer layer (118) disposed between the p-type doped layer 119 and the n-type modulation doping layer (122a) as well as an undoped capacitor spacer layer (124) disposed between the n-type modulation doping layer (1228b) and the p-type doped layer 125.

One or more moderately doped p-type layer(s) 127 are formed on or above the second GAA layer structure. The moderately doped p-type layer(s) 126 has p-type doping of a concentration in the range between 5e16 cm-3 and 5e17 cm-3.

One or more heavily doped p-type layer(s) 129 are formed on or above the moderately doped p-type layer(s) 127. The heavily doped p-type layer(s) 129 can provide a top p-type ohmic contact region for terminals (e.g., anode terminals) of optoelectronic devices. The moderately doped p-type layer(s) 127 provides for isolation for optical devices between the top p-type ohmic contact region and the layers there below by virtue of the fact that it can be converted to n-type doping with an ion implant.

One or more undoped spacer layer(s) 131 can be formed on or above the heavily doped p-type layer(s) 129. as shown. To form a resonant cavity device for optical signal emission and/or detection, top mirror layers 133 can be formed over the active device structure described above. The top mirror layers 133 can be formed by depositing pairs of semiconductor or dielectric materials with different refractive indices. The one or more undoped spaced layers 131 can provide for adjustment of the vertical cavity dimensions for the resonant cavity devices, to form an aperture for optical devices (such as VCSELs) as described herein, and to form active and passive in-plane optical waveguide structures for optical devices.

In this configuration, the second GAA layer structure (for the NHFET transistor devices) is stacked above the first GAA layer structures (for the PHFET transistor devices) as part of the active device structure.

To fabricate the n-channel HFET transistor devices, electrical contact is made to the second GAA layer structure (layer(s) 19 and 125) by etching down to expose portions of one of the layers (such as p-type layer 127) above the second GAA layer structure and implanting p-type ions into the exposed layer such that the p-type ions penetrate through the second GAA layer structure and contact the p-type doped layers (layer(s) 119 and 125) of the second GAA layer structure to form one or more ion-implanted p-type gate contact regions that contact the p-type doped layers of the second GAA layer structure. In embodiments, the ion-implanted p-type gate contact region(s) can penetrate through both the second GAA layer structure and the n-type modulation-doped QW structure 117 (if present) into layer 115. A p-type metal can be deposited and patterned on the ion-implanted p-type gate contact region(s). This resultant patterned p-type metal forms the gate electrode of the n-channel HFET transistor device.

A source terminal electrode and a drain terminal electrode of the n-channel HFET transistor device are electrically coupled via ion implanted n-type source and drain contact regions to opposite ends of a QW channel(s) realized in the n-type modulation-doped QW structure 121, 123 of the second GAA layer structure. Etch operations can etch down and expose portions of layer 125. N-type ions are implanted into the exposed second p-type layer 125 to a sufficient depth to penetrate into or through the second GAA layer structure and contact the n-type modulation-doped QW structures 121, 123 of the second GAA layer structure to form ion-implanted n-type source and drain contact regions that contact the quantum well structures of the second GAA layer structure on opposite ends of the QW channel(s) realized in the GAA n-type modulation-doped QW structures 121, 123 of the second GAA layer structure. In embodiments, the ion-implanted n-type source and drain contact regions can penetrate through both the second GAA layer structure and the n-type modulation-doped QW structure 117 (if present) into layer 115. An n-type metal can be deposited and patterned on the ion-implanted n-type source and drain contact regions. The resultant patterned n-type metal forms the source and drain electrodes of the n-channel HFET transistor device.

To fabricate the p-channel HFET transistor devices, electrical contact is made to the first GAA layer structure (layer(s) 105 and 111) by etching down to expose portions of one of the layers (such as layer 115) above the first GAA layer structure region and implanting n-type ions into the exposed layer such that the n-type ions penetrate through the first GAA layer structure and contact the n-type doped layers (layer(s) 105 and 111) of the first GAA layer structure to form one or more ion-implanted n-type gate contact regions that contact the n-type doped layers of the first GAA layer structure. In embodiments, the ion-implanted n-type gate contact region(s) can penetrate through both the p-type modulation-doped QW structure 113 (if present) and the first GAA layer structure into layer 103. An n-type metal can be deposited and patterned on the ion-implanted n-type gate contact region(s). This resultant patterned n-type metal forms the gate electrode of the p-channel HFET transistor device.

A source terminal electrode and a drain terminal electrode of the p-channel HFET transistor device are electrically coupled via ion-implanted p-type source and drain contact regions to opposite ends of a QW channel(s) realized in the p-type modulation-doped QW structure 107, 109 of the first GAA layer structure. Etch operations can etch down and expose portions of layer 115. P-type ions are implanted into the exposed second p-type layer 115 to a sufficient depth to penetrate into or through the first GAA layer structure and contact the p-type modulation-doped QW structure 107, 109 of the first GAA layer structure to form an ion-implanted p-type source and drain contact regions that contact the quantum well structures of the first GAA layer structure on opposite ends of the QW channel(s) realized in the GAA p-type modulation-doped QW structures 107, 109 of the first GAA layer structure. In embodiments, the ion-implanted p-type source and drain contact regions can penetrate through both the p-type modulation-doped QW structure 113 (if present) and the first GAA layer structure into layer 103.

A p-type metal can be deposited and patterned on the ion-implanted p-type source and drain contact regions. The resultant patterned p-type metal forms the source and drain electrodes of the p-channel HFET device.

Both the GAA n-channel HFET transistor device and the GAA p-channel HFET transistor device are field-effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET transistor device or a two-dimensional hole gas for the p-channel HFET transistor device) as a function of gate voltage relative to source voltage.

For the n-channel HFET transistor device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation-doped QW structures 121, 123 of the second GAA layer structure between the source terminal electrode and the drain terminal electrode. In this configuration, the source terminal electrode is the terminal electrode from which the electron carriers enter the QW channel of the n-type modulation-doped QW structures 121, 123, the drain terminal electrode is the terminal electrode where the electron carriers leave the device, and the gate terminal electrode is the control terminal for the device.

The p-channel HFET transistor device operates in a similar manner to the n-channel HFET transistor device with the current direction and voltage polarities reversed with respect to those of the n-channel HFET transistor device. For the p-channel HFET transistor device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation-doped QW structures 107, 109 of the first GAA layer structure between the source terminal electrode and the drain terminal electrode. In this configuration, the source terminal electrode is the terminal from which the hole carriers enter the QW channel of the p-type modulation-doped QW structures 107, 109, the drain terminal electrode is the terminal where the hole carriers leave the device, and the gate terminal electrode is the control terminal for the device.

Figure 2B:
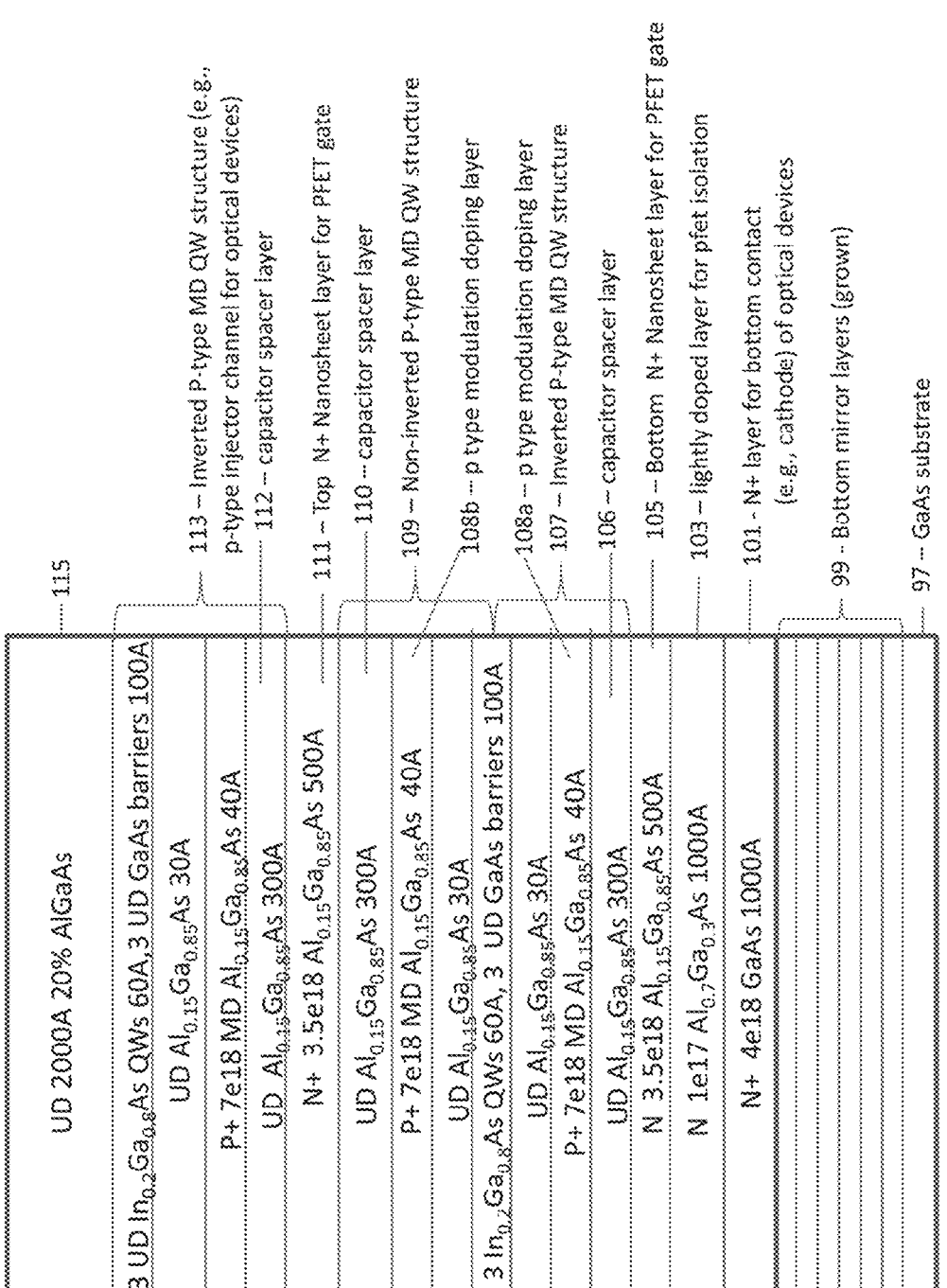

FIGS. 2A-B, collectively, is a chart illustrating an exemplary layer structure utilizing gallium arsenide group III-V materials for realizing the epitaxial layer structure of FIG. 1 as described herein. In other embodiments, other III-V materials such as indium phosphide materials, can be used for realizing the epitaxial layer structure of FIG. 1. The epitaxial layer structure of FIGS. 2A-B can be made, for example, using molecular beam epitaxy (MBE) techniques, chemical vapor deposition techniques, or other suitable techniques. Starting from FIG. 2B, a semiconductor layer of aluminum arsenide (AlAs) and a semiconductor layer of gallium arsenide (GaAs) can be alternately deposited (with preferably at least seven pairs) upon a semi-insulating GaAs substrate 97 in sequence to form the bottom mirror layers 99. The number of AlAs layers will preferably always be one greater than the number of GaAs layers so that the first and last layers of the mirror are AlAs. In embodiments, the AlAs layers can be subjected to high-temperature steam oxidation during fabrication to produce the compound $Al_xO_y$ so that a mirror will be formed at the designed center wavelength. This center wavelength is selected such that all of the desired resonant wavelengths for the device structures will be subject to high reflectivity. In one embodiment, the thicknesses of the AlAs and GaAs layers in the bottom mirror layers 99 can be chosen so that the final optical thickness of GaAs and $Al_xO_y$ are one-quarter wavelength of the center wavelength $\lambda_C$. Alternatively, the mirrors can be deposited as alternating layers of one-quarter wavelength thickness of GaAs and AlAs at the designed wavelength so that the oxidation step is not used. In that case, many more pairs are required (with typical numbers such as 27.5 pairs at 980 nm or 29.5 pairs at 850 nm) to achieve the reflectivity needed for efficient optical lasing and detection.

Deposited on the bottom mirror layers 99 is the active device structure which begins with layer 101 of N+ GaAs material that enables the formation of ohmic contacts thereto. Layer 101 has a typical n-type doping of $4\times10^{18}$ $cm^{-3}$ and a typical thickness near 1000 Å. The N+ GaAs layer 101 corresponds to the heavily doped n-type layer 101 of FIG. 1 as described above.

Deposited on layer 101 is layer 103 of an N-type alloy of AlGaAs. In embodiments, layer 103 can be an alloy of $Al_{x1}Ga_{(1-x1)}As$, where the parameter x1 is preferably 70-100%, with a typical n-type doping of $1\times10^{17}$ $cm^{-3}$ and a typical thickness of 1000 Å. The N-type AlGaAs layer 103 can provide lower waveguide cladding and optical confinement. It can also enable low source-gate capacitance and low drain-gate capacitance for the p-channel HFET transistor devices and low emitter-base capacitance for the N-N BICFET transistor devices. Due to the large bandgap (corresponding to the high Al content), the layer is ideal for blocking minority carrier flow). The N-type AlGaAs layer 103 corresponds to the lightly doped n-type layer 103 of FIG. 1 as described above.

Deposited on layer 103 is layer 105 of N+ AlGaAs material. In embodiments, the N+ AlGaAs layer can have a typical n-type doping of $3.5\times10^{18}$ $cm^{-3}$, a typical thickness of 300 Å, and a typical Al concentration of 15%. The N+ AlGaAs layer 105 can function electrically as part of the gate region of the p-channel HFET transistor devices and forms the bottom plate of a capacitor that defines the input capacitance of the gate region of the p-channel HFET transistor devices. Layer 105 can incorporate sufficient n-type doping to limit the penetration of the capacitor spacer layer 106 by depletion into layer 105. The N+ AlGaAs layer 105 corresponds to the heavily doped n-type layer 105 of FIG. 1 as described above.

Next, an undoped spacer layer 106 formed from an alloy of AlGaAs is deposited on the N+ GaAs layer 105. In embodiments, the spacer layer 106 is formed from an alloy of $Al_xGa_{(1-x1)}As$, where the parameter x1 is preferably 15%, and has a typical thickness of 300 Å. Spacer layer 106 forms the spacer layer between the bottom plate (layer 105) and top plate (P+ charge sheet of inverted p-type modulation-doped QW structure 107) of the capacitor that contributes to the input capacitance of the gate region of the p-channel HFET transistor devices.

The next layer is a thin p-type charge sheet formed from an alloy of AlGaAs and labeled 108a in FIG. 2B. In embodiments, the p-type charge sheet can be formed from $Al_{x1}Ga_{(1-x1)}As$, where the parameter x1 is preferably 15%. The p-type charge sheet is doped P+ with a typical p-type doping of $7\times10^{18}$ $cm^{-3}$ and has a typical thickness of 40 Å. Delta doped layers may also be used. Next is an undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. Next, an inverted p-type modulation-doped quantum well structure 107 is formed on the 30 Å spacer layer. The inverted p-type modulation-doped quantum well structure 107 starts with an InGaAs QW layer and undoped GaAs barrier layer which are repeated for a number of quantum wells (typically four or more quantum wells). A minimum of two quantum well structures may be used. In embodiments, the InGaAs QW layer can be formed from an alloy of $In_{x1}Ga_{(1-x1)}As$, where the parameter x1 is preferably 20%, and has a typical thickness of 60 Å. In embodiments, the undoped GaAs barrier layer has a typical thickness of 100 Å. These layers correspond to the inverted p-type modulation-doped quantum well structures 107 and 109 of FIG. 1 as described above. In other embodiments, the QW layer of the inverted p-type modulation-doped QW structure 107 can be formed from an alloy of InGaSb or an alloy of InGaAsSb (or InAsSbP) in order to take advantage of the superior hole mobility of Sb (antimonides). For example, the QW layer can be alloy $In_{x1}Ga_{(1-x1)}Sb$ or $In_{x1}Ga_{(1-x1)}As_{y1}Sb_{(1-y1)}$. The parameter x1 of the alloy can be 50% and thickness down to 20A to access improved mobility at very high compressive stress. The lower half of the QWs (labeled 107) form the top plate of the capacitor that contributes to the input capacitance of the gate region of the lowermost channel of the p-channel HFET transistor devices. The upper half of the QWs (labeled 109) functions as the quantum well layer for the non-inverted p-type modulation-doped quantum well structure 109. The upper half of the quantum wells also forms the lower plate of the capacitor that contributes to the input capacitance of the gate region of the central non-inverted p-channel HFET. Next is an undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. The next layer is a thin p-type charge sheet formed from an alloy of AlGaAs and labeled 108b in FIG. 2B. In embodiments, the p-type charge sheet can be formed from $Al_{x1}Ga_{(1-x1)}As$, where the parameter x1 is preferably 15%. The p-type charge sheet is doped P+ with a typical p-type doping of $7\times10^{18}$ $cm^{-3}$ and has a typical thickness of 40 Å. Delta doped layers may also be used.

Next, an undoped spacer layer 110 formed from an alloy of AlGaAs is deposited on the p-type charge sheet layer. In embodiments, the spacer layer 110 is formed from an alloy of $Al_{x1}Ga_{(1-x1)}As$, where the parameter x1 is preferably 15%, and has a typical thickness of 300 Å. Spacer layer 110 forms the spacer layer between the bottom plate (QW layer of 107 and 109 in FIG. 2B) and top plate (N+ gate doping layer of the non-inverted p-type modulation-doped QW structure 109) of the capacitor that contributes to the input capacitance of the gate region of the p-channel HFET transistor devices.

Deposited on layer 110 is layer 111 of N+ AlGaAs material. In embodiments, the N+ AlGaAs layer can have a typical n-type doping of $3.5\times10$ $cm^{-3}$, a typical thickness of 300 Å, and a typical Al concentration of 15%. The N+ AlGaAs layer 111 can function electrically as part of the gate region of the p-channel HFET transistor devices and forms the top plate of a capacitor that defines the input capacitance of the gate region of the p-channel HFET transistor device with capacitor spacer layer 110. Layer 111 also forms the bottom plate of the capacitor that contributes to the input capacitance of the gate region of the p-channel HFET transistor devices with capacitor layer 112. Layer 111 can incorporate sufficient n-type doping to limit the penetration of the capacitor spacer layer 110 by depletion into layer 111. The N+ AlGaAs layer 111 corresponds to the heavily doped n-type layer 111 of FIG. 1 as described above.

The layers 105 to 111 of FIG. 2B correspond to the first GAA layer structure as described herein.

Next, an undoped spacer layer 112 formed from an alloy of AlGaAs is deposited on the N+ GaAs layer 111. In embodiments, the spacer layer 112 is formed from an alloy of $Al_{x1}Ga_{(1-x1)}As$, where the parameter x1 is preferably 15%, and has a typical thickness of 300 Å. Spacer layer 112 forms the spacer layer between the bottom plate (layer 111) and top plate (P+ charge sheet and QWs of the inverted p-type modulation-doped QW structure 113) of the capacitor that contributes to the input capacitance of the gate region of the p-channel HFET transistor devices that utilizes the p-type modulation-doped QW structure 113.

Next, a thin p-type charge sheet formed from an alloy of AlGaAs is deposited. In embodiments, the p-type charge sheet can be formed from $Al_{x1}Ga_{(1-x1)}As$, where the parameter x1 is preferably 15%. The p-type charge sheet is doped P+ with a typical p-type doping of $7\times10^{18}$ cm$^{-3}$ and has a typical thickness of 40 Å. Delta doped layers may also be used. The p-type charge sheet and adjacent quantum wells form the top plate of the capacitor that contributes to the input capacitance of the gate region of the p-channel HFET transistor devices that utilize the p-type modulation-doped QW structure 113. Next is an undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. Next, an InGaAs QW layer and undoped GaAs barrier layer are repeated for a number of quantum wells (such as three or more quantum wells). Single quantum well structures may also be used. In embodiments, the InGaAs QW layer can be formed from an alloy of $In_{x1}Ga_{(1-x1)}As$, where the parameter x1 is preferably 20%, and has a typical thickness of 60 Å. In embodiments, the undoped GaAs barrier layer has a typical thickness of 100 Å. These layers correspond to the inverted p-type modulation-doped quantum well structure 113 of FIG. 1 as described above. In other embodiments, the QW layer of the inverted p-type modulation-doped QW structure 113 can be formed from an alloy of InGaSb or an alloy of InGaAsSb (or InAsSbP) in order to take advantage of the superior hole mobility of Sb (antimonides). For example, the QW layer can be alloy $In_{x1}Ga_{(1-x1)}Sb$ or $In_{x1}Ga_{(1-x1)}As_{y1}Sb_{(1-y1)}$. The parameter x1 of the alloy can be 50% and thickness down to 20A to access improved mobility at very high compressive stress.

The layer structure 113 can be used for the case where digital optical devices and bipolar transistors are desired. In this embodiment, thyristor-like current voltage characteristics suitable for the digital optical devices (e.g., lasers where decreasing voltage can produce increasing current, optical detectors where increasing current can produce decreasing voltage, or optical modulators that can operate in either mode) can be obtained vertically through the bulk epitaxial layer structure. On the other hand, for the case where digital optical devices and bipolar transistors are not desired, the layer structure 113 can be omitted. In this alternate embodiment, PIN diode-like current-voltage characteristics suitable for analog optical devices (e.g., lasers where increasing voltage can produce increasing current, optical detectors where decreasing current can produce decreasing voltage, or optical modulators that can operate in either mode) can be obtained vertically through the bulk epitaxial layer structure.

Next, an undoped spacer layer 115 of an alloy of AlGaAs is formed on the last undoped GaAs barrier layer of the inverted p-type modulation-doped quantum well structure 113 (if present), or on the spacer layer 111 if layer structure 113 is omitted. In embodiments, the undoped spacer layer 115 is formed from an alloy of $Al_{x1}Ga_{(1-x1)}As$, where the parameter x1 is preferably 20%, and has a typical thickness of 2000 Å. Spacer layer 115 is shown on both FIGS. 2A and 2B to illustrate the continuity of the epitaxial layer structure. Spacer layer 115 corresponds to the undoped spacer layer(s) 115 of FIG. 1 as described above.

Next, a non-inverted n-type modulation-doped quantum well structure 117 is formed on the undoped spacer layer 115. The non-inverted n-type modulation-doped quantum well structure 117 includes an undoped InGaAs QW layer and GaAs barrier layer that are repeated for a number of quantum wells (such as three or more quantum wells). Single quantum well structures may also be used. In embodiments, the undoped InGaAs QW layer is formed from an alloy of $In_{x1}Ga_{(1-x1)}As$, where the parameter x1 is preferably 20%, and has a typical thickness of 60 Å. In embodiments, the GaAs barrier layer has a typical thickness of 100 Å. Next is an undoped spacer layer formed from an alloy of AlGaAs. In embodiments, the undoped spacer layer is formed from an alloy of $Al_{x1}Ga_{(1-x1)}As$, where the parameter x1 is preferably 15%, and a typical thickness of 30 Å(or less in scaled structures). Next is a thin n-type charge sheet. In embodiments, the n-type charge sheet is formed from an alloy of $Al_{x1}Ga_{(1-x1)}As$, where the parameters x1 is preferably 15%. The n-type charge sheet is doped N+ with a typical n-type doping of $3.5\times10^{18}$ cm$^{-3}$ and has a typical thickness of 80 Å. Delta doping layers may also be used. The n-type charge sheet functions as the n-type modulation-doped layer for the non-inverted n-type modulation-doped quantum well structure 117. These layers correspond to the n-type modulation-doped QW structure 117 of FIG. 1 as described above. In other embodiments, the QW layer(s) of the non-inverted n-type modulation-doped QW structure 117 and all the QW layer(s) of the p-channel HFET transistor devices (layers 107, 109 and 113 in FIG. 1) can be formed using metamorphic growth techniques to reduce the QW bandgap and shift the wavelength to the 1500 nm range. In that case, the concentration of Indium in the QW layer(s) can be greater than 60%.

The layer structure 117 can be used for the case where digital optical devices and bipolar transistors are desired. In this embodiment, thyristor-like current voltage characteristics suitable for the digital optical devices (e.g., lasers where decreasing voltage can produce increasing current, optical detectors where increasing current can produce decreasing voltage, or optical modulators that can operate in either mode) can be obtained vertically through the bulk epitaxial layer structure. On the other hand, for the case where digital optical devices and bipolar transistors are not desired, the layer structure 117 can be omitted. In this alternate embodiment, PIN diode-like current-voltage characteristics suitable for analog optical devices (e.g., lasers where increasing voltage can produce increasing current, optical detectors where decreasing current can produce decreasing voltage, or optical modulators that can operate in either mode) can be obtained vertically through the bulk epitaxial layer structure.

Next, an undoped spacer layer 118 formed from an alloy of AlGaAs is deposited on the n-type charge sheet of the n-type modulation-doped quantum well structure 117 (if present), or onto spacer layer 115 if the n-type modulation-doped quantum well structure 117 is omitted. In embodiments, the undoped spacer layer 118 can be formed from $Al_{x1}Ga_{(1-x1)}As$, where the parameters x1 are preferably 15%, and has a typical thickness of 300 Å. Spacer layer 118 forms the spacer layer between the bottom plate (n-type charge sheet of 117) and top plate (layer 119) of the capacitor that contributes to the input capacitance of the gate region of the non-inverted n-channel HFET.

Next, layer 119 formed from an alloy of AlGaAs with p-type doping is deposited on the undoped AlGaAs layer 118. In embodiments, layer 119 is formed from $Al_{x1}Ga_{(1-x1)}As$, where the parameters x1 is preferably 15%. Layer 119 is P+ doped with atypical p-type doping of $7 \times 10^{18}$ cm$^{-3}$ and has a typical thickness of 300 Å. Layer 119 can function electrically as part of the gate region of the n-channel HFET transistor devices and forms the top plate of the capacitor that contributes to the input capacitance of the n-channel HFET transistor devices. Layer 119 can incorporate sufficient p-type doping to limit the penetration of the capacitor spacer layer 119 by depletion into layer 119. Layer 119 corresponds to the heavily doped p-type layer(s) 119 of FIG. 1 and as described above.

Next, an undoped spacer layer 120 formed from an alloy of AlGaAs is deposited on the P+ GaAs layer 119. In embodiments, the spacer layer 120 is formed from an alloy of $Al_{x1}Ga_{(1-x1)}As$, where the parameter x1 is preferably 15%, and has a typical thickness of 300 Å. Spacer layer 120 forms the spacer layer between the bottom plate (layer 119) and top plate (N+ charge sheet of inverted n-type modulation-doped QW structure 121) of the capacitor that contributes to the input capacitance of the gate region of the central channel of the n-channel HFET transistor devices.

The next layer is a thin n-type charge sheet formed from an alloy of AlGaAs. In embodiments, the n-type charge sheet can be formed from $Al_{x1}Ga_{(1-x1)}As$, where the parameter x1 is preferably 15%. The n-type charge sheet is doped N+ with a typical n-type doping of $3.5 \times 10^{18}$ cm$^{-3}$ and has a typical thickness of 80 Å. The n-type charge sheet forms the top plate of the capacitor that contributes to the input capacitance of the gate region of the central channel of the n-channel HFET transistor devices. Next is an undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. Next, a quantum well structure 121 is formed on this spacer layer. The quantum well structure begins with an InGaAs QW layer and undoped GaAs barrier layer which are repeated for a number of quantum wells (such as three or more quantum wells). A minimum of two quantum well structures may be used. In embodiments, the InGaAs QW layer can be formed from an alloy of $In_{x1}Ga_{(1-x1)}As$, where the parameter x1 is preferably 20%, and has a typical thickness of 60 Å. In embodiments, the undoped GaAs barrier layer has a typical thickness of 100 Å. These layers correspond to the quantum well structures of 121 and 123 of FIG. 1 as described above. These quantum wells function as the conducting channel for n-channel HFET transistor devices. Next is an undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. The next layer is a thin n-type charge sheet formed from an alloy of AlGaAs. In embodiments, the n-type charge sheet can be formed from $Al_{x1}Ga_{(1-x1)}As$, where the parameter x1 is preferably 15%. The n-type charge sheet is doped N+ with a typical n-type doping of $3.5 \times 10^{18}$ cm$^{-3}$ and has a typical thickness of 80 Å. Delta doped layers may also be used. The n-type charge sheet forms the bottom plate of the capacitor that contributes to the input capacitance of the gate region of the n-channel HFET transistor devices.

Next, an undoped spacer layer 124 formed from an alloy of AlGaAs is deposited. In embodiments, the spacer layer 124 is formed from an alloy of $Al_{x1}Ga_{(1-x1)}As$, where the parameter x1 is preferably 15%, and has a typical thickness of 300 Å. Spacer layer 124 forms the spacer layer between the bottom plate (layer 122) and top plate (P+ gate doping layer 125 of non-inverted n-type modulation-doped QW structure) of the capacitor that contributes to the input capacitance of the gate region of the n-channel HFET transistor devices.

Deposited on layer 124 is layer 125 of P+ AlGaAs material. In embodiments, the P+ AlGaAs layer can have a typical p-type doping of $7 \times 10^{18}$ cm$^{-3}$, a typical thickness of 300 Å, and a typical Al concentration of 15%. The P+ AlGaAs layer 125 can function electrically as part of the gate region of the n-channel HFET devices and forms the top plate of the capacitor that contributes to the input capacitance of the gate region of the n-channel HFET transistor devices with capacitor spacer layer 124. Layer 125 can incorporate sufficient p-type doping to limit the penetration of the capacitor spacer layer 124 by depletion into layer 125. The P+ AlGaAs layer 125 corresponds to the heavily doped p-type layer 125 of FIG. 1 as described above.

The layers 119 to 125 of FIG. 2A correspond to the second GAA layer structure as described herein.

Next, layer 127 formed from an alloy of AlGaAs with p-type doping is deposited on the p-type AlGaAs layer 125. In embodiments, layer 127 is formed from an alloy of $Al_{x1}Ga_{(1-x1)}As$, where the parameter x1 is preferably 70-100%. Layer 127 is P doped with a typical p-type doping of $1 \times 10^{18}$ cm$^{-3}$ and has a typical thickness of 1000 Å. The p-type AlGaAs material of layer 127 can provide upper waveguide cladding and optical confinement and enable current steering implants for VCSEL devices and other optical waveguide devices. Also, due to the large bandgap (corresponding to the high Al content), the layer is ideal for blocking minority carrier flow. Layer 127 corresponds to the moderately doped p-type layer(s) 127 of FIG. 1 as described above.

Next, a layer 129 of P+ GaAs material is deposited on the p-type AlGaAs layer 127. The P+ doped GaAs layer 125 enables the formation of ohmic contacts thereto. Layer 129 has a typical p-type doping in the range $7 \times 10^{18}$ cm$^{-3}$ to $10^{20}$ cm$^{-3}$ and a typical thickness of 500 Å. The P+ doped GaAs layer 129 corresponds to the heavily doped p-type layer(s) 129 of FIG. 1 as described above.

Next, layer 131 of undoped GaAs is deposited on the P+ doped GaAs layer 129. Layer 131 can have a typical thickness of 250 Å or more. Layer 127 can be used for resonant cavity adjustment, to form an aperture for optical devices (such as VCSELs) as described herein, and to form active and passive in-plane optical waveguide structures for optical devices. Layer 131 corresponds to the undoped layer(s) 131 of FIG. 1 as described above.

To form a resonant cavity device for optical signal emission and/or detection, top mirror layers 133 can be formed over the active device structure described above. The top mirror layers 133 can be formed by depositing pairs of semiconductor or dielectric materials with different refractive indices.

Figure 3B:
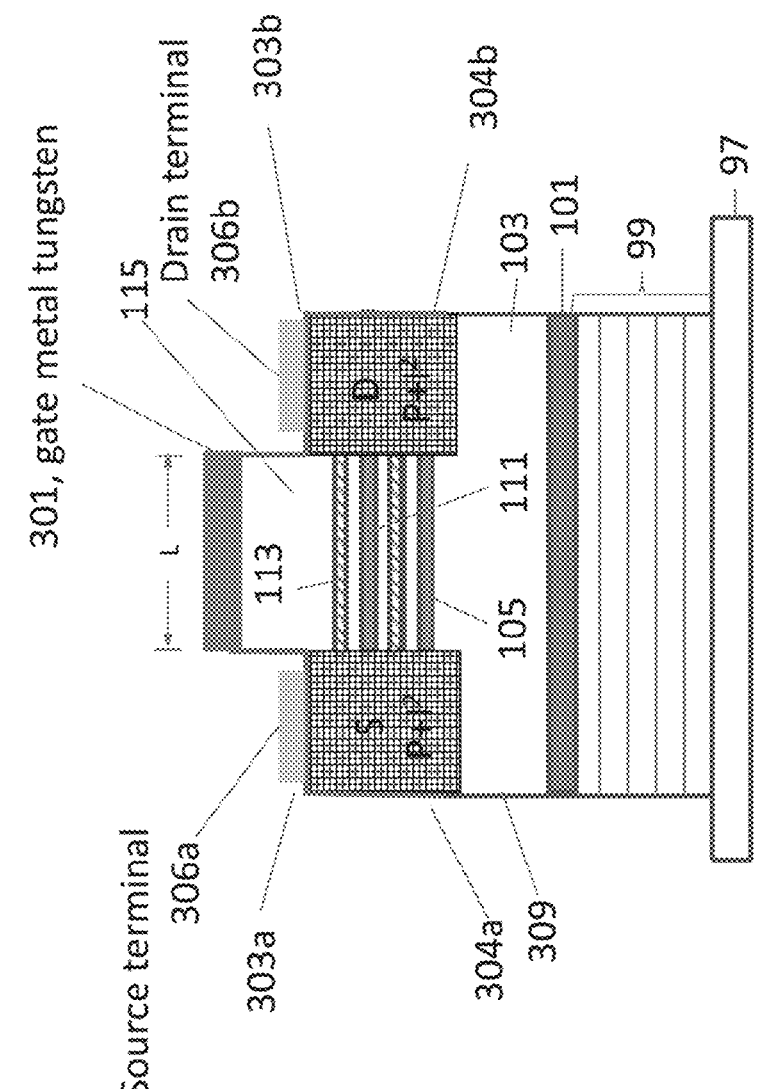
FIG. 3B is a schematic cross-section view of the exemplary PHFET (or p-channel HFET) transistor device of FIG. 3A along the section labeled X-X' in FIG. 3A.
Figure 3C:
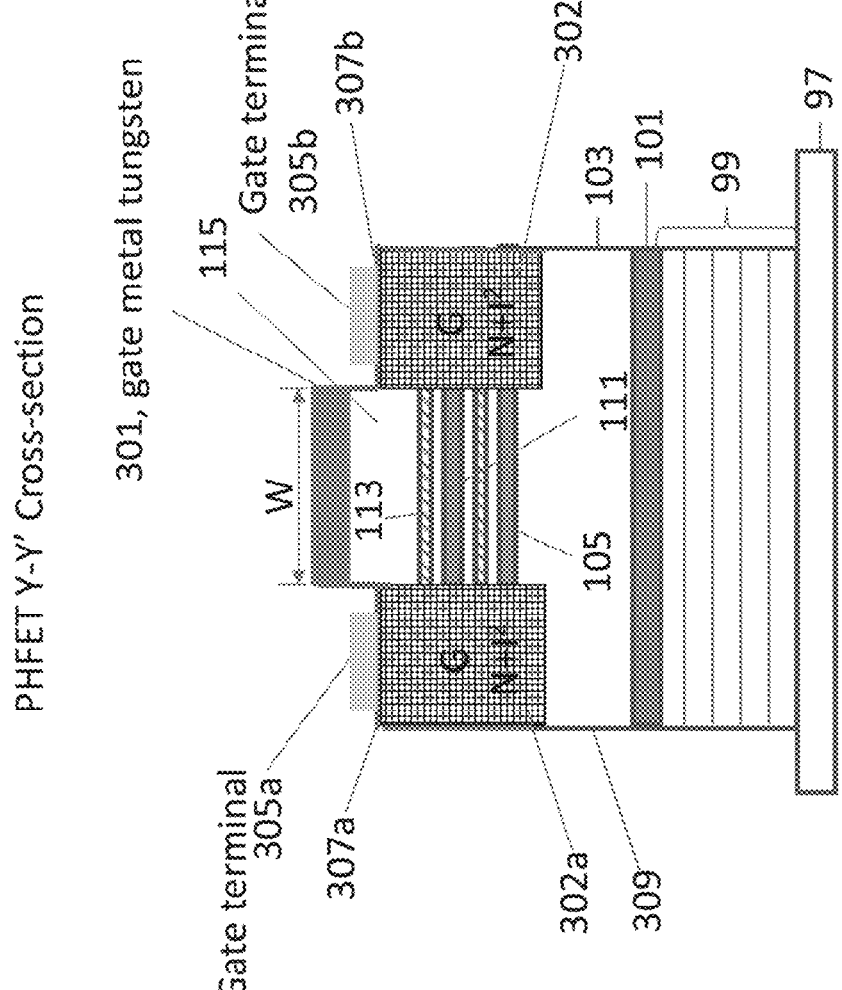
FIG. 3C is a schematic cross-section view of the exemplary PHFET (or p-channel HFET) transistor device of FIG. 3A along the section labeled Y-Y' in FIG. 3A.

FIGS. 3A-3C illustrate an exemplary p-channel HFET device (or PHFET device) realized from the epitaxial layer structures of FIG. 1 and/or FIGS. 2A and 2B. As best shown in FIGS. 3A and 3B, a source terminal electrode 306a and a drain terminal electrode 306*b* are electrically coupled to the p-type modulation-doped QW structures 107, 109 via corresponding source and drain p-type ion implant regions 304*a*, 304*b* such that p-type modulation-doped QW structures 107, 109 form channel regions between the source and drain p-type ion implant regions 304*a*, 304*b* (and the source terminal electrode 306*a* and the drain terminal electrode 306*b* electrically connected thereto). A feature 301, which can be formed from a refractory metal (such as tungsten) or other suitable material, is patterned on a mesa formed by etching into layer 115 (FIGS. 3B, 3C). The etch should terminate at a level about 600 A above the top quantum well of 113 (or layer 111 if layer structure 113 is omitted) for a PHFET gate length of 200 A, with the level being determined by approximately 3× the gate length or less. The feature 301 overlies the channel region of the PHFET. An etch is performed into layer 115 down to about 200 Å above the top quantum well of PHFET QW structure 113 (or layer 111 if layer structure 113 is omitted). The etch exposes portions of layer 115 (referred to as source and drain contact regions) that extend along opposite sides of the feature 301 and that are subject to implantation of p-type ions (e.g., Be/F ions) into the exposed portions of layer 115 to form ion implanted p-type source and drain contact regions 304*a*, 304*b* that extend along opposite sides of the feature 301 as best shown in FIG. 3B. The length (L) dimension of the feature 301 contributes to the effective length of the channel region between the ion implanted p-type source and drain contact regions 304*a*, 304*b*. From the same level in layer 115, an implantation of n-type ions (e.g., Si/F ions) is performed into the exposed layer 115 to form ion implanted n-type gate contact regions 302*a* and 302*b* that extends vertically downward from the exposed layer 115 into and through the first GAA layer structure (layer(s) 111 and 105) and the QW channels of the PHFET structures 107, 109 at both ends of the feature 301 as best shown in FIG. 3C. The feature 301 can be used to define the channel length and width and to provide a self-aligning implant mask along the sides of the feature for the source and drain ion implants and at both ends of the feature for the gate ion implant. The ion implanted n-type gate contact regions 302*a*, 302*b* are disposed on both ends of the width (W) dimension of the feature 301 and the corresponding effective width of the channel region of the p-channel HFET device. An etch 309 down to the bottom mirror layers 103 can form mesas 303*a*, 303*b* that incorporate the ion-implanted p-type source and drain contact regions 304*a*, 304*b* as best shown in FIGS. 3A and 3B. The etch 309 down to the bottom mirror layers 103 can also form mesas 307*a* and 307*b* that incorporate the ion implanted n-type gate contact regions 302*a* and 302*b* as best shown in FIGS. 3A and 3C. The ion implanted p-type source and drain contact regions 304*a*, 304*b* as well as the ion implanted n-type gate contact regions 302*a*, 302*b* become amorphous structures due to ion bombardment. Rapid thermal anneal (RTA) operations can be performed to anneal and activate the implant regions 304*a*, 304*b* as well as the implant regions 302*a*, 302*b* before metallization. The thermal energy of the RTA operations can transform the amorphous structure back to the single crystal structure and allow the dopant atoms to form bonds on the semiconductor layers as donors (for n-type) or acceptors (for p-type). A p-type metal (such as p-type gold) can be deposited and patterned on the mesas 303*a*, 303*b* in contact with the corresponding source and drain contact regions 304*a*, 304*b* to form the source and drain terminal electrodes 306*a*, 306*b* as shown in FIGS. 3A and 3B. An n-type metal (such as n-type gold) can be deposited and patterned on the mesas 307*a*, 307*b* in contact with the corresponding gate contact regions 302*a*, 302*b* to form the gate terminal electrodes 305*a*, 305*b* as shown in FIGS. 3A and 3C.

The p-channel HFET device is an enhancement-mode device with a negative voltage level of $V_{GS}$ turning-on the device. Under normal operation, the source terminal electrode 306*a* is forward biased with respect to the drain terminal electrode 306*b* by a positive voltage level $V_{SD}$, and the gate terminal electrode 305*a* is reverse biased with respect to the source terminal electrode 306*a* by a negative voltage level $V_{GS}$. For small values of $V_{SD}$, the device can operate in the triode region where the drain current ID varies in a quasi-linear manner with respect to $V_{SD}$. For larger values of $V_{SD}$, the device operates in the constant current region where the drain current ID is substantially constant with respect to $V_{SD}$. In this GAA PHFET structure, the gate electrode voltage $V_{GS}$ is applied to both the top and the bottom of the channel since all gate electrode nanosheets 111 and 105 in FIGS. 3B and 3C are connected together by implantation of N+ ions thereby modulating the channel inversion charge from both directions and eliminating the back-gate electrode and its traditional role in the planar PHFET structure of adjusting the value of threshold voltage by the application of a positive voltage. The GAA approach is superior by comparison to the traditional back gate structure as it results in a reduced level of drain induced barrier lowering (dibl) which degrades the output resistance of the HFET and also degrades (i.e. decreases) the value of subthreshold slope which is a measure of how rapidly the channel turns off with decreasing gate voltage. A larger value of subthreshold slope enables a lower value of threshold voltage and a lower value of supply voltage which is a key requirement to allow scaling the HFET channel length into the sub 10 nm range for higher speed and reduced power consumption. Because the back-gate and substrate or body layer associated with the back-gate are eliminated in the GAA structure, the parasitic capacitances (which are source to body capacitance $C_{SB}$ and drain to body capacitance $C_{DB}$) are also eliminated providing for higher speed operation.

Figure 3E:
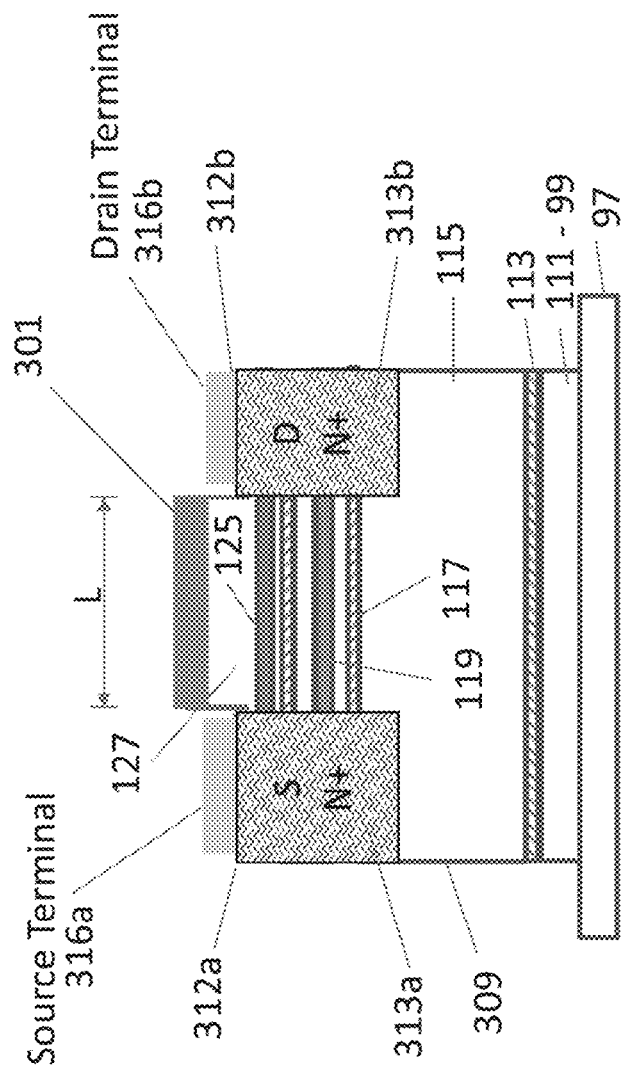
FIG. 3E is a schematic cross-section view of the exemplary NHFET (or n-channel HFET) transistor device of FIG. 3D along the section labeled X-X' in FIG. 3D.
Figure 3F:
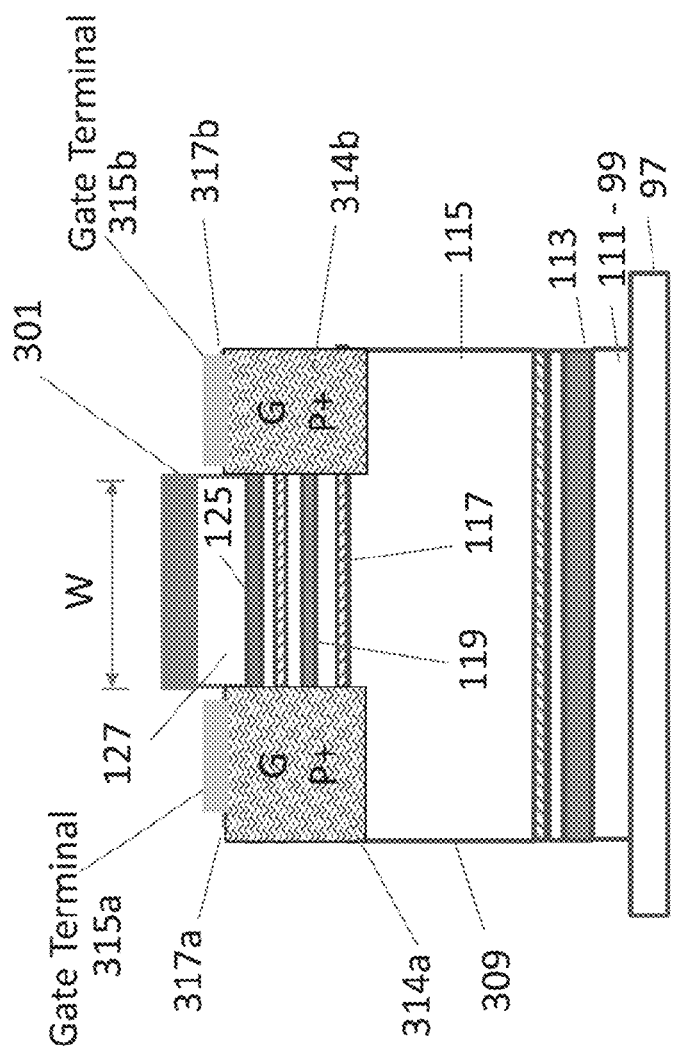
FIG. 3F is a schematic cross-section view of the exemplary NHFET (or n-channel HFET) transistor device of FIG. 3D along the section labeled Y-Y' in FIG. 3D.

FIGS. 3D-3F illustrate an exemplary n-channel HFET transistor device (or NHFET transistor device) realized from the epitaxial layer structures of FIG. 1 and/or FIGS. 2A and 2B. As shown, a source terminal electrode 312*a* and a drain terminal electrode 312*b* are electrically coupled to the n-type modulation-doped QW structures 123, 121, 117 via corresponding source and drain n-type ion implant regions 313*a*, 313*b*. The n-type modulation-doped QW structures 123, 121 form an effective channel region between the source and drain n-type ion implant regions 313*a*, 313*b* (and the source terminal electrode 312*a* and the drain terminal electrode 312*b* electrically connected thereto). A feature 301, which can be formed from a refractory metal (such as tungsten) or other suitable material, is patterned on a mesa formed by etching into layer 127 (FIGS. 3D, 3E, 3F). The feature 301 overlies the channel region of the n-channel HFET. An etch is performed into layer 127 about 300 Å above the P+ charge sheet layer 125 of the second GAA layer structure. It is noted that this etch is performed after the formation of the tungsten feature 301. After the patterning with a photoresist mask of the S and D contact regions of the NHFET at the tungsten level, i.e. the etched surface in 127, this pattern is used as an etch mask. Alternatively, this etch can be performed by first protecting the gate implant region (which will receive a p type implant) with a photoresist mask. The etch exposes portions of layer 127 that extend along opposite sides of the feature 301 and that are subject to implantation of n-type ions (e.g., Si/F ions) into the exposed layer 127 to form the ion-implanted n-type source and drain contact regions 313a, 313b that extend along opposite sides of the feature 301 as best shown in FIGS. 3D and 3E. The feature 301 can be used to define the channel length and to provide a self-aligning implant mask along the sides of the feature for the source and drain ion implants. The length (L) dimension of feature 301 contributes to the effective length of the channel region between the source and drain n-type ion implant regions 313a, 313b. The same etch (or another etch to layer 127) can expose portions of layer 127 on opposite ends of the feature 301 that is subject to implantation of p-type ions (e.g., Be/F ions) into the exposed layer region to form ion-implanted p-type gate contact regions 314a, 314b that extend vertically downward from the exposed layer 127 into and through the gate region (layers 125, 119) of the second GAA layer structure gate and also through the n-type modulation-doped QW structure 117 (if present) at both ends of the feature 301 as best shown in FIGS. 3D and 3F. The width (W) dimension of feature 301 contributes to the effective width of the channel region between the ion-implanted p-type gate contact regions 314a, 314b. In this configuration, the width (W) dimension and corresponding effective width of the channel region of the n-channel HFET transistor device is much greater than the length (L) dimension and corresponding effective length of the channel region of the n-channel HFET transistor device, and the ion-implanted p-type gate contact regions 314a, 314b are disposed on opposite ends of the width (W) dimension of the feature 301 and the corresponding effective width of the channel region of the n-channel HFET device. An etch 309 down to the bottom mirror layers 103 can form mesas 312a, 312b for the ion-implanted n-type source and drain contact regions 313a, 313b as best shown in FIGS. 3D and 3E. The etch 309 down to the bottom mirror layers 103 can also form mesas 317a, 317b for the ion-implanted p-type gate contact regions 314a, 314b as best shown in FIGS. 3D and 3F. The ion-implanted n-type source and drain contact regions 313a, 313b as well as the ion-implanted p-type gate contact regions 314a, 314b become amorphous structures due to ion bombardment. Rapid thermal anneal (RTA) operations can be performed to anneal and activate these regions 313a, 313b, 314a, 314b before metallization. The thermal energy of the RTA operations can transform the amorphous structure back to the single crystal structure and allow the dopant atoms to form bonds on the semiconductor layers as donors (for n-type) or acceptors (for p-type). An n-type metal (such as n-type gold) can be deposited and patterned on the mesas 312a, 312b (in contact with the corresponding ion-implanted n-type source and drain contact regions 313a, 313b) to form the source and drain terminal electrodes 316a, 316b as shown in FIGS. 3D and 3E. A p-type metal (such as p-type gold) can be deposited and patterned on the mesas 317a, 317b (in contact with the corresponding ion-implanted p-type gate contact regions 314a, 314b) to form the terminal electrodes 315a, 315b as shown in FIGS. 3D and 3F.

The n-channel HFET device is an enhancement-mode device with a positive voltage level of $V_{GS}$ turning-on the device. Under normal operation, the drain terminal electrode 316b is forward biased with respect to the source terminal electrode 316a by a positive voltage level $V_{DS}$, and the gate terminal electrode 315a is forward biased with respect to the source terminal electrode 316a by a positive voltage level $V_{GS}$. For small values of $V_{DS}$, the device operates in the triode region where the drain current ID varies in a quasi-linear manner with respect to $V_{DS}$. For larger values of $V_{DS}$, the device operates in the constant current region where the drain current ID is substantially constant with respect to $V_{DS}$. In this GAA NHFET structure, the gate electrode voltage $V_{GS}$ is applied to both the top and the bottom of the channel since all gate electrode nanosheets 119 and 125 in FIGS. 3E and 3F are connected together by implantation of P+ ions thereby modulating the channel inversion charge from both directions. This eliminates a back-gate electrode and its traditional role in the planar PHFET structure of adjusting the value of threshold voltage by the application of a positive voltage. The GAA approach is superior by comparison to the traditional back-gate structure as it results in a reduced level of drain induced barrier lowering (dibl) which degrades the output resistance of the HFET and also degrades (i.e., decreases) the value of subthreshold slope which is a measure of how rapidly the channel turns off with decreasing gate voltage. A larger value of subthreshold slope enables a lower value of threshold voltage and a lower value of supply voltage which is a key requirement to allow scaling the HFET channel length into the sub 10 nm range for higher speed and reduced power consumption. Furthermore, because the back-gate and substrate or body layer associated with the back-gate are eliminated in the GAA structure, the parasitic capacitances (which are source to body CSB and drain to body CDB) are also eliminated providing for higher speed operation.

In the embodiments described above, p-type ion implants are used to make contact to the second GAA layer structure of the N-channel HFET transistor devices, and n-type ion implants are used to make contact to the first GAA layer structure of the P-channel HFET transistor devices. These implant operations can be effectively controlled and aid in minimizing gate resistance for high-performance operation of the complementary HFET devices. Furthermore, the combination of the lightly doped n-type layer 103 and the p-type source and drain ion implants ensures that the Source-Gate and Drain-Gate capacitance of P-channel HFET transistor devices will be low. Such low capacitance results from the penetration of the ion-implanted p-type source and drain contact regions through the first GAA layer structure, which forms a P-N junction whose bottom is in layer 103. This junction will be low capacitance (and thus minimize current leakage and capacitance) for high-performance operation of the p-channel HFET transistor devices.

The device structure of the present application can also be configured to realize other transistor devices (such as complementary bipolar inversion channel field-effect transistors), optoelectronic devices (such as HFET phototransistors, VCSELs, in-plane lasers, electrically or optically-pumped lasers, optical thyristors, laser arrays, detectors, modulators, and optical switches) and purely optical devices (such as passive waveguides and off-chip couplers).

In embodiments, fabrication steps can be used to form electrical devices (such as complementary n-channel and p-channel HFET transistor devices and/or complementary P-P and N-N bipolar inversion channel field-effect transistors or BICFET devices) together with optoelectronic devices (such as HFET phototransistors, VCSELs, in-plane lasers, electrically or optically-pumped lasers and/or optical amplifiers, optical thyristors, laser arrays, optical detectors, optical modulators, and optical switches) and possibly purely optical devices (such as passive waveguides and off-chip couplers) in an integrated circuit (IC) that employs an epitaxial layer structure as described herein and shown in FIGS. 1 and/or 2A-2B (before depositing the top mirror layers).

The fabrication steps begin in block 401 where alignment marks are defined on layer 131 of the semiconductor layer structure.

In block 402, a nitride layer (of approximately 500 Å in thickness) is deposited on layer 131 of the semiconductor layer structure.

In block 403, a photoresist mask is deposited and patterned on the nitride layer. The patterned photoresist mask functions as an etch mask that defines vertical laser apertures and the in-plane waveguide apertures. The apertures are protected by the patterned photoresist mask.

In block 404, an etch operation is performed using the photoresist mask of 403 through the nitride layer deposited in 402 and into the semiconductor layer structure down to the highly-doped p-type layer 129 to define the apertures. The apertures are formed by mesas of layer 131 and can function optically as waveguide regions and/or resonant cavities for certain optoelectronic or optical devices of the IC.

In block 405, oxygen ions and then n-type dopant ions (e.g., Si/F ions) are implanted using the photoresist mask of 403 into the semiconductor layer structure on opposite sides of the apertures for certain optical devices of the IC. The oxygen ions are implanted to a depth centered at or near the center of the intermediate spacer layer 115.

The n-type dopant ions are implanted to a depth centered at or near the center of layer 127.

In block 407, a photoresist mask is deposited and patterned to expose all areas in which certain electronic devices (i.e. NHFET transistor devices, PHFET transistor devices, P-P BICFET transistor devices, N-N BICFET transistor devices) will be formed. The apertures and the anode or top emitter contact regions for the optoelectronic devices, P-P BICFET transistor devices and optical devices are protected by the photoresist mask In block 408a, the photoresist mask of 407 is used to etch the semiconductor layer structure to expose all areas in which electronic devices (i.e., NHFET transistor devices, PHFET transistor devices, N-N BICFET transistor devices) will be formed. The etch is controlled to terminate approximately 300-400 A above layer 125. This etch depth can be designated as "d1" and it is designed for proximity to layer 125. In embodiments, the etch can employ dry etching techniques with a gas suitable for III-V compounds (e.g., BCl3).

In block 408b, the photoresist mask of 407 is used to etch the semiconductor layer structure to expose all areas in which electronic devices with p-type inversion channels (which include PHFET transistor devices and N-N BICFET transistor devices) will be formed. The etch begins from the etch depth "d1" and is controlled to terminate in layer 115 approximately 300-400 A above layer 113 or layer 111. This etch depth can be designated as "d2" and it is designed for proximity to layer 113 and 111. In embodiments, the etch can employ dry etching techniques with a gas suitable for III-V compounds (e.g., BCl3).

In block 409, the photoresist mask of 407 is removed.

In optional block 410, a photoresist mask can be applied to expose certain n-channel devices (such as n-channel HFET devices), and then an ion implant is performed, which is confined to the region above the n-type modulation-doped QW structure 117 in order to preserve the high channel mobility. The species of the ion implants can be n-type (such as Si/F ions in the range of 1e17 cm$^{-3}$ to 1e18 cm$^{-3}$) or p-type (such as Be/F ions in the range of 1e17 cm$^{-3}$ to 1e18 cm$^{-3}$). The doping type and concentration of the ion implant can be configured to shift or adjust the n-channel threshold as deemed appropriate, such as to correct for errors in the original epitaxy, enable compatibility of the optimum laser performance (threshold current) with the optimum threshold voltage for the n-channel HFET transistor devices, and enable the implementation of multi-level logic design. In this configuration, implantation of n-type ions (such as Si/F ions) can shift the n-channel threshold down (i.e., negative or more depletion type). On the other hand, implantation of p-type ions (such as Be/F ions) can shift the n-channel threshold up (i.e., positive or more enhancement type). Then, the photoresist mask can be removed. Similarly, another photoresist mask can be applied to expose certain p-channel devices (such as p-channel HFET transistor devices), and then an ion implant is performed, which is confined to the region at and below the p-type modulation-doped QW structure 113. The species of the ion implants can be p-type (such as Be/F ions in the range of 1e17 cm$^{-3}$ to 1e18 cm$^{-3}$) or n-type (such as Si/F ions in the range of 1e17 cm$^{-3}$ to 1e18 cm$^3$). The doping type and concentration of the ion implant can be configured to shift or adjust the p-channel threshold as deemed appropriate, such as to correct for errors in the original epitaxy, enable compatibility of the optimum laser performance (threshold current) with the optimum threshold voltage for the p-channel HFET transistor devices, and enable the implementation of multi-level logic design. In this configuration, implantation of p-type ions (such as Be/F ions) can shift the p-channel threshold down (i.e., positive or more depletion type). On the other hand, implantation of n-type ions (such as Si/F ions) can shift the p-channel threshold up (i.e., negative or more enhancement type). Then, the photoresist mask can be removed.

In block 411, a refractory metal (e.g., tungsten) is deposited for the top features of the electronic devices which include n-channel devices at the depth d1 in layer 123 and p-channel devices at the depth d1+d2 in layer 115. The refractory metal (e.g., tungsten) will also be deposited on layer 129 (which is exposed by the etch of 404) for the anode electrode or top emitter electrodes for certain optoelectronic devices (e.g., VCSELs, in-plane lasers, electrically or optically-pumped lasers, optical thyristors, laser arrays, optical detectors, optical modulators, and optical switches) and P-P BICFET transistor devices.

In block 412, a photoresist mask is deposited and patterned to define the top features of the electronic devices. The refractory metal (e.g., tungsten) of 41 is etched using the photoresist mask to define the features of the electronic devices. The same or different photoresist mask can be used to etch the refractory metal (e.g., tungsten) to define the anode electrodes or top emitter electrodes for the optoelectronic devices and the P-P BICFET transistor devices. The refractory metal (e.g., tungsten) of 411 can be patterned by dry etching with sulfur hexafluoride (SF6).

In block 413, the photoresist mask of 412 is removed.

In block 414, a photoresist mask is deposited and patterned to protect all electronic devices except the P-P BICFET transistor devices, which is equivalent to exposing all optoelectronic devices, optical devices, and P-P BICFET transistor devices.

In block 415, the photoresist mask of 414 is used to etch the semiconductor layers, for example using BCl3, to the depth d1 as in 408 for all n-channel optoelectronic devices. After this etch, all the n-channel devices (both electrical and optical) are expected to have a common depth level at or near the depth d1 in layer 127.

In block 416, the photoresist mask of 414 is removed.

In block 417, a photoresist mask is deposited and patterned on layer 127 at the d1 level to expose the source and drain contact regions of NHFET transistor devices, the base contact region for P-P BICFET transistor devices, the collector contact region of N-N BICFET transistor devices, and the n-channel contact region (also referred to as n-source or source contact region) of the optoelectronic devices (when used).

In block 418, the semiconductor layer structure is etched, for example using BCl3, using the patterned photoresist mask of 417 down to about the center of layer 124 to expose the source and drain contact regions of NHFET transistor devices, the base contact region for P-P BICFET transistor devices, the collector contact region of N-N BICFET transistor devices, and the n-channel contact region (also referred to as n-source or source contact region) of the optoelectronic devices (when used).

In block 419, the photoresist mask of 417 is removed.

In block 420, a nitride layer of about 500 Å is deposited, for example, by plasma-enhanced chemical vapor deposition (PECVD) to be conformal. Then, the nitride is subjected to an anisotropic etch to create dielectric sidewalls on all tungsten coated mesas. The purpose of the sidewalls is to prevent implant penetration into the semiconductor sidewalls and to maintain the effective length for submicron n-channel devices.

In block 421, n-type dopant ions (e.g., Si/F ions) are implanted. First, a source—drain photoresist mask (similar to the mask of 417) is deposited and patterned.

Then, the n-type dopant ions (e.g., Si/F ions) are implanted into the source and drain contact regions of NHFET transistor devices, the base contact region for P-P BICFET transistor devices, the collector contact region of N-N BICFET transistor devices, and the n-channel contact region (also referred to as n-source or source contact region) of the optoelectronic devices (when used). In embodiments, the n-type dopant concentration of the ion implants can be in the range of $5e^{18}$-$1e^{19}$ cm$^{-3}$.

In block 422, the photoresist mask of 421 is removed.

In block 423, a photoresist mask is deposited and patterned on layer 127 at the d1 level to expose the gate contact region of NHFET devices.

In block 424, p-type dopant ions (e.g., Be/F ions) are implanted using the photoresist mask of 423 into the gate contact region of NHFET devices. In embodiments, the p-type dopant concentration of the ion implants can be in the range of $1e^{19}$-$1.5e^{19}$ cm$^{-3}$.

In block 425, the photoresist mask of 423 is removed.

In block 426, a photoresist mask is deposited and patterned on layer 115 at the d1+d2 level to expose the source and drain contact regions of PHFET transistor devices, the p-channel contact region of the optoelectronic devices (when used), the base contact region of N-N BICFET transistor devices, and the collector contact region of P-P BICFET transistor devices.

In block 427, the semiconductor layer structure is etched, for example using BCl3, using the patterned photoresist mask of 426 into layer 115 to a level about 300 Å above layer 113.

In block 428, the photoresist mask of 426 is removed.

In block 429, a nitride of about 500 Å is deposited by PECVD (to be conformal) and is followed by an anisotropic etch of the nitride to create dielectric sidewalls on all tungsten coated mesas. The purpose of the sidewalls is to prevent implant penetration into the semiconductor sidewalls and into the QW channel, which reduces the effective length of the p-channel HFET devices.

In block 430, a photoresist mask is deposited and patterned at layer 115 (as exposed by the etch of 427) to expose the source and drain contact regions of PHFET transistor devices, the p-channel contact region of the optoelectronic devices (when used), the base contact region of N-N BICFET transistor devices, and the collector contact region of P-P BICFET transistor devices.

In block 431, p-type dopant ions (e.g., Be/F ions) are implanted using the photoresist mask of 430 into the source and drain contact regions of PHFET transistor devices, the p-channel contact region of the optoelectronic devices (when used), the base contact region of N-N BICFET transistor devices, and the collector contact region of P-P BICFET transistor devices. In embodiments, the p-type dopant concentration of the ion implants can be in the range of $1e^{19}$-$1.5e^{19}$ cm$^{-3}$.

In block 432, the photoresist mask of 430 is removed.

In block 433, a photoresist mask is deposited and patterned at layer 115 (as exposed by the etch of 427) to expose the gate contact region(s) of PHFET transistor devices.

In block 435, n-type dopant ions (e.g., Si/F ions) are implanted using the photoresist mask of 433 into the gate contact region(s) of the PHFET transistor devices. In embodiments, the n-type dopant concentration of the ion implants can be in the range of $5e^{18}$ to $1e^{19}$ cm$^{-3}$.

In block 436, the photoresist mask of 433 is removed.

In block 437, a photoresist mask is deposited and patterned at layer 115 (as exposed by the etch of 427) to expose the cathode contact region of the optoelectronic devices (when used).

In block 438, the semiconductor layer structure is etched, for example using BCl3, using the patterned photoresist mask of 437 down to layer 101 to expose the cathode contact region of the optoelectronic devices (when used) and the emitter contact region of the N-N BICFET transistor devices.

In block 439, the photoresist mask of 437 is removed.

In block 440, silicon nitride is deposited with a typical thickness of 500 Å in preparation for rapid thermal anneal of all ion-implanted regions.

In block 441, rapid thermal anneal (RTA) operations are performed. For example, the RTA operations can employ a typical cycle of 850° C. for 15 seconds with an inert background. The ion implant regions become amorphous structures due to ion bombardment. The RTA operations can be performed to anneal all ion implant regions before metallization. The thermal energy of the RTA operations can transform the amorphous structure back to the single crystal structure and allow the dopant atoms to form bonds on the semiconductor layers as donors (for n-type) or acceptors (for p-type).

In block 442, a photoresist mask is deposited and patterned for the formation of n-type Au electrodes via liftoff. The n-type Au electrodes can include gate electrodes of PHFET transistor devices (which are formed on the ion-implanted n-type gate contact regions of the PHFET transistor devices), source and drain electrodes of NHFET transistor devices (which are formed on the ion-implanted n-type source and drain contact regions of the NHFET transistor devices), base electrodes of P-P BICFET transistor devices (which are formed on the ion-implanted n-type base contact regions of the P-P BICFET transistor devices), collector and emitter electrodes of N-N BICFET transistor devices (which are formed on the ion-implanted n-type collector contact regions and emitter contact regions (layer 101) of the N-N BICFET transistor devices), n-channel (or n-source) electrodes of optoelectronic devices (which are formed on ion-implanted n-type n-channel contact region(s) of the optoelectronic devices, when used), and cathode electrodes of the optoelectronic devices (which are formed in the n-type cathode contact region(s) (layer 101) of the optoelectronic devices, when used).

In block 443, n-type Au metal (e.g., alloy of AuGe—Ni—Au) is deposited for the n-type Au electrodes.

In block 444, the n-type Au electrodes are patterned via liftoff.

In block 445, a photoresist mask is deposited and patterned for the formation of p-type Au electrodes via liftoff. The p-type Au electrodes can include gate electrodes of NHFET transistor devices (which are formed on the ion-implanted p-type gate contact regions of NHFET transistor devices), source and drain electrodes of PHFET transistor devices (which are formed on the ion-implanted p-type source and drain contact regions of PHFET transistor devices), base electrodes of N-N BICFET transistor devices (which are formed on the ion-implanted p-type base contact regions of N-N BICFET transistor devices), collector and emitter electrodes of P-P BICFET transistor devices (which are formed on ion-implanted p-type collector contact regions and ion-implanted p-type emitter and refractory metal emitter contact regions of P-P BICFET transistor devices), and p-channel (or p-source) electrodes of optoelectronic devices (which are formed on the p-type ion implanted p-channel contact region(s) of the optoelectronic devices, when used).

In block 446, p-type Au metal (e.g., alloy of AuBe—Cr—Au) is deposited for the p-type Au electrodes.

In block 447, the p-type Au electrodes are patterned via liftoff.

In block 448, the n-type Au electrodes and the p-type Au electrodes are sintered or annealed. For example, the sintering operations can employ a typical cycle of 400° C. for 15 seconds.

In block 449, a photoresist mask is deposited and patterned for all devices to etch a trench into the bottom mirror layers 99 (approximately 1000 Å) to isolate all devices.

In block 450, the photoresist mask of 449 is used to etch the semiconductor layer structure, for example using dry etching techniques (e.g., BCl3), into the bottom mirror layers 99.

In block 451, the photoresist mask of 449 is removed.

In block 452, an interlevel dielectric material, such as silicon nitride (SiN) or silicon oxide (SiO2), is deposited to enable metal interconnect crossovers as needed.

In block 453, a photoresist mask is deposited and patterned to etch contact holes for all metal interconnect connections.

In block 454, the photoresist mask of 453 is used to etch contact openings through the interlevel dielectric material. For example, CF4 and SF6 etchant can be used to etch TiO2, SiN and SiO2 dielectric materials.

In block 455, the photoresist mask of 453 is removed.

In block 456, a photoresist mask is deposited and patterned for Au metal interconnects to various N-type and P-type Au electrodes as required for any circuit and also to connect electronic and optoelectronic devices as required.

In block 457, Au metal is deposited for the Au metal interconnects.

In block 458, the Au metal interconnects are patterned via liftoff.

Note that blocks 456 to 458 can be repeated multiple times where multiple metal interconnect levels are used.

In block 459, a photoresist mask is deposited and patterned to open the apertures of the optoelectronic and optical devices.

In block 460, the photoresist mask of 459 is used to etch the apertures of the optoelectronic and optical devices. For example, the etching can use SF6 to etch nitride-tungsten-nitride to expose layer 131 of the apertures.

In block 461, the photoresist mask of 459 is removed.

In block 462, the top mirror layers 129 are deposited and cover the exposed apertures. For example, seven (7) pairs of silicon dioxide (SiO2) and titanium dioxide (TiO2) can be deposited using Ion Beam Assisted Deposition (LBAD). The center wavelength for the top mirror layers 133 is typically 980 nm, 850 nm or 1310 nm.

In block 463, a photoresist mask is deposited and patterned to open bond pads on all devices. This can involve a dry etch of the top mirror layers 133 using Inductively Coupled Plasma Etching (ICP).

In optional steps, the bottom mirror layers that are exposed by the isolation etch of 450 can be subject to oxidation. This operation is useful for the case where the bottom mirror layers formed as part of the layer structure are reduced in number for conversion to oxide. In one embodiment, the bottom mirror layers of aluminum arsenide (AlAs) that are exposed by the isolation etch are subjected to a steam ambient that converts the AlAs to aluminum oxide $(Al_xO_y)$, thus forming the bottom DBR mirror.

Note that the top apertures as described above can be configured to allow for light to exit or enter into the active region of the semiconductor layer structure.

Alternatively, the apertures can be used to form a passive and/or active in-plane waveguide structures as part of an optoelectronic device or optical device realized in an IC as described herein. Such in-plane waveguides covered with the deposited mirror guide the propagation of light in the plane of the IC, and the top aperture formed at the top surface provides for vertical confinement and wave guiding of light for the top portion of the IC wafer. For the passive in-plane waveguide structure, the patterned anode metal can be omitted and ion-implanted regions can be formed below opposite sides of the top aperture to provide for lateral confinement of light within the active region of the semiconductor layer structure disposed below the top aperture.

In embodiments, the epitaxial layer structure and fabrication methodology as described herein can be used to construct an IC with a stacked complementary HFET inverter that includes an NHFET device stacked on a PHFET device. This configuration can help minimize the area of the complementary HFET inverter as part of the IC.

Figure 4A:
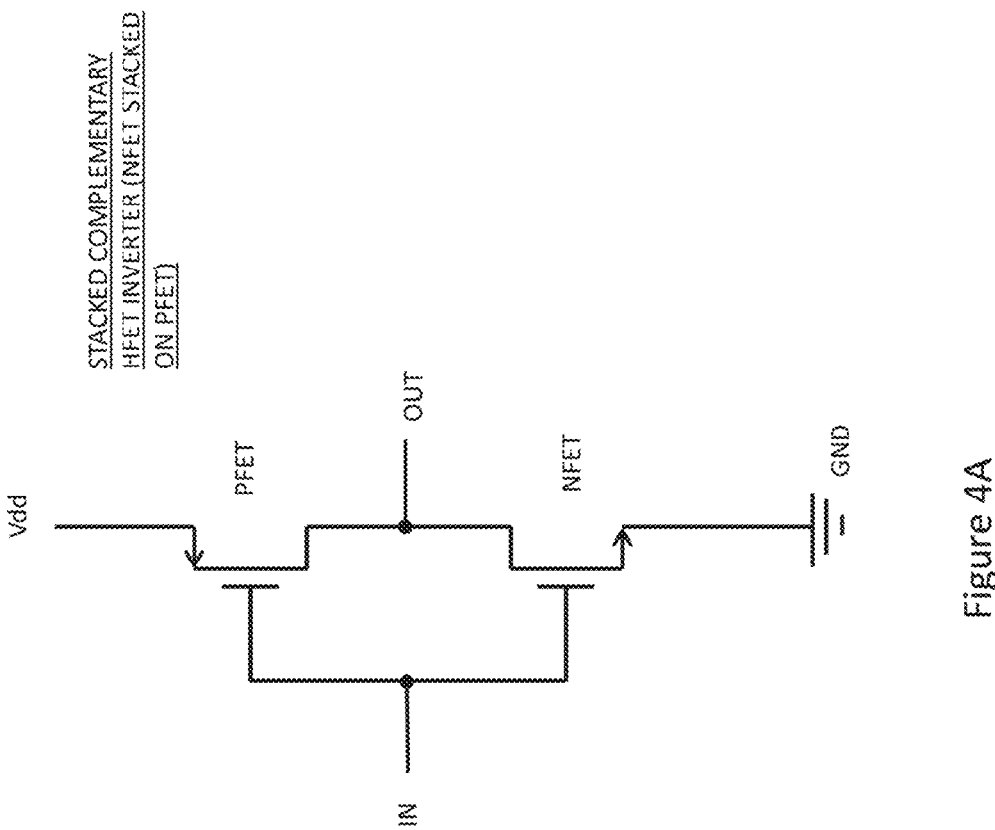
FIG. 4A is a schematic diagram of an exemplary stacked complementary HFET inverter according to the present disclosure.
Figure 4B:
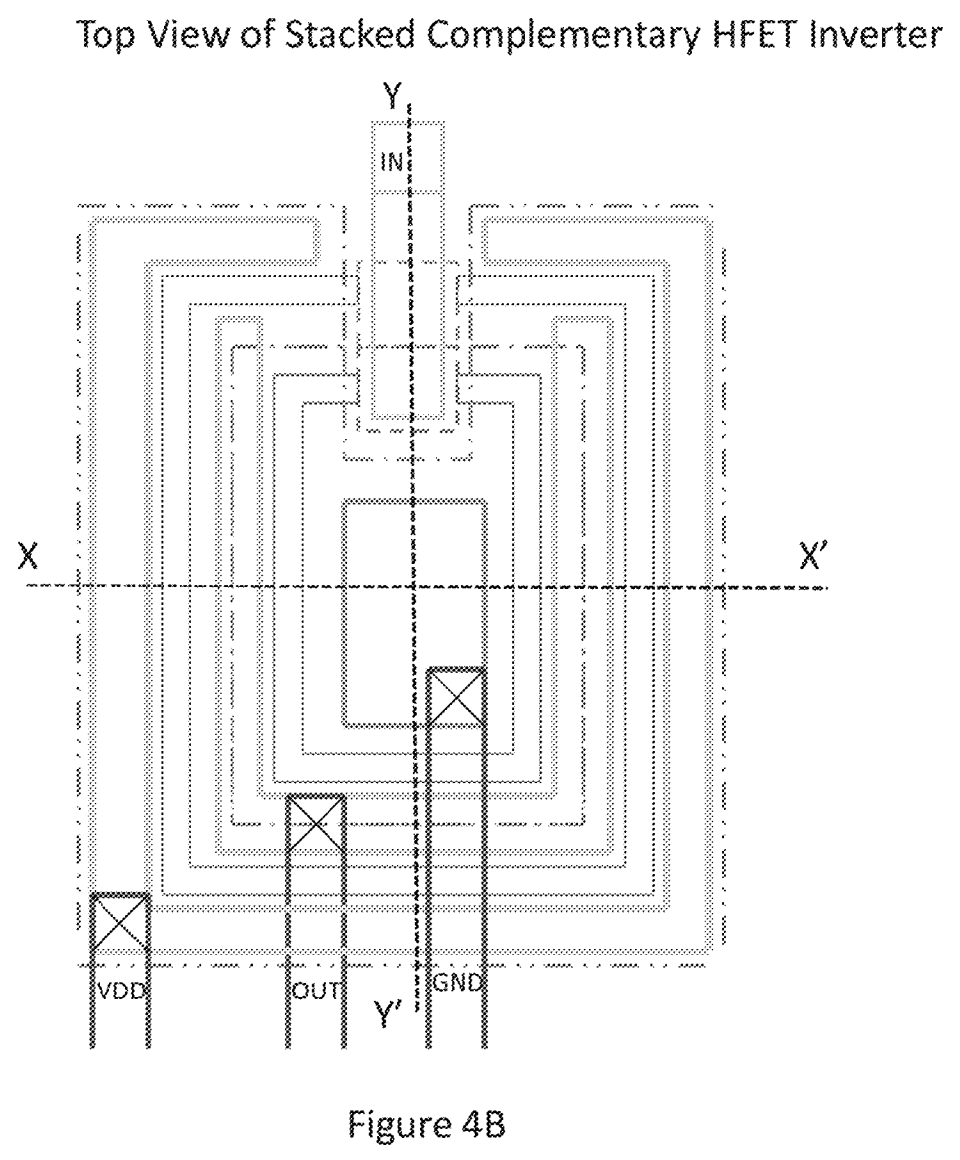
Figure 4C:
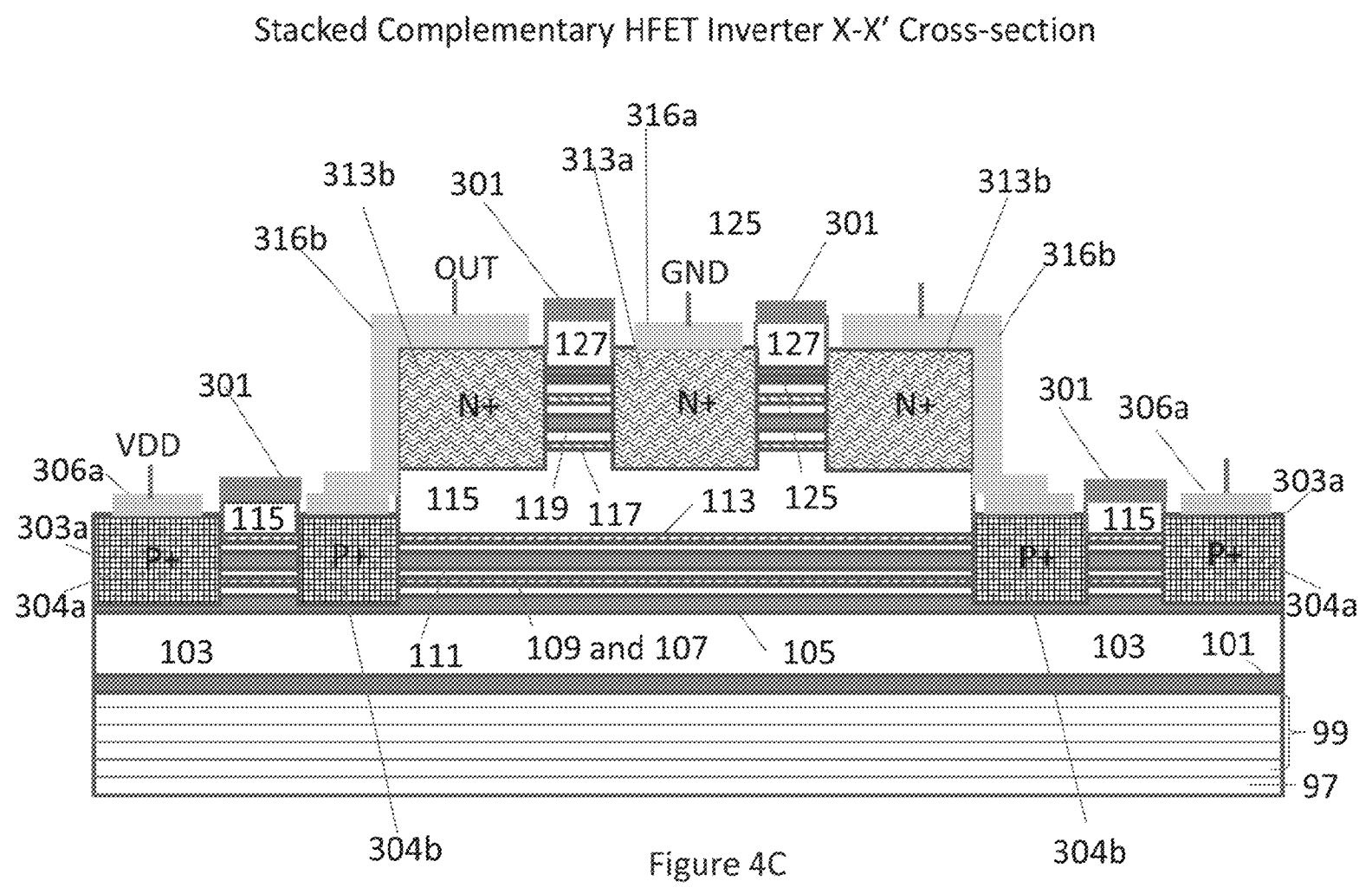
Figure 4D:
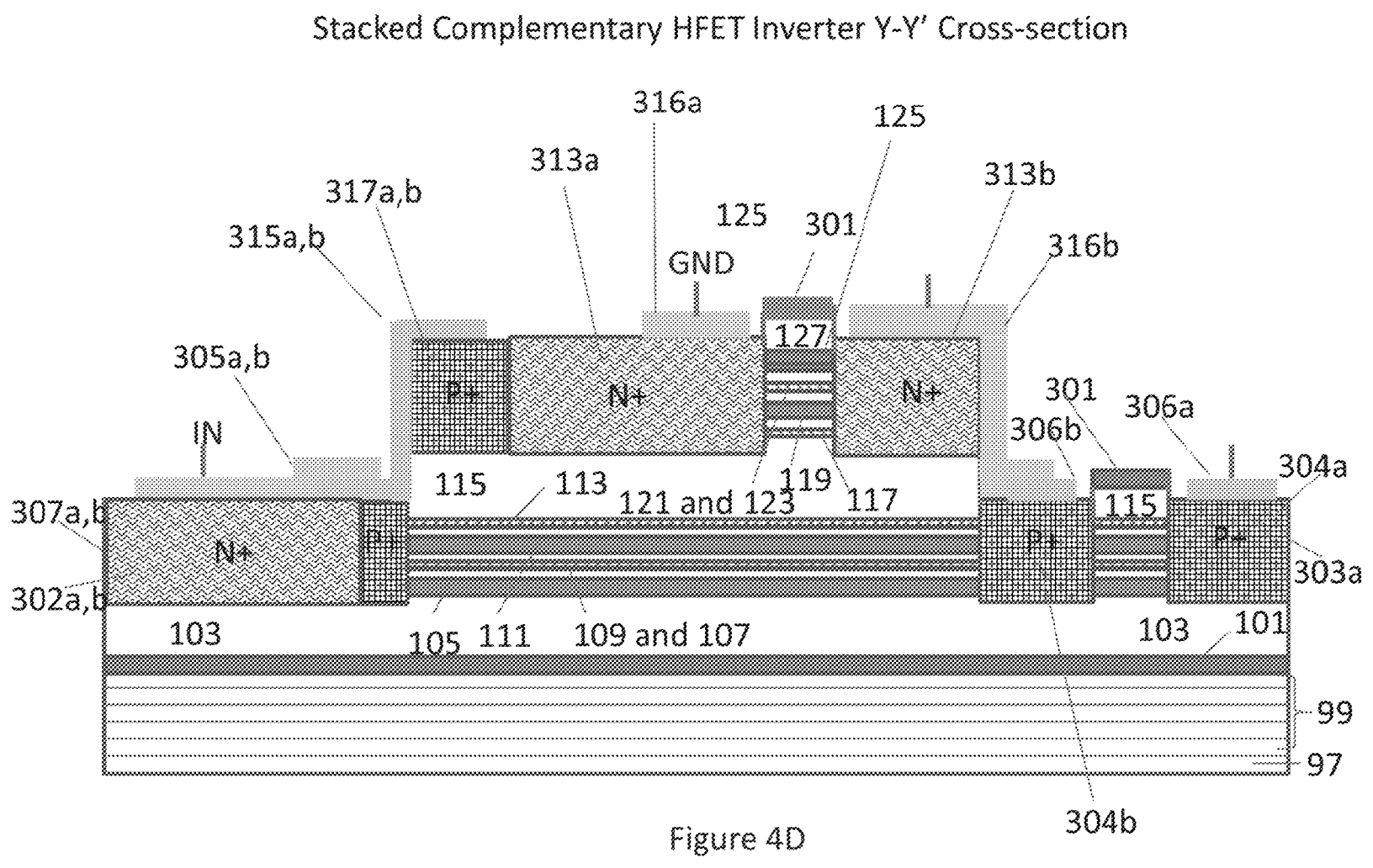

FIGS. 4A-4D illustrate an embodiment of a stacked complementary HFET inverter that includes an NHFET device stacked on a PHFET device. As best shown in FIGS. 4B, the inverter has a generally rectangular layout. In the top central portion of the rectangular layout as best shown in FIGS. 4B and 4D, the gate contact electrode 305a and underlying n-type implant region 302a for the gate of the PHFET device extend along a linear path together with the gate contact electrode 315a and the underlying p-type implant region 314a for the gate of the NHFET device. The gate contact electrode 305a and underlying n-type implant region 302a for the gate of the PHFET device are offset laterally toward the periphery of the layout relative to the gate contact electrode 315a and the underlying p-type implant region 314a for the gate of the NHFET device. The two gate contact electrodes 305a, 305b are interconnected to one another by metal to form the IN terminal of the inverter. In the other portions of the rectangular layout as best shown in FIGS. 4B and 4C, the top feature 301 that overlies the channel for PHFET device along with the source and drain contact electrodes 306a, 306b and underlying p-type implant regions 304a, 304b for the drain and source drain terminals of the PHFET device extend in a segmented U-shaped manner about the periphery of the layout with two segments that extend toward the linear path of the gate of the PHFET device. Furthermore, the top feature 301 that overlies the channel for NHFET device along with the drain contact electrode 316*b* and underlying n-type implant region 313*b* for the drain terminal of the NHFET device extend in a similar segmented U-shape manner that is offset laterally toward the central region of the layout. The source contact electrode 316*a* and underlying n-type implant region 313*a* for the source terminal of the NHFET device is disposed in the central region of the layout. The drain contact electrode 306*b* of the PHFET device is interconnected to the drain contact electrode 316*b* of the NHFET device by metal to form the OUT terminal of the inverter. The source contact electrode 306*a* of the PHFET device forms the VDD terminal of the inverter. And the source contact electrode 316*a* of the NHFET forms the GND terminal of the inverter.

Figure 5A:
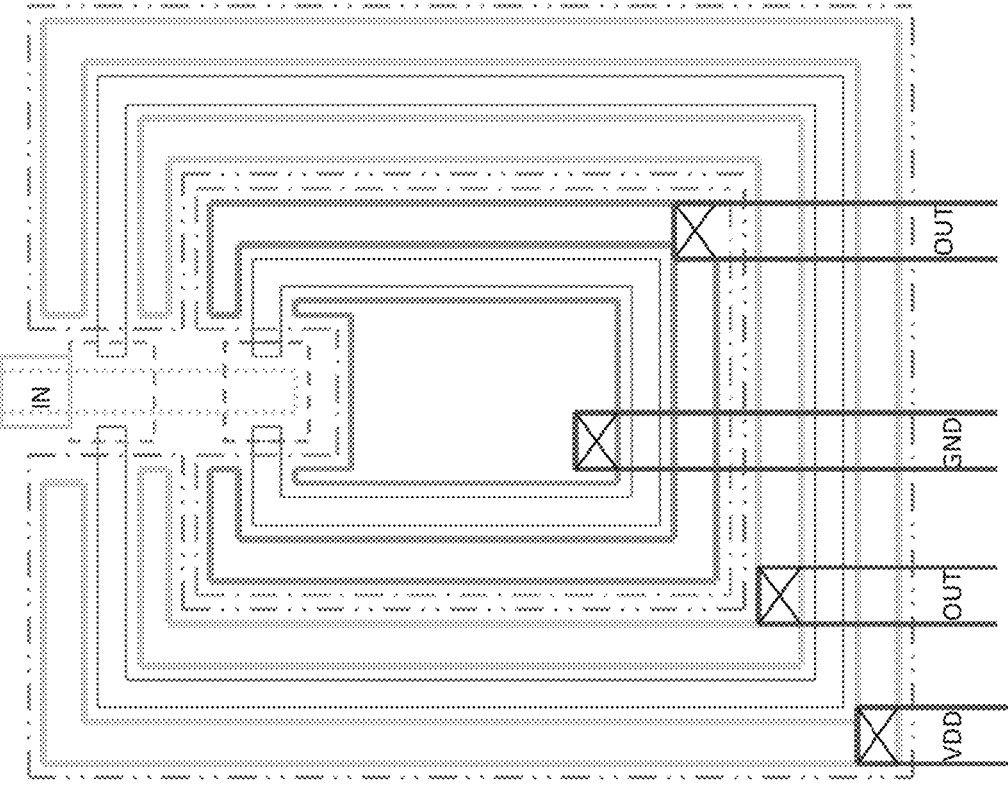
FIGS. 5A and 5B are schematic top views of other exemplary stacked complementary HFET inverters according to the present disclosure.
Figure 5B:
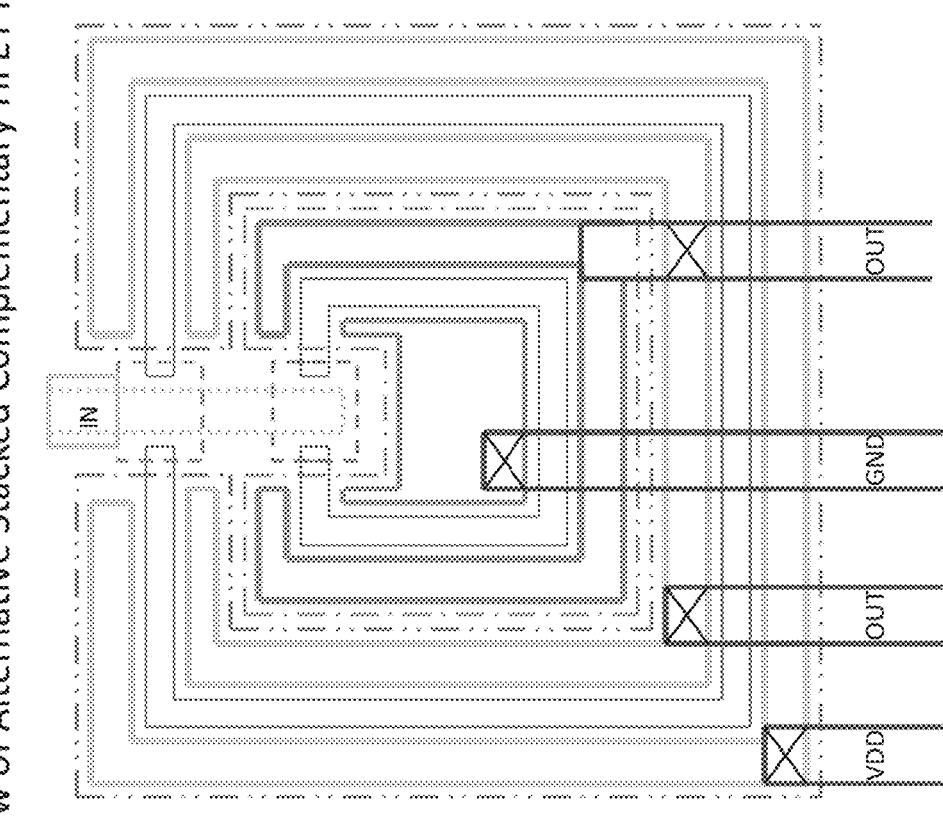

FIGS. 5A and 5B illustrate other exemplary embodiments of a stacked complementary HFET inverter that includes an NHFET device stacked on a PHFET device. These embodiments are similar to the embodiment of FIGS. 4A-4D except that the drain terminals of the NHFET and PHFET devices are maintained electrically and physically separate from one another. The embodiment of FIG. 5B can provide for higher drive current, i.e. fanout, for the inverter.

Figure 6A:
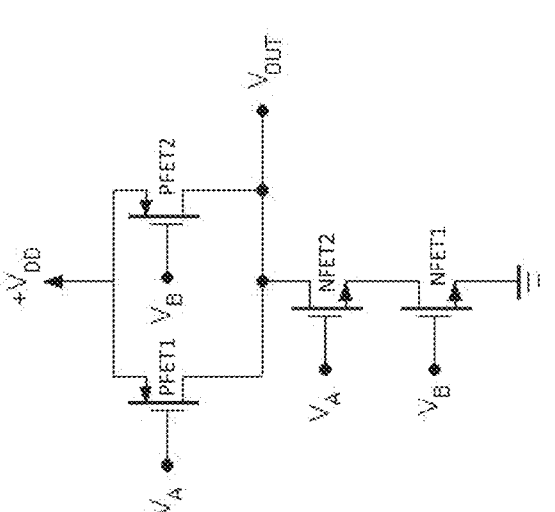
FIG. 6A is a schematic diagram of an exemplary 2-input NAND gate with stacked complementary HFET devices according to the present disclosure.
Figure 6B:
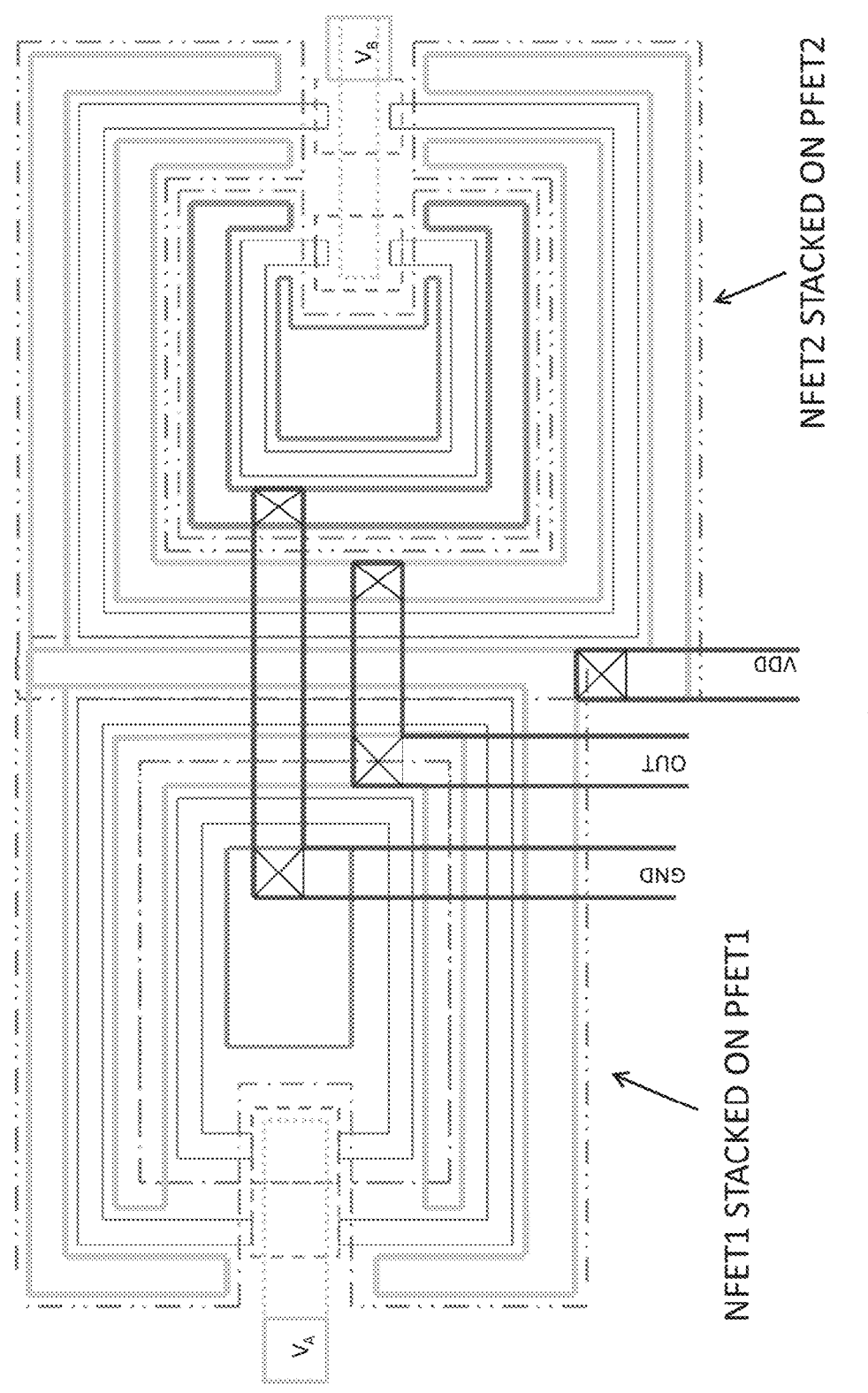
FIG. 6B is a schematic top view of an exemplary 2-input NAND gate with stacked complementary HFET devices according to the present disclosure.
Figure 7A:
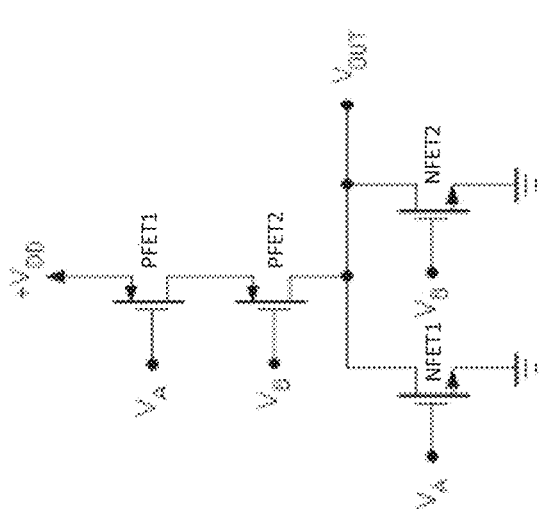
FIG. 7A is a schematic diagram of an exemplary 2-input NOR gate with stacked complementary HFET devices according to the present disclosure.
Figure 7B:
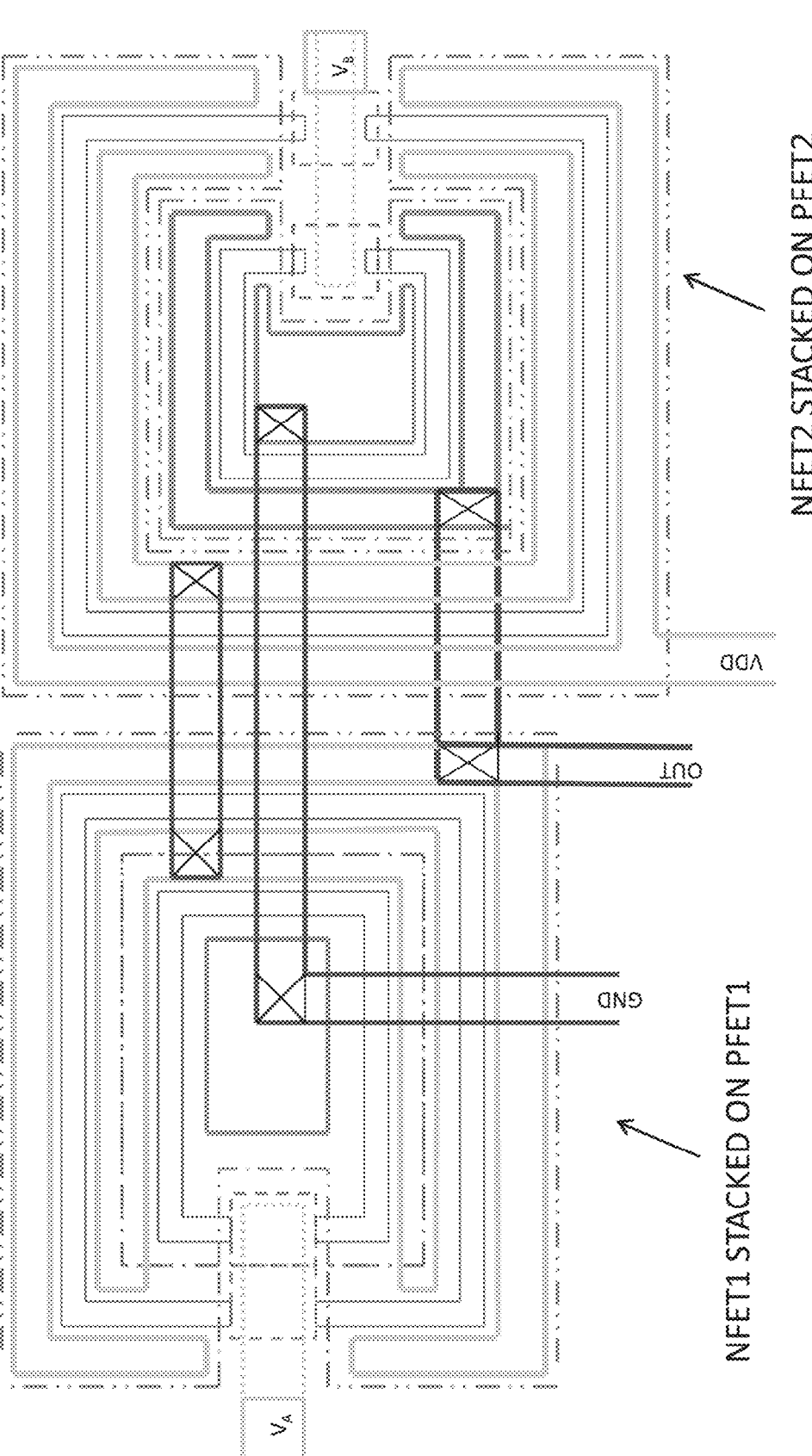
FIG. 7B is a schematic top view of an exemplary 2-input NOR gate with stacked complementary HFET devices according to the present disclosure.
Figure 8B:
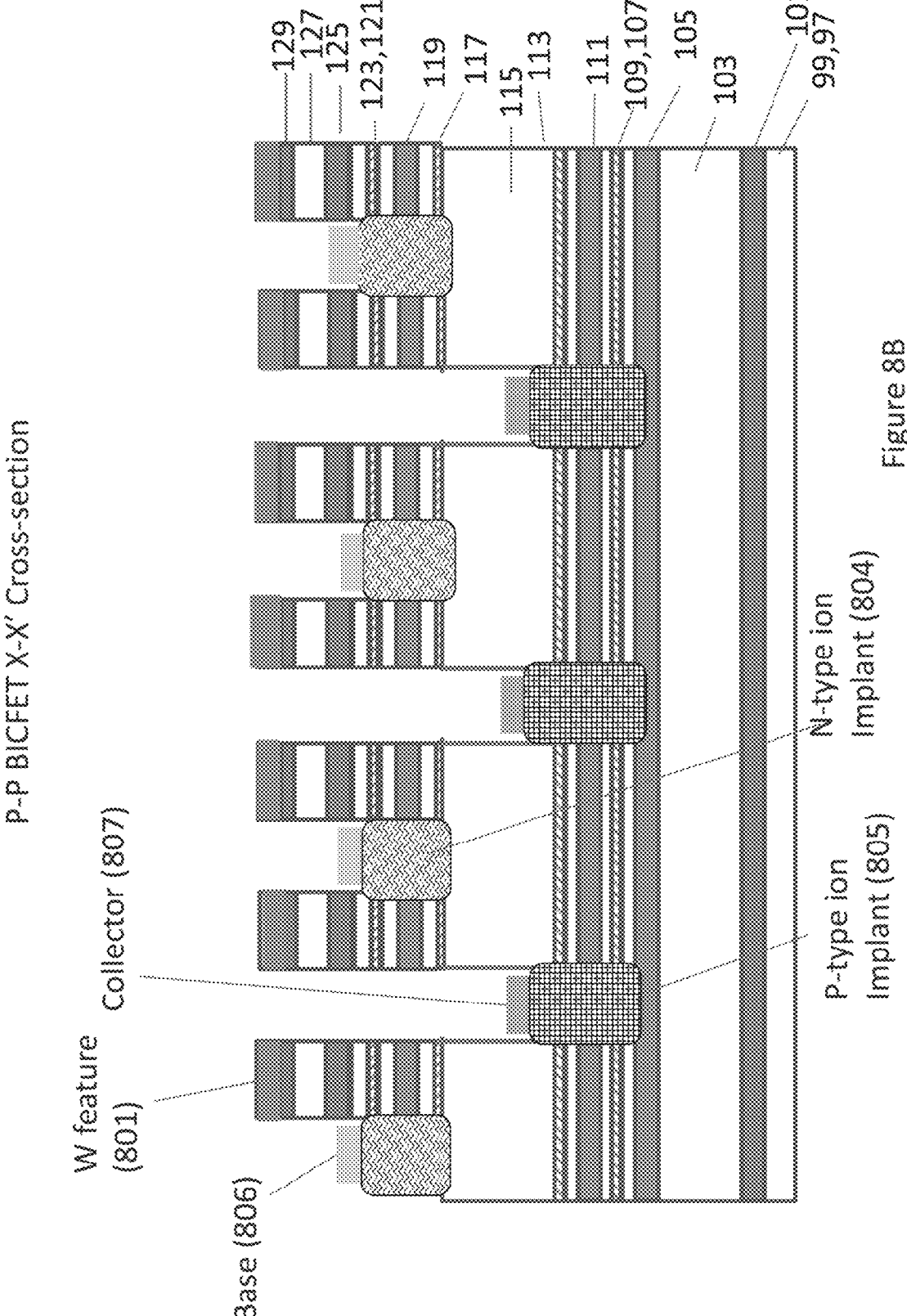
FIG. 8B is a schematic cross-section view of the exemplary P-P BICFET device of FIG. 8A along the section labeled X-X' in FIG. 8A.
Figure 8C:
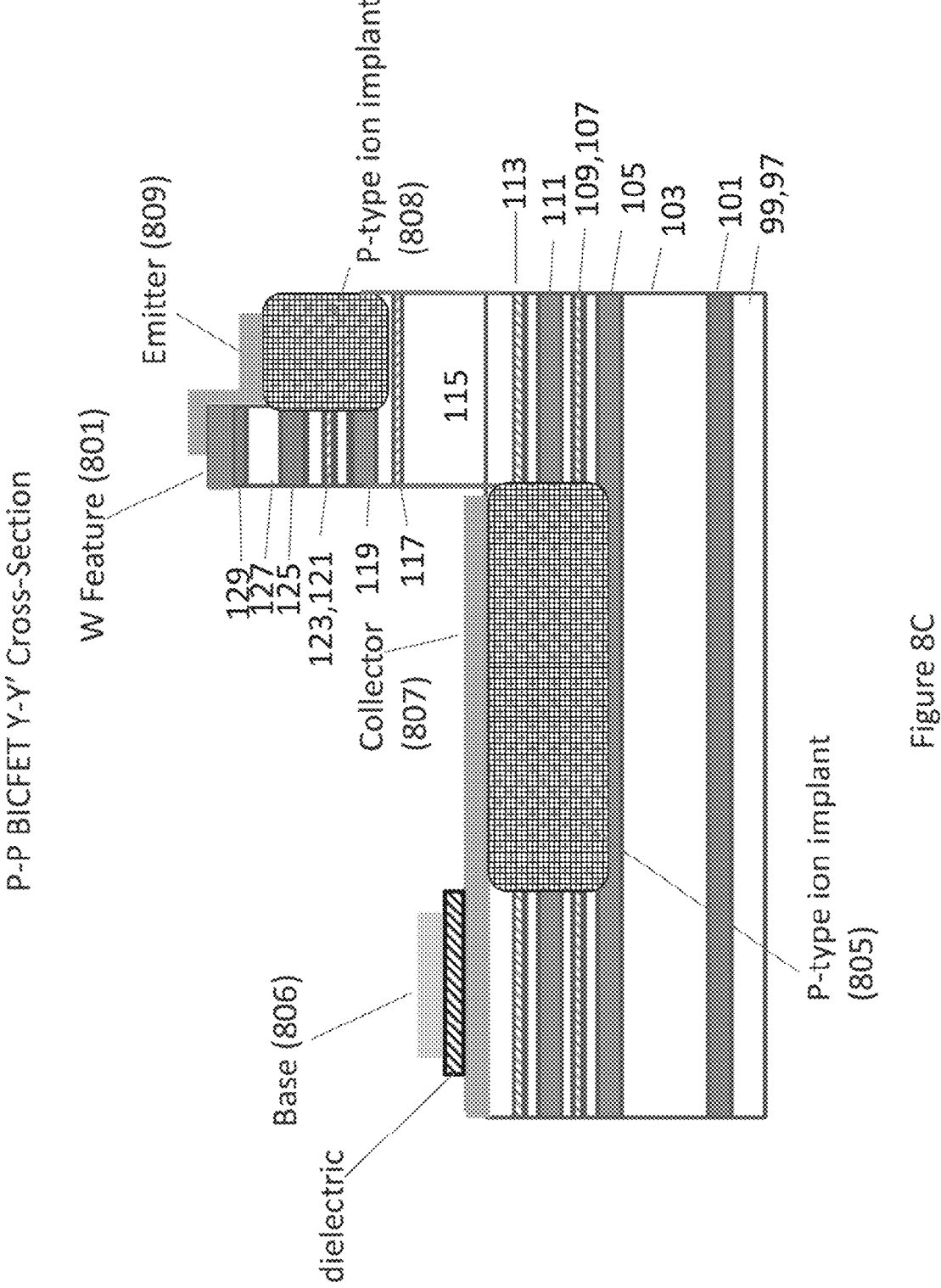
FIG. 8C is a schematic cross-section view of the exemplary P-P BICFET device of FIG. 8A along the section labeled Y-Y' in FIG. 8A.
Figure 8D:
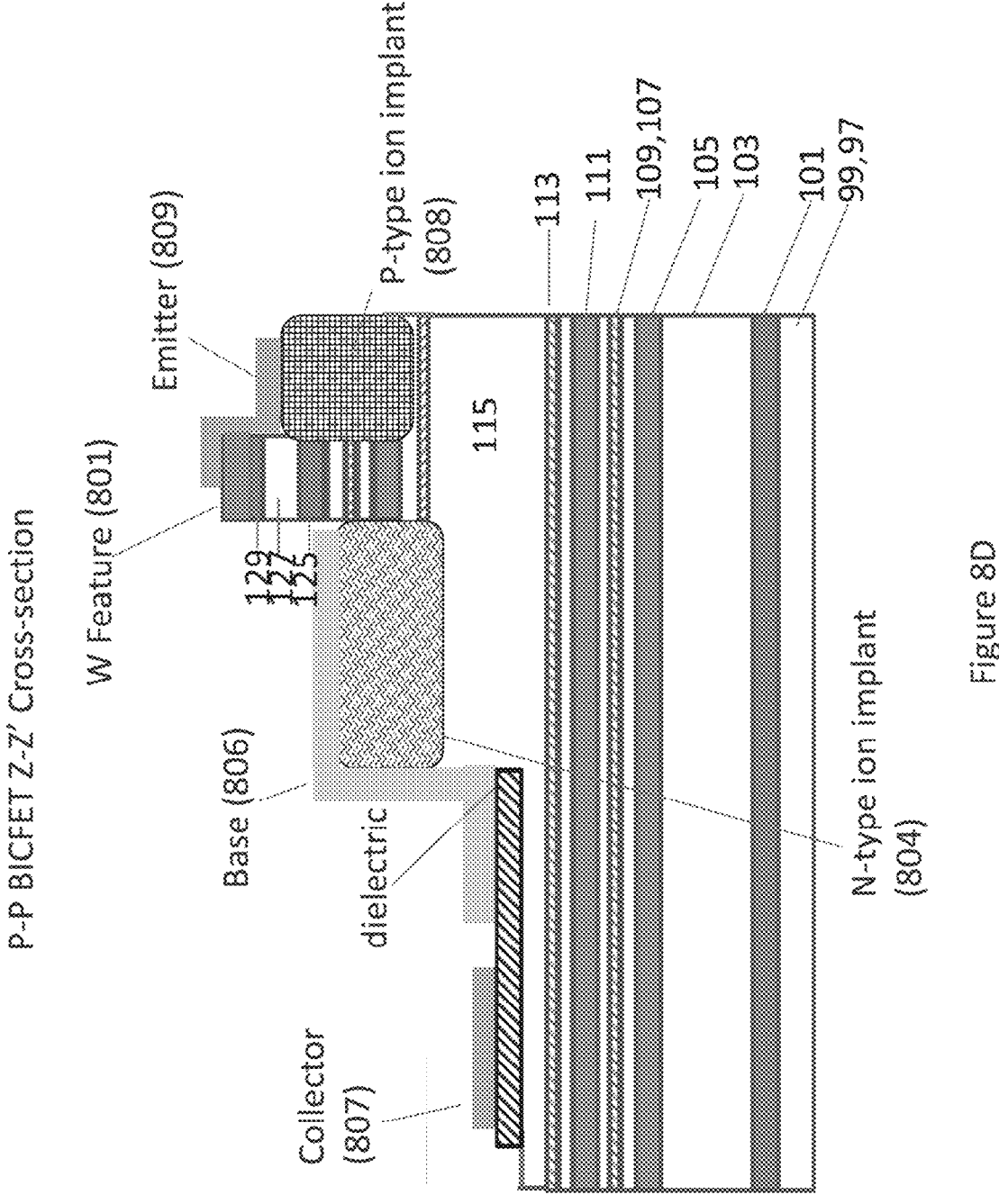
FIG. 8D is a schematic cross-section view of the exemplary P-P BICFET device of FIG. 8A along the section labeled Z-Z' in FIG. 8A.
Figure 9B:
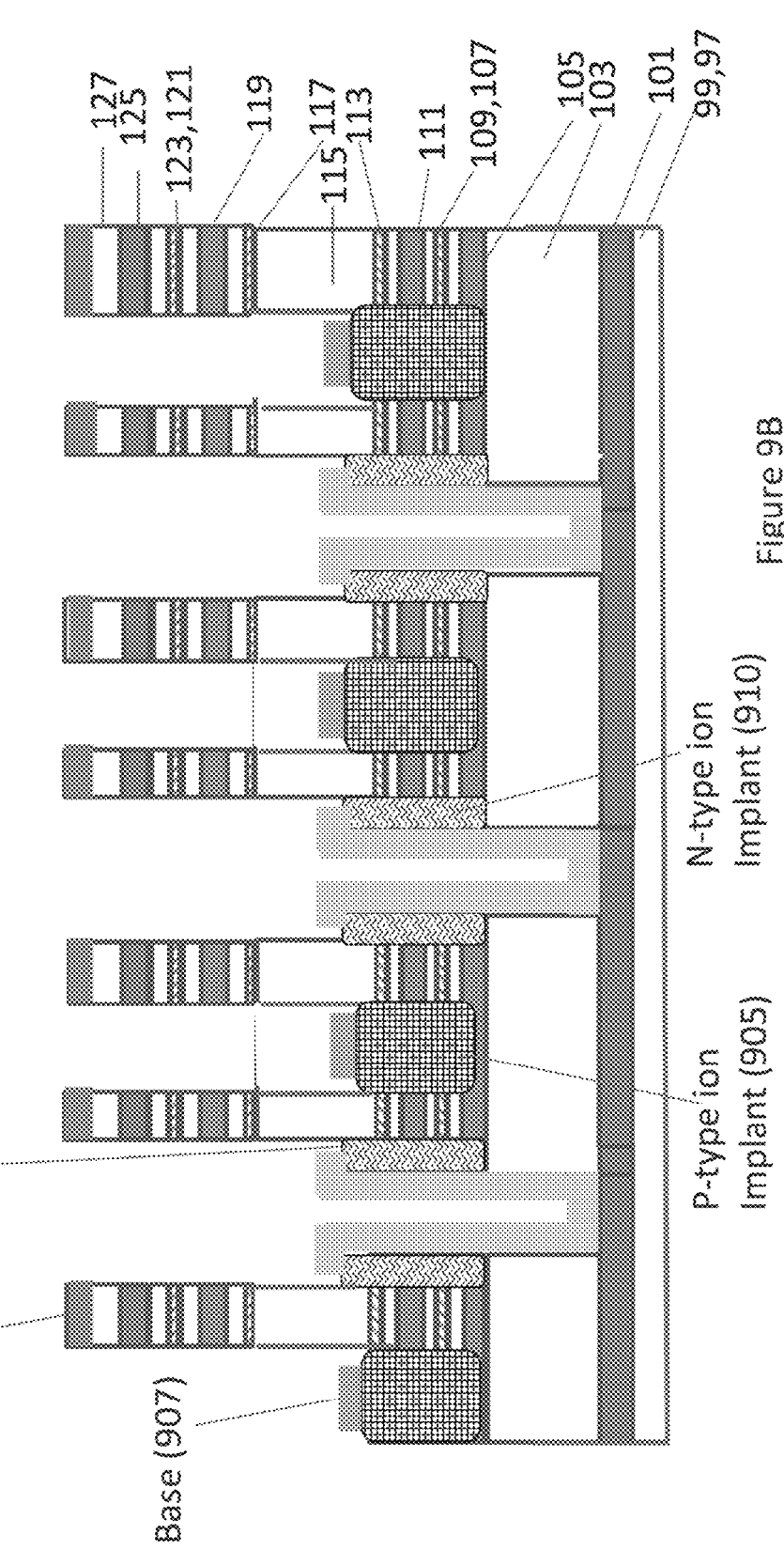
FIG. 9B is a schematic cross-section view of the exemplary N-N BICFET device of FIG. 9A along the section labeled X-X' in FIG. 9A.
Figure 9C:
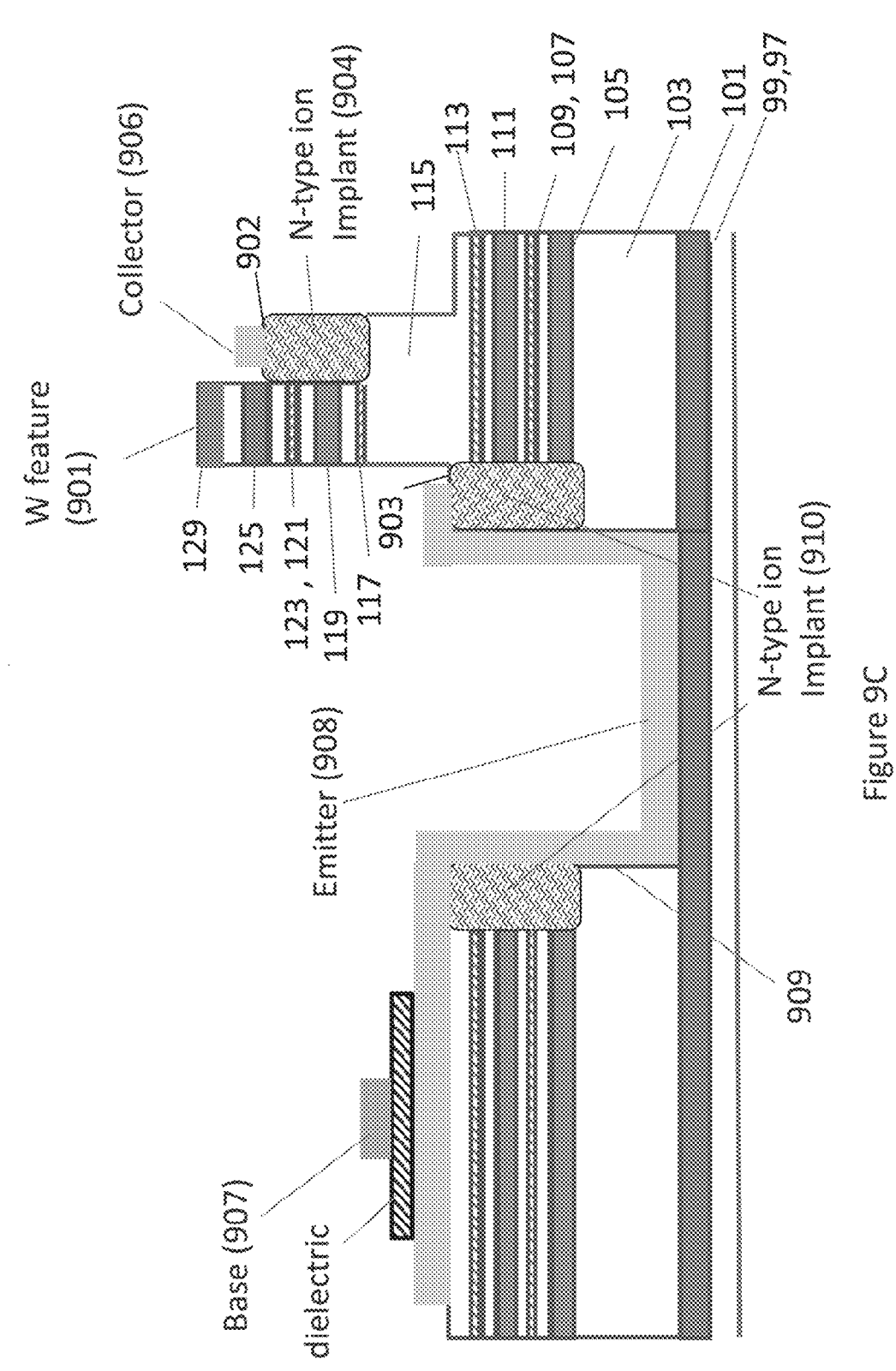
FIG. 9C is a schematic cross-section view of the exemplary N-N BICFET device of FIG. 9A along the section labeled Y-Y' in FIG. 9A.
Figure 9D:
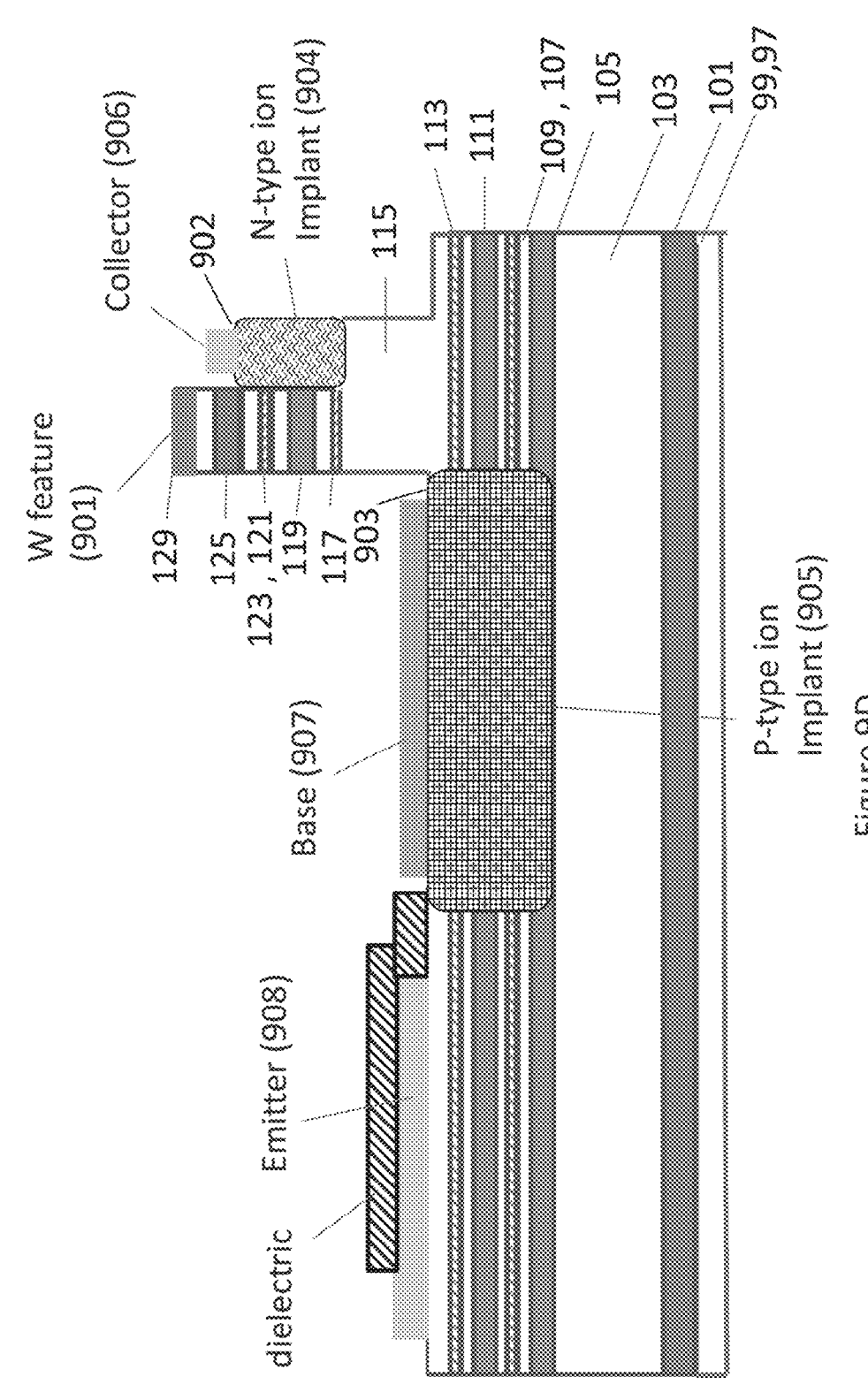
FIG. 9D is a schematic cross-section view of the exemplary N-N BICFET device of FIG. 9A along the section labeled Z-Z' in FIG. 9A.

The embodiments of FIGS. 5A and 5B can be used as building blocks for other complementary HFET circuits as part of the IC such as NOR and NAND gates, flip flops, counters, etc. For example, FIGS. 6A and 6B illustrate a 2-INPUT NAND GATE built from the Stacked Complementary HFET devices. In another example, FIGS. 7A and 7B illustrate a 2-INPUT NOR GATE built from the Stacked Complementary HFET devices.

The epitaxial layer structure and fabrication methodologyas described herein can also be configured to realize bipolar inversion channel field-effect transistors (BICFETs) with either an n-type modulation-doped quantum well inversion channel base region (P-P BICFET transistor device) or a p-type modulation-doped quantum well inversion channel base region (N-N BICFET transistor device).

As shown in FIGS. 8A-8D, the P-P BICFET transistor device employs interdigitated features 801 that overlie n-type modulation-doped quantum well inversion channel base regions, which include QW channel(s) realized in the three n-type modulation-doped QW structures 117, 121 and 123. The interdigitated features 801 can be formed from a refractory metal such as tungsten. The corresponding inter-digitated base channels (that underlie the features 801) are operably coupled to interdigitated base contact electrode parts 806 via n-type ion implant regions 804. Interdigitated collector regions in the p-type modulation-doped QW structures 107, 109, 113 are operably coupled to interdigitated collector contact electrode parts 807 via p-type ion implant regions 805. An emitter electrode 809 is electrically coupled to the p+ doped gate layers 125 and 119 of the interdigitated base regions via a p-type ion implant region 808. The emitter electrode 809 also contacts the tungsten electrode 801 so the top P+ layer 129 and the nanosheets 125 and 119 are connected. The P-P BICFET transistor device is a bipolar junction type transistor which can be operated in an active mode by applying a forward bias to the heterojunction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the channel to the emitter, which contributes to current flowing out of the base terminal electrode as well as the current flowing into the emitter terminal electrode. The large bandgap blocking layer 127 ensures that this electron flow from the channel to the emitter is small to enable high current gain.

As shown in FIGS. 9A-9D, the N-N BICFET transistor device employs interdigitated features 901 that overlie p-type modulation-doped quantum well inversion channel base regions, which include QW channel(s) realized in the three p-type modulation-doped QW structures 113, 107 and 109. The interdigitated features 901 can be formed from a refractory metal such as tungsten. The corresponding inter-digitated base (that underlie the features 901) are operably coupled to interdigitated base contact electrode parts 907 via p-type ion implant regions 905. The interdigitated features 901 also overlie interdigitated collector regions in the n-type modulation-doped QW structures 117, 121 and 123, which are operably coupled to interdigitated collector contact electrode parts 906 via n-type ion implant regions 904. An emitter electrode 908 is electrically coupled to the p-N+ doped gate layers 111 and 105 of the interdigitated base regions via an n-type ion implant region 910. The emitter electrode 908 also contacts the bottom n+ layer 101 so that layer 101 and the nanosheets 111 and 105 are connected. The N-N BICFET transistor device is a bipolar junction type transistor which can be operated in an active mode by applying a forward bias to the heterojunction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the channel to the emitter, which contributes to current flowing into the base terminal electrode as well as the current flowing out of the emitter terminal electrode. The large bandgap blocking layer 127 ensures that this electron flow from the channel to the emitter is small to enable high current gain.

The epitaxial layer structure and fabrication methodology as described herein can also be used to realize a variety of optoelectronic devices and optical devices. For example, the epitaxial layer structure and fabrication methodology as described herein can also be used to realize HFET photo-transistors.

For example, an NHFET device similar to FIGS. 3D-3F can be configured to operate as a phototransistor where current flows as a two-dimensional gas through the QW channel region of the n-type modulation-doped QW structures 121, 123 of the second GAA layer structure and the n-type modulation-doped QW structure 117 with the source and drain terminal electrodes on either side of the absorbing QW channel region in which case the NHFET becomes a waveguide for in-plane implementations. In this configuration, the ion-implanted n-type source and drain contact regions 313*a*, 313*b* can penetrate through both the second GAA layer structure and the n-type modulation-doped QW structure 117 into layer 115. The QW channel region operates as an active waveguide region, and the basic transistor action is the modulation of the QW channel conductance by an inversion layer (i.e., a two-dimensional electron gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of electron gas in the QW channel of the n-type modulation-doped quantum well structures 117, 121, 123 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the electron carriers enter the QW channel of the n-type modulation-doped QW structures 117, 121, 123, and the drain terminal electrode is the terminal electrode where the electron carriers leave the device.

In another example, a PHFET device similar to FIGS. 3A-3C can also be configured to operate as a phototransistor where current flows as a two-dimensional gas through the QW channel region of the p-type modulation-doped QW structures 107, 109 of the first GAA layer structure and the p-type modulation-doped QW structure 113 with the source and drain terminal electrodes on either side of the absorbing QW channel region in which case the NHFET becomes a waveguide for in-plane implementations. In this configuration, the ion-implanted p-type source and drain contact regions 304a, 304b can penetrate through both the p-type modulation-doped QW structure 113 and the first GAA layer structure into layer 105. The QW channel region operates as an active waveguide region, and the basic transistor action is the modulation of the QW channel conductance by an inversion layer (i.e., a two-dimensional hole gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of hole gas in the QW channel of the p-type modulation-doped quantum well structures 107, 109, 113 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the hole carriers enter the QW channel of the p-type modulation-doped QW structures 107, 109, 113 and the drain terminal electrode is the terminal electrode where the hole carriers leave the device.

Examples of such optoelectronic devices and optical devices are illustrated in FIGS. 10A to 23. Such devices can employ a resonant cavity for optical signal emission and/or detection.

In one configuration, the resonant cavity of the device can be configured as a vertical cavity and light may enter and exit the vertical cavity through an optical aperture (not shown) in the top surface of the device. In this configuration, the distance between the top mirror layers 133 and the bottom mirror layers 99 represents the length of the optical cavity and can be set to correspond to the designated wavelength (such as 1 to 4 times the designated wavelength in the material). This distance can take into account the penetration depth of the light into the bottom and top mirror layers. This distance is controlled by adjusting the thickness of one or more of the layers therebetween to enable this condition.

In another configuration, the resonant cavity of the device can be configured as a whispering gallery or closed-loop microresonator to support propagation of an optical mode signal within a waveguide region formed from the device structure. For the whispering gallery microresonator, the waveguide region can be a disk-like structure that supports propagation of a whispering gallery mode. The circumference of the disk-like structure is tuned to the particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. For the closed-loop microresonator, the waveguide can support circulating propagation of an optical mode that follows a circular optical path, a rectangular optical path, an oval optical path, or other suitable geometry. The optical path length of the closed-loop waveguide is tuned to the particular wavelength of the optical mode signal that is to propagate in the closed-loop waveguide. At least one coupling waveguide is formed integral to and adjacent the whispering gallery or closed-loop microresonator. The coupling waveguide provides for evanescent coupling of light to and/or from the whispering gallery or closed-loop microresonator. Specifically, for the laser, the whispering gallery mode produced by the whispering gallery microresonator or the optical mode signal that circulates in the closed-loop waveguide of the closed-loop microresonator is coupled to the coupling waveguide to produce an output optical signal that propagates in the coupling waveguide for output therefrom. For the detector, an input optical signal is supplied to the coupling waveguide, which couples the input light as a whispering gallery mode into the whispering gallery microresonator for detection. or as an optical mode signal that circulates in the closed-loop waveguide of the closed-loop microresonator for detection.

Figure 10A:
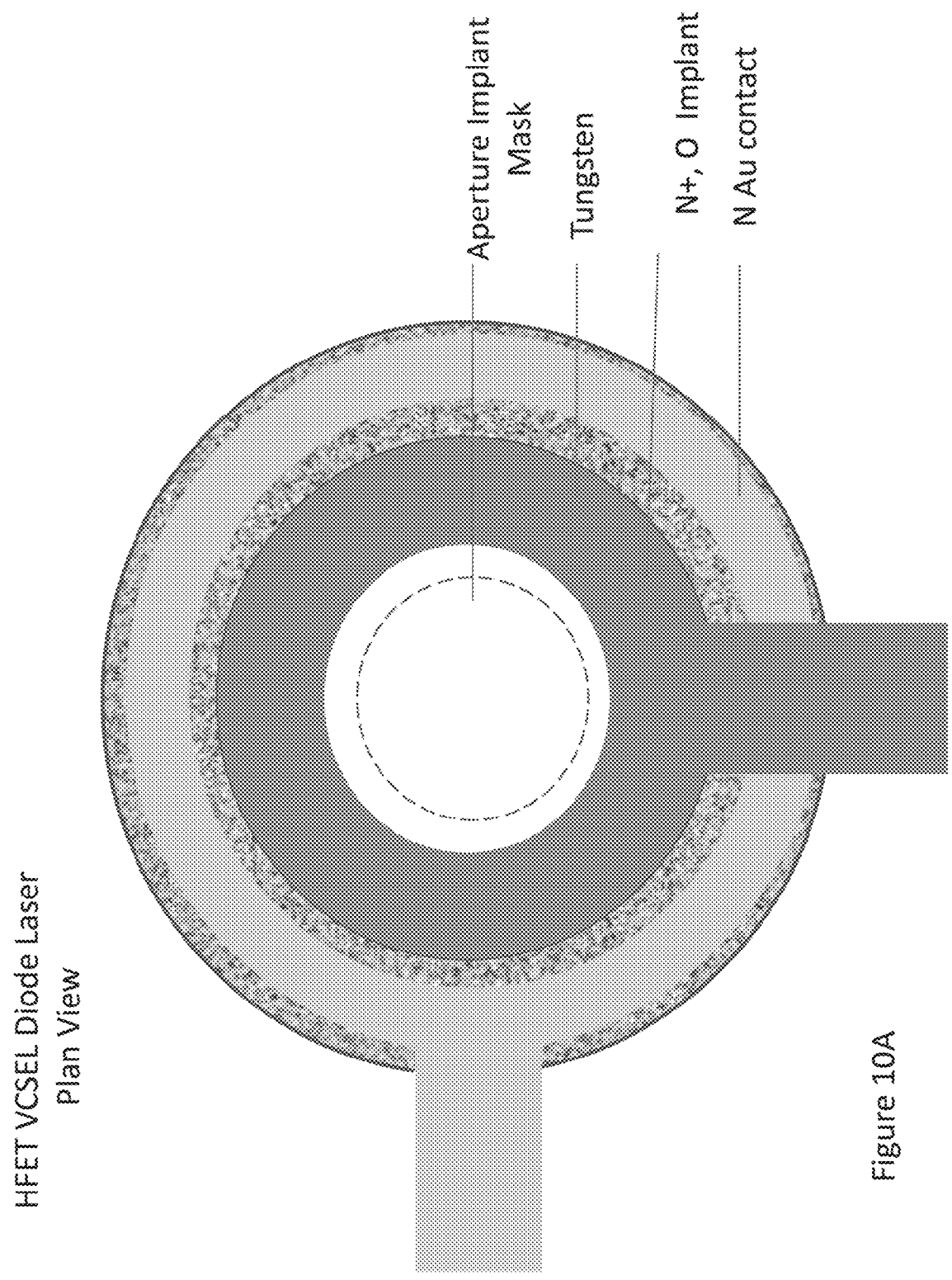
FIGS. 10A and 10B illustrate an HFET VCSEL diode laser realized from the epitaxial layer structure and fabrication methodology as described herein.
Figure 10B:
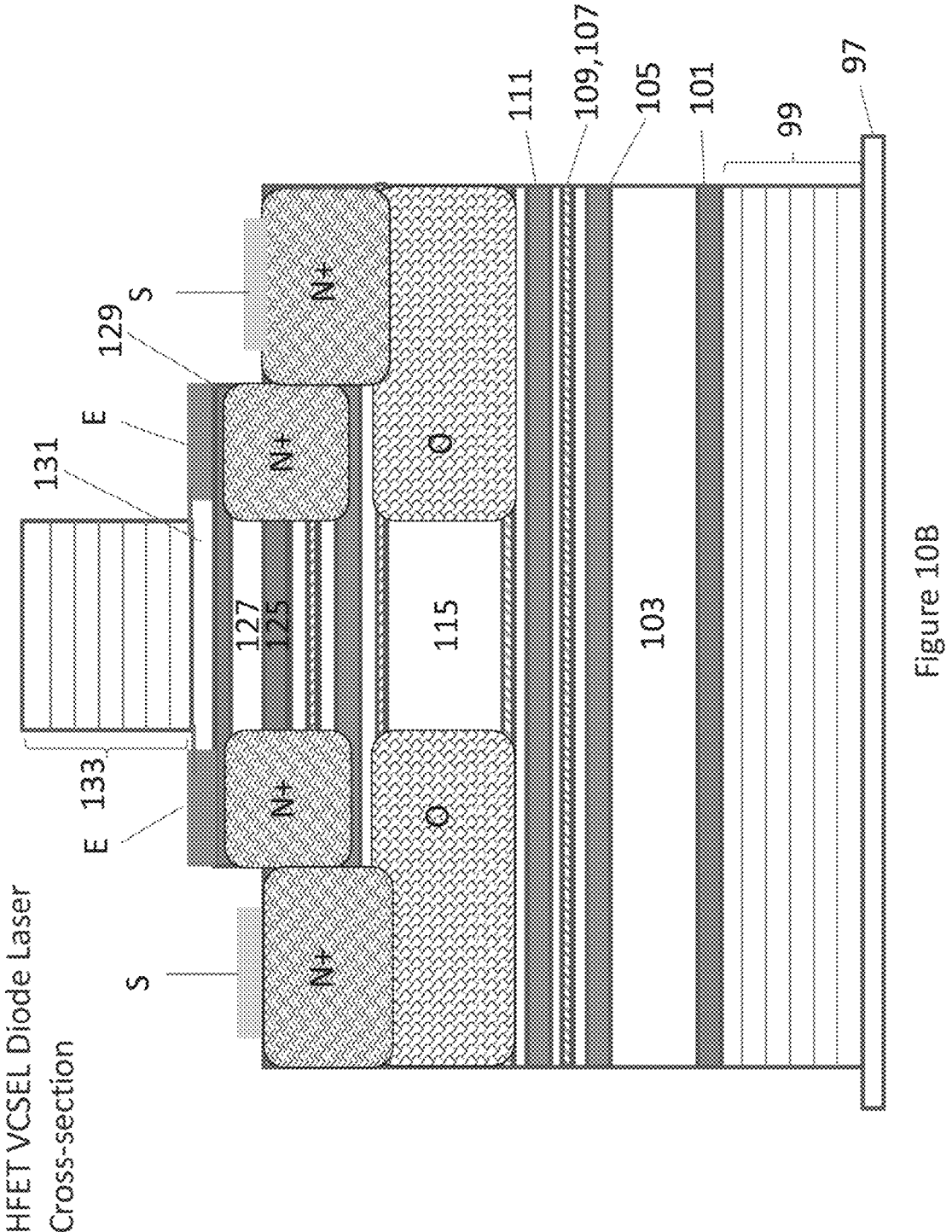

FIGS. 10A and 10B illustrate an HFET VCSEL diode laser realized from the epitaxial layer structure and fabrication methodology as described herein. In other embodiments, an array of HFET VCSEL devices can be integrally formed with a common top emitter electrode and common source electrode.

Figure 11A:
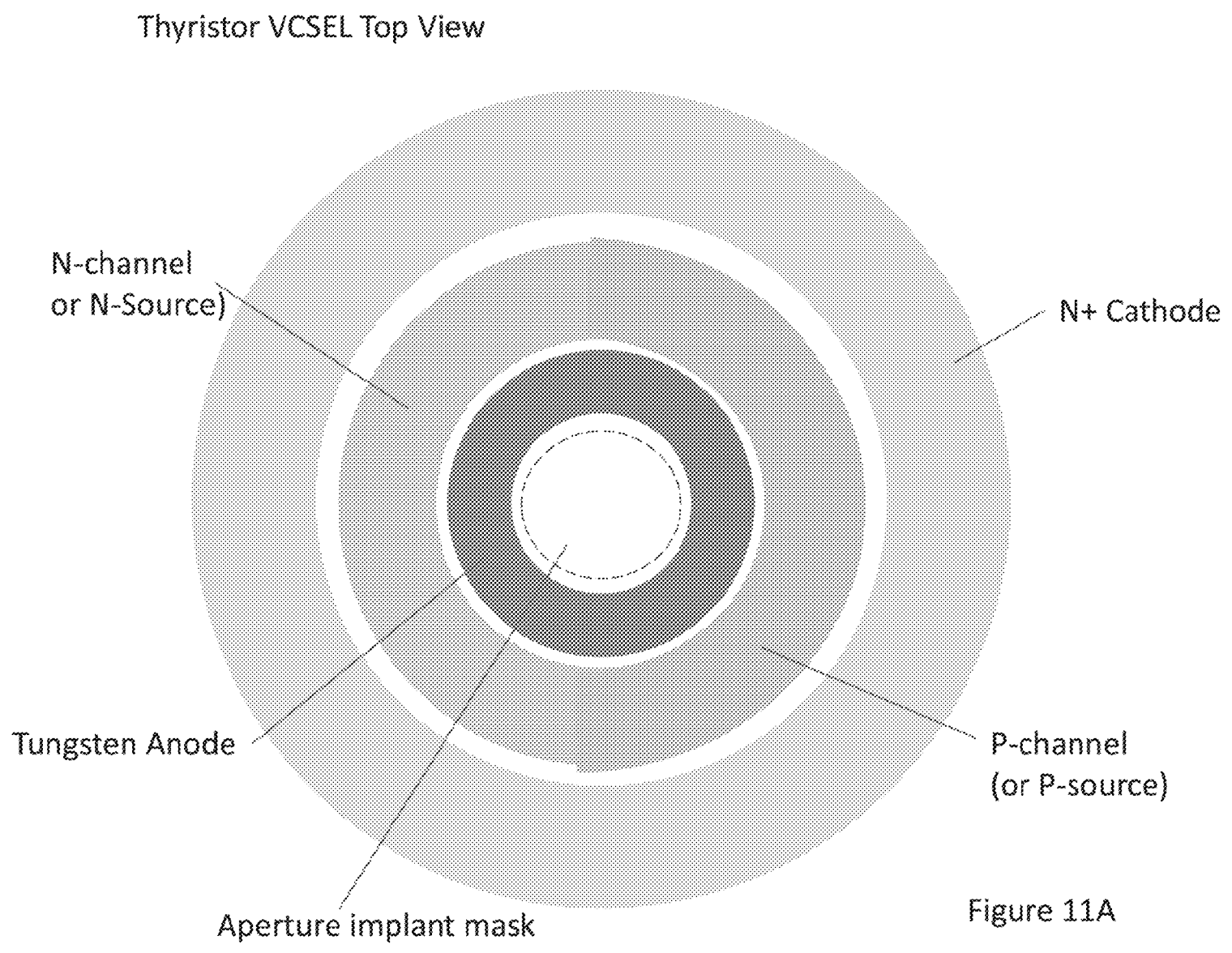
Figure 11B:
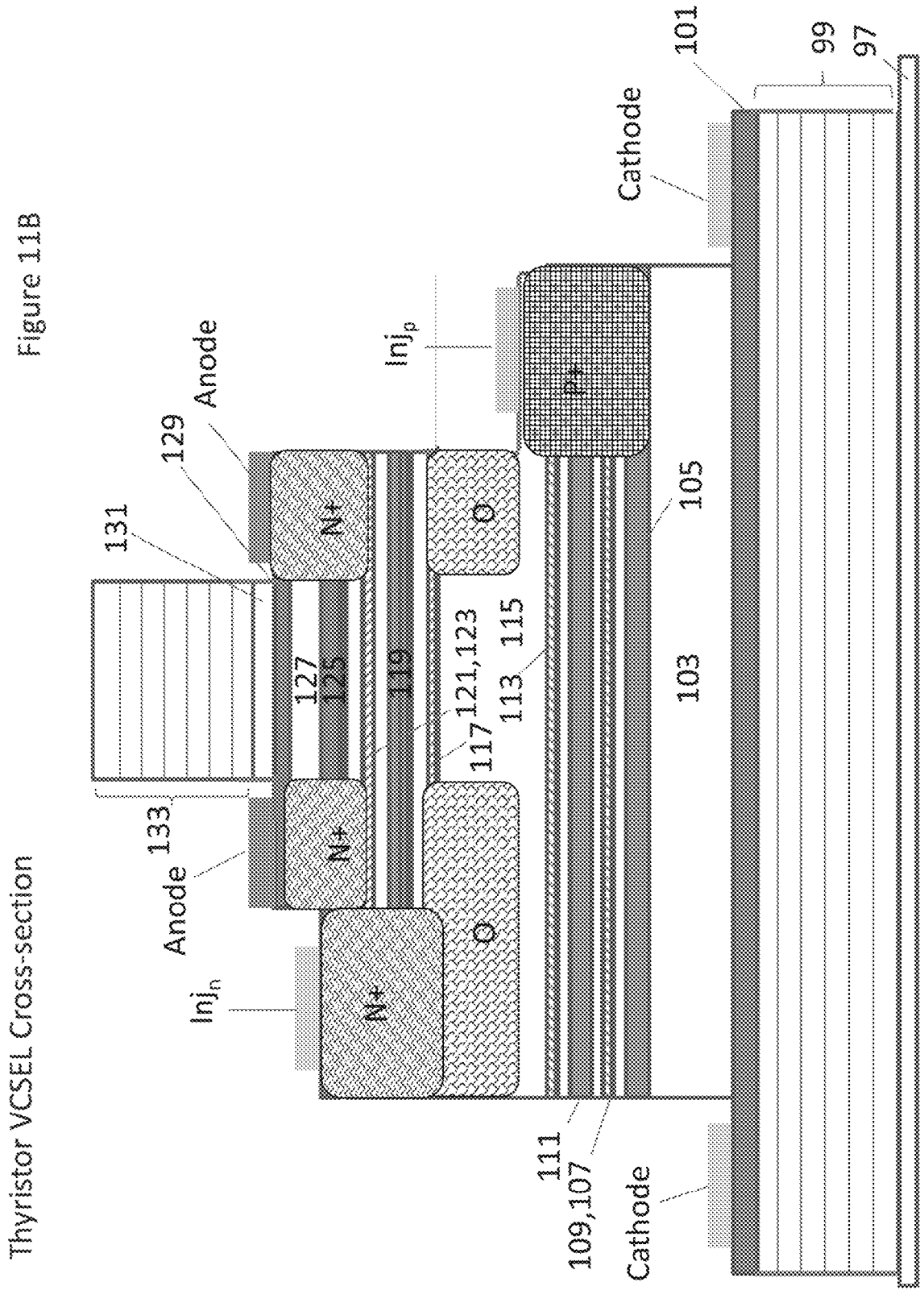
Figure 12:
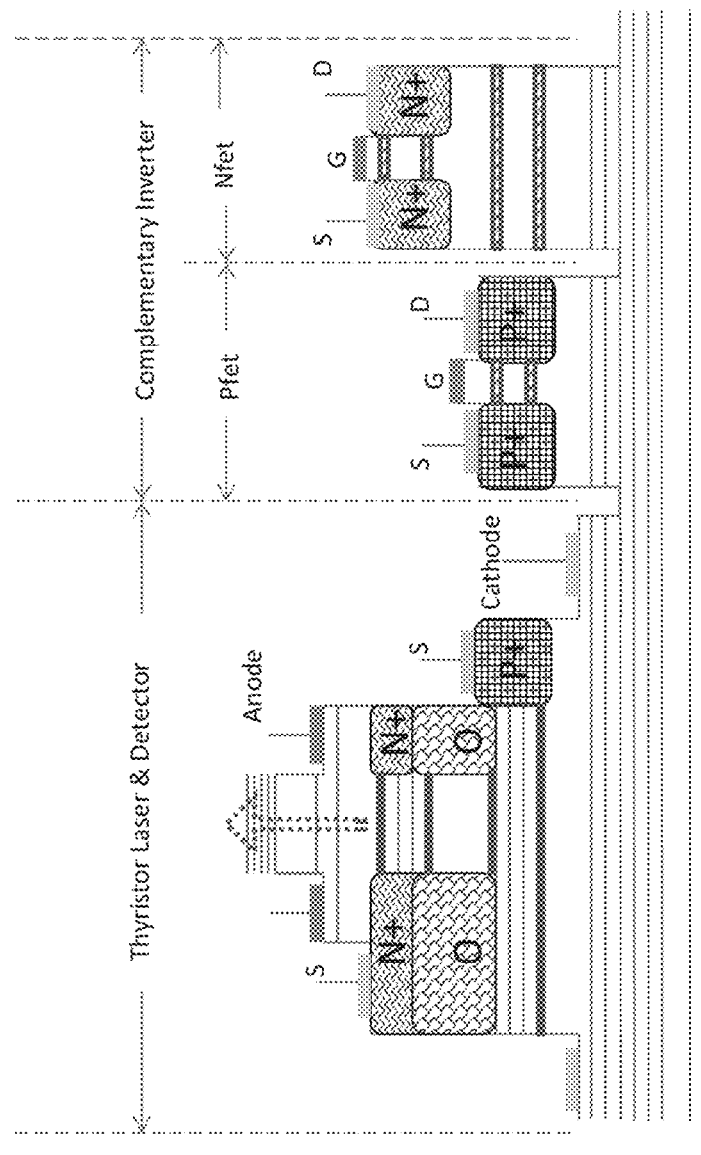
FIG. 12 illustrates a LIDAR pixel realized from the epitaxial layer structure and fabrication methodology as described herein
Figure 13:
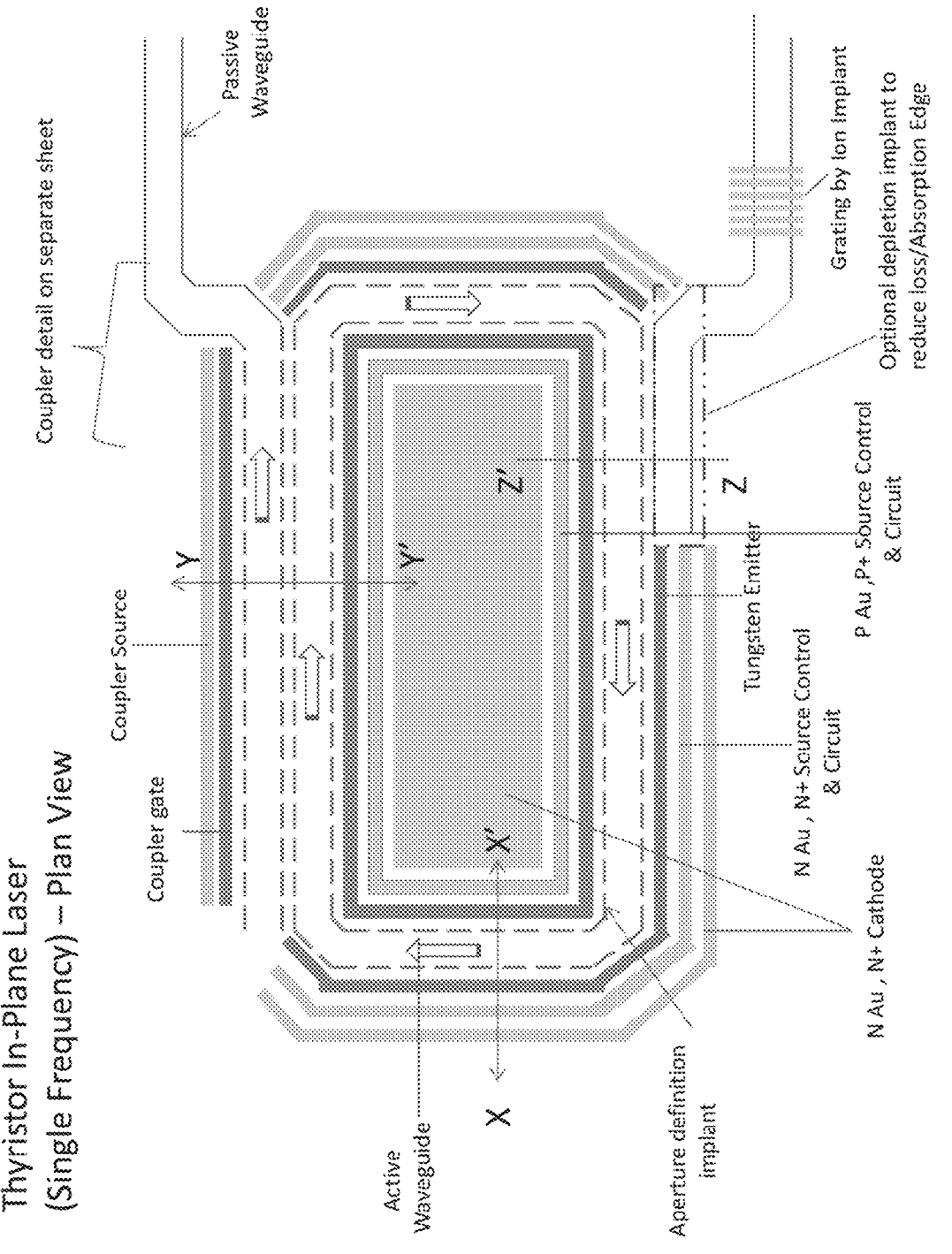
FIG. 13 illustrates a single-frequency thyristor in-plane Laser realized from the epitaxial layer structure and fabrication methodology as described herein
Figure 14A:
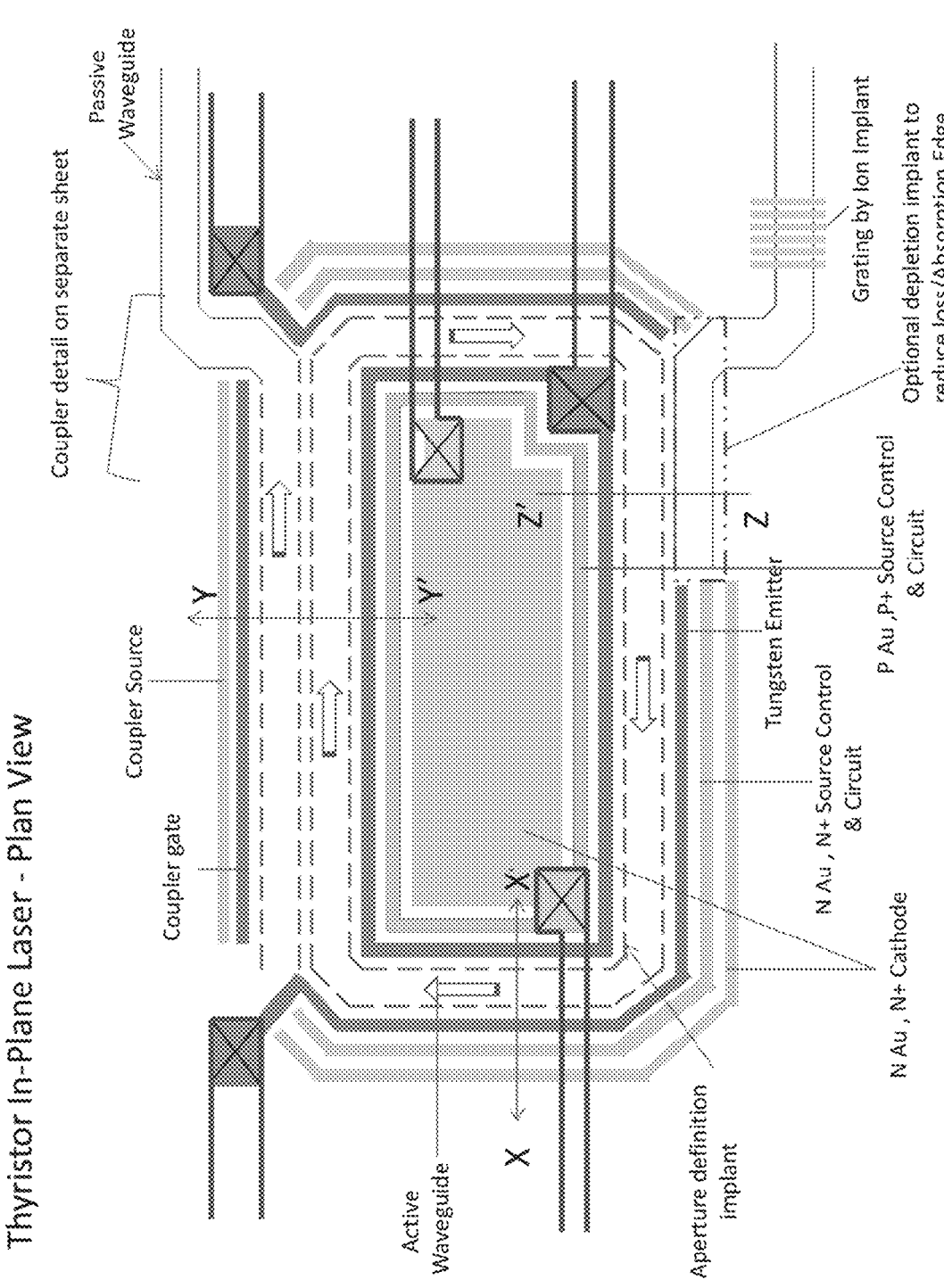
FIGS. 14A-14D illustrate a variable-frequency thyristor in-plane laser realized from the epitaxial layer structure and fabrication methodology as described herein.
Figure 14B:
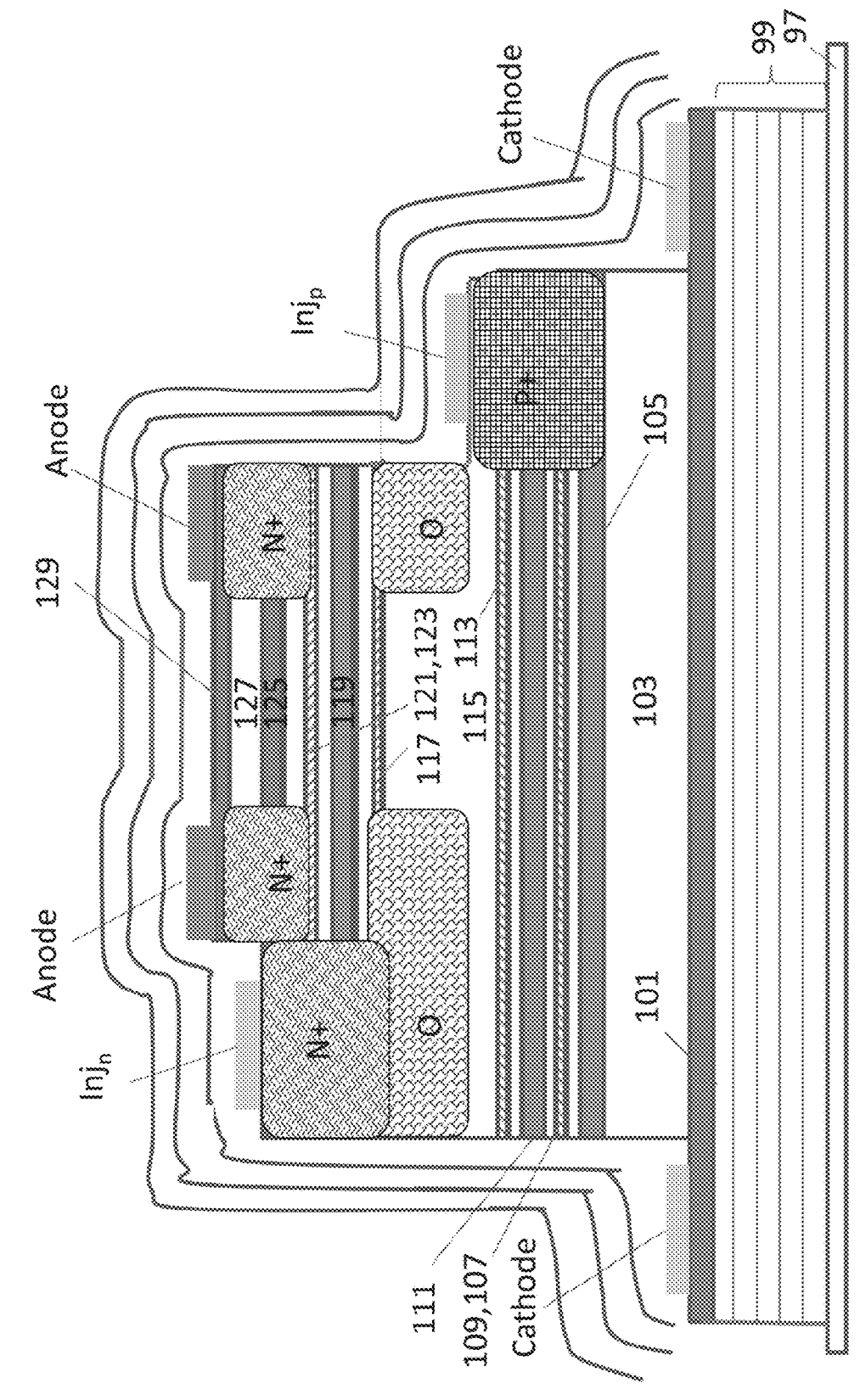
Figure 14C:
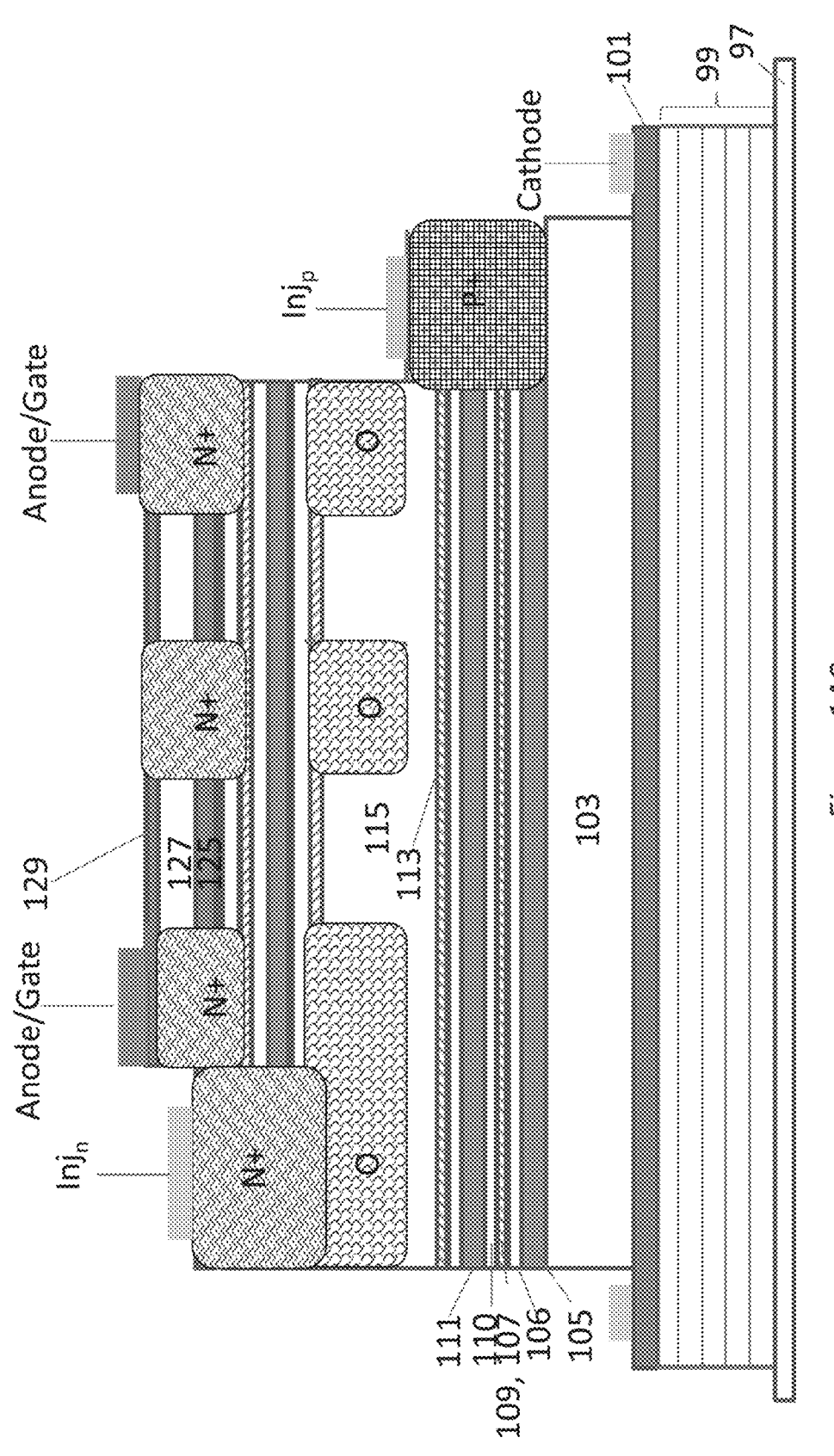
Figure 14D:
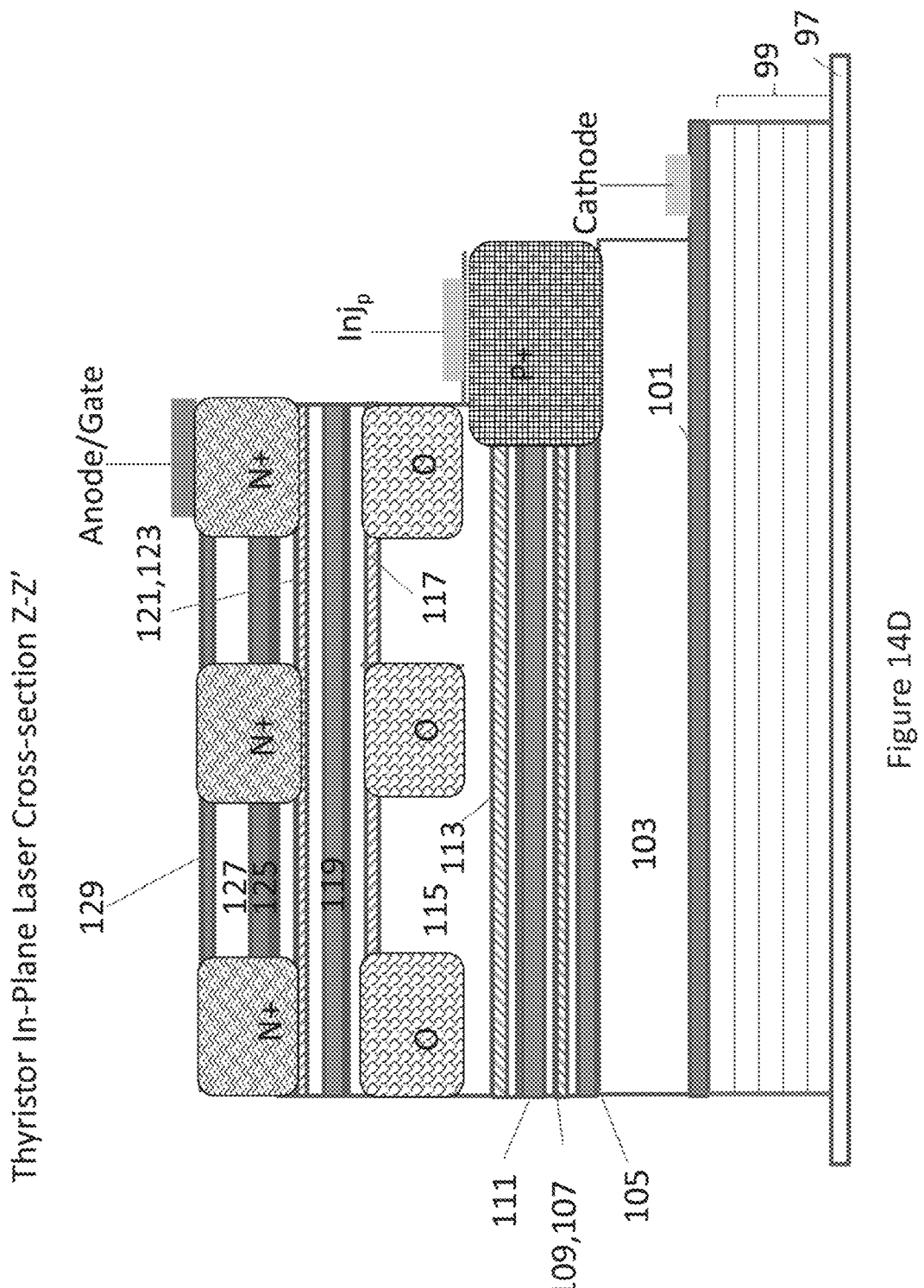

FIGS. 11A and 11B illustrate thyristor VCSEL realized from the epitaxial layer structure and fabrication methodology as described herein FIG. 12 illustrates a LIDAR pixel realized from the epitaxial layer structure and fabrication methodology as described herein FIG. 13 illustrates a single-frequency thyristor in-plane Laser realized from the epitaxial layer structure and fabrication methodology as described herein FIGS. 14A-14D illustrate a variable-frequency thyristor in-plane laser realized from the epitaxial layer structure and fabrication methodology as described herein.

Figure 15:
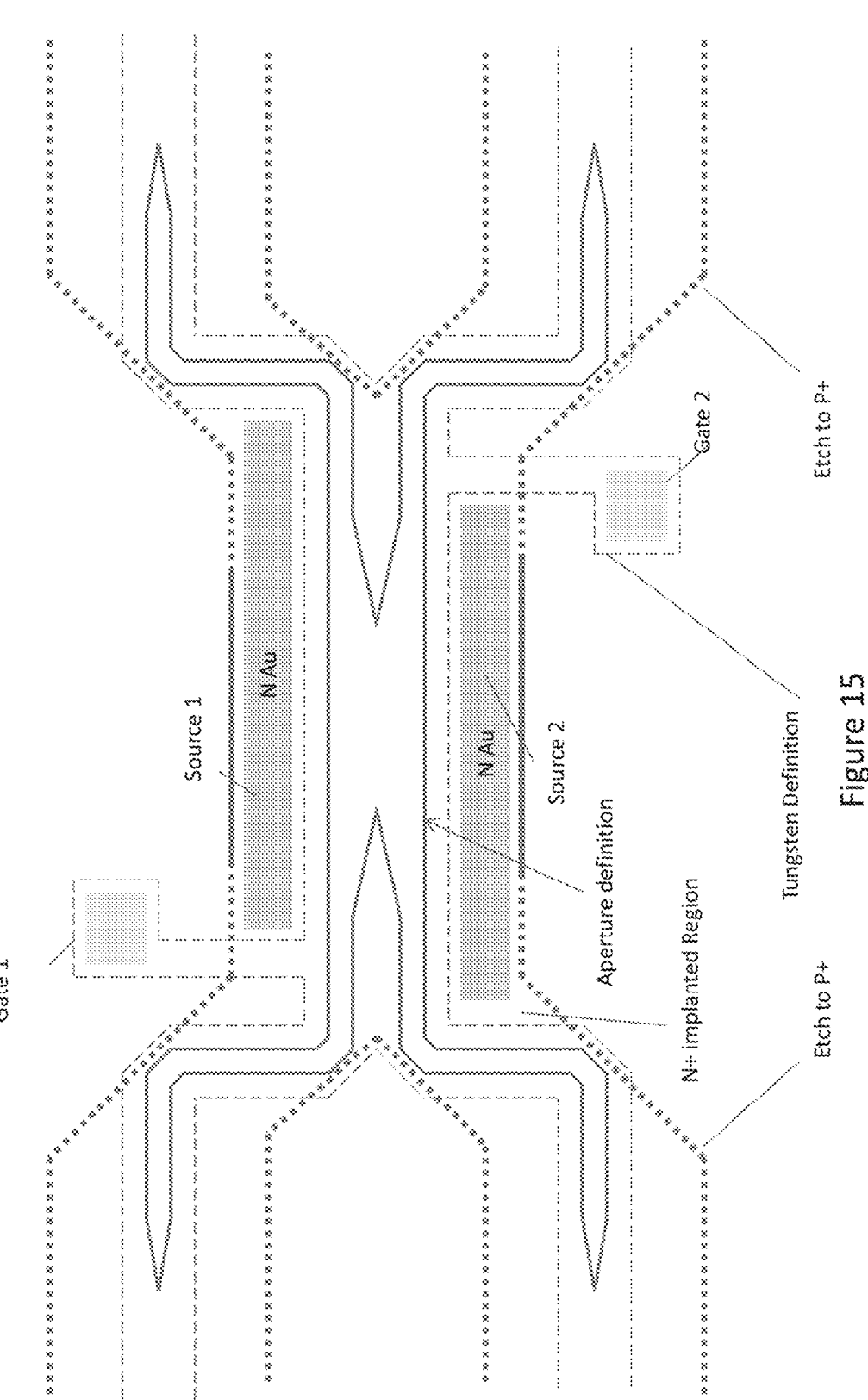
FIG. 15 illustrates a Dual-Input Directional Coupler realized from the epitaxial layer structure and fabrication methodology as described herein.

FIG. 15 illustrates a Dual-Input Directional Coupler realized from the epitaxial layer structure and fabrication methodology as described herein.

Figure 16:
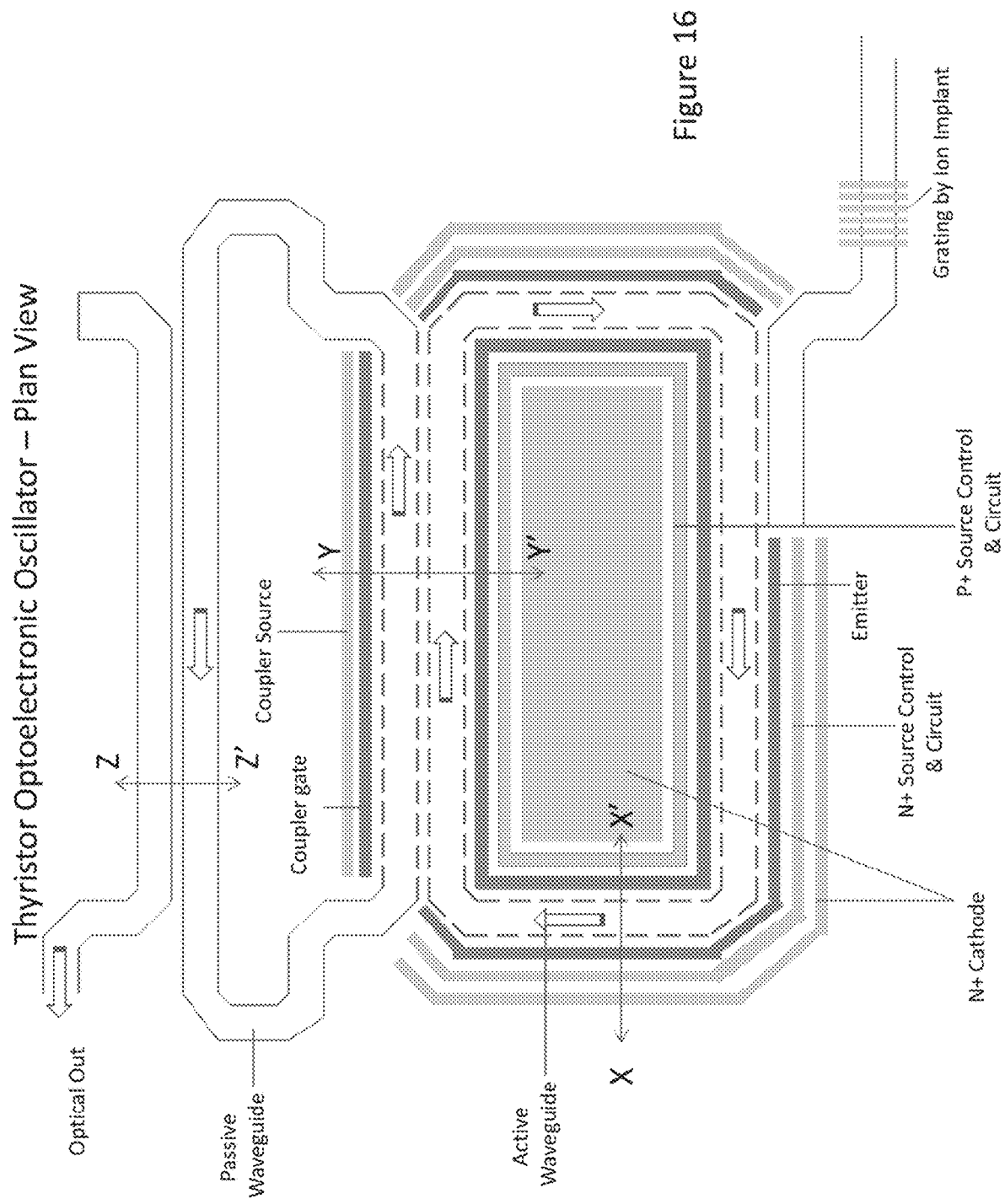
FIG. 16 illustrates a thyristor optoelectronic oscillator realized from the epitaxial layer structure and fabrication methodology as described herein.

FIG. 16 illustrates a thyristor optoelectronic oscillator realized from the epitaxial layer structure and fabrication methodology as described herein.

Figure 17A:
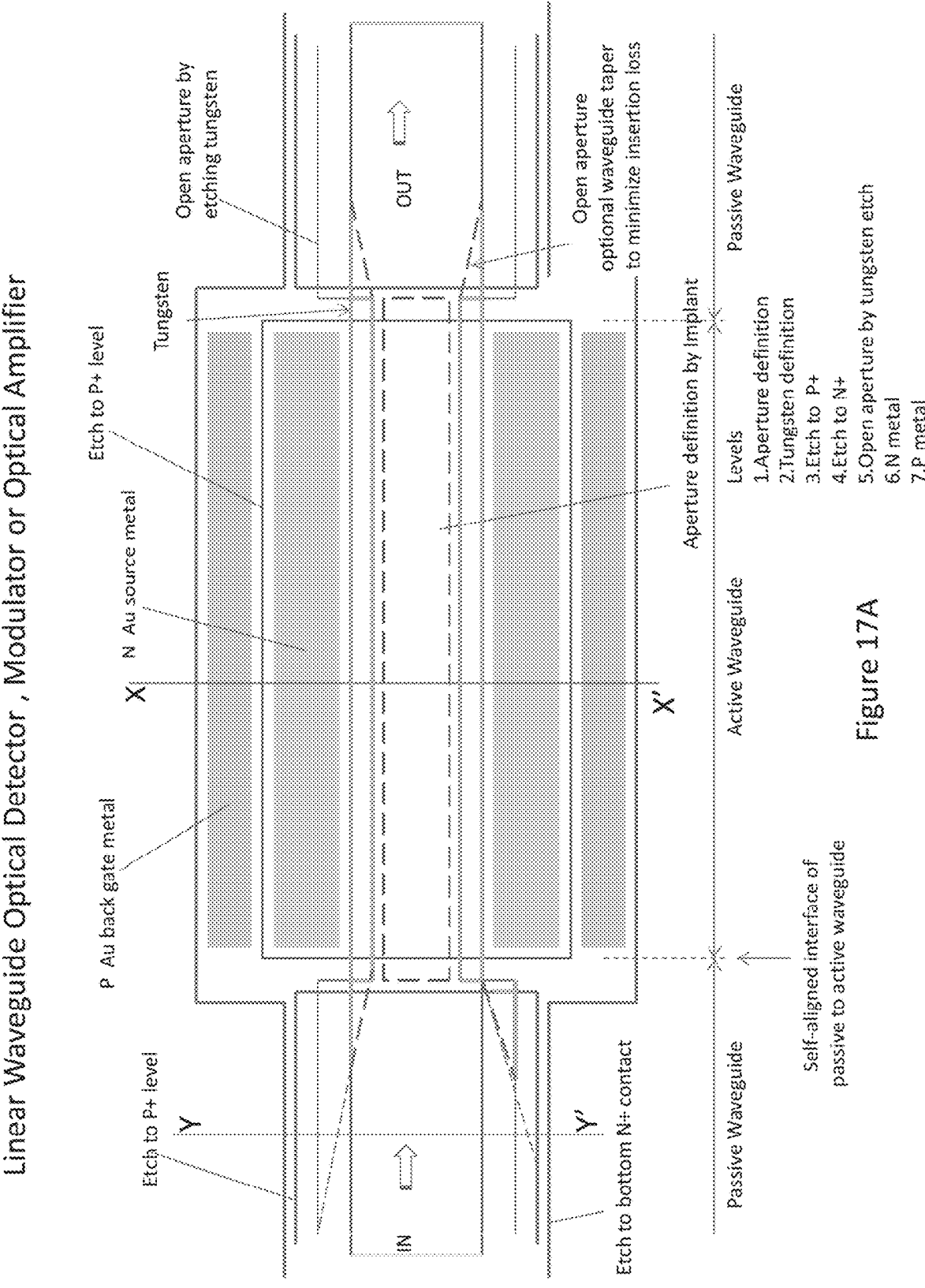
FIGS. 17A and 17B illustrate waveguide optical detectors, optical modulators, and optical amplifiers realized from the epitaxial layer structure and fabrication methodology as described herein.
Figure 17B:
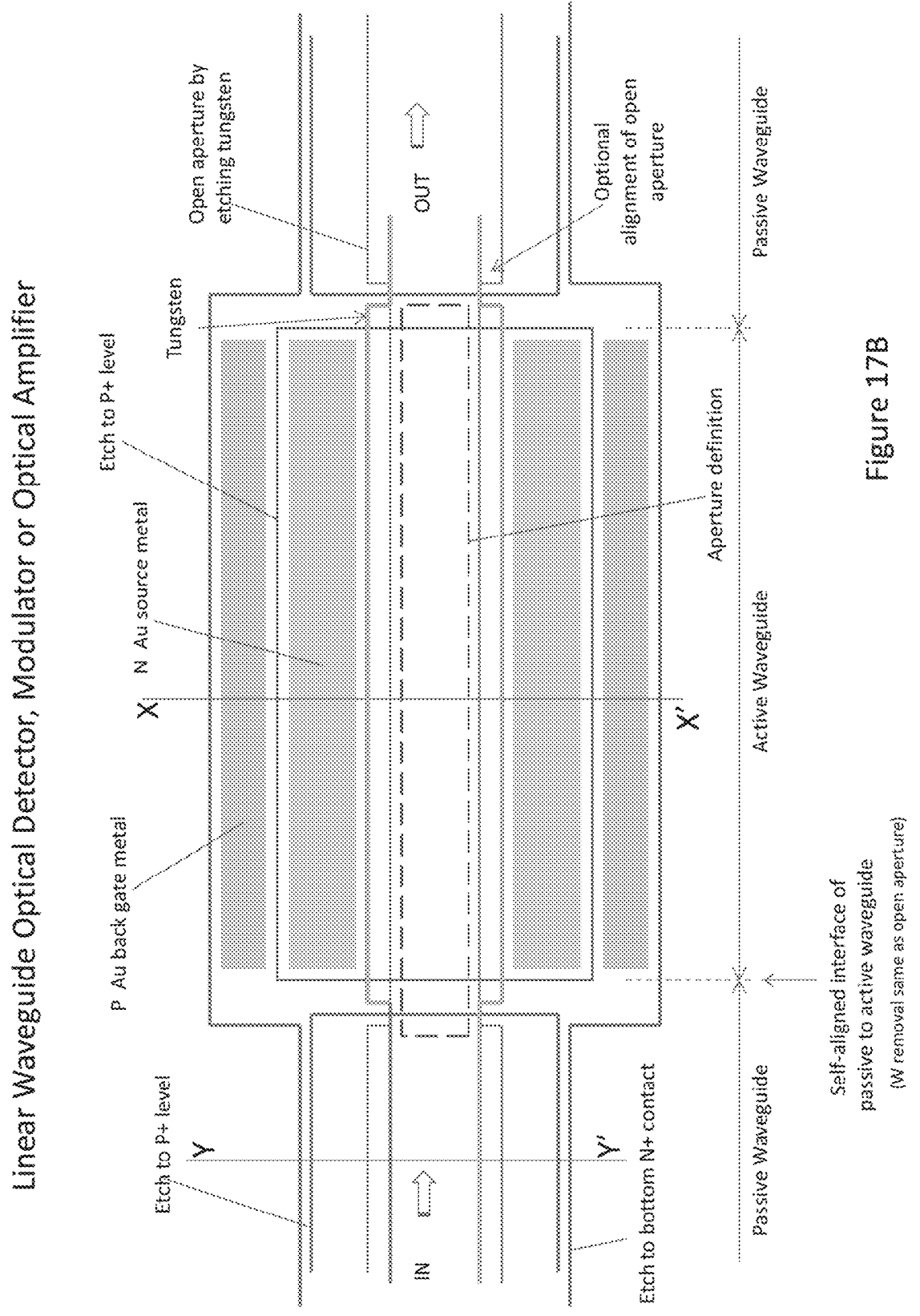

FIGS. 17A and 17B illustrate waveguide optical detectors, optical modulators, and optical amplifiers realized from the epitaxial layer structure and fabrication methodology as described herein.

Figure 18:
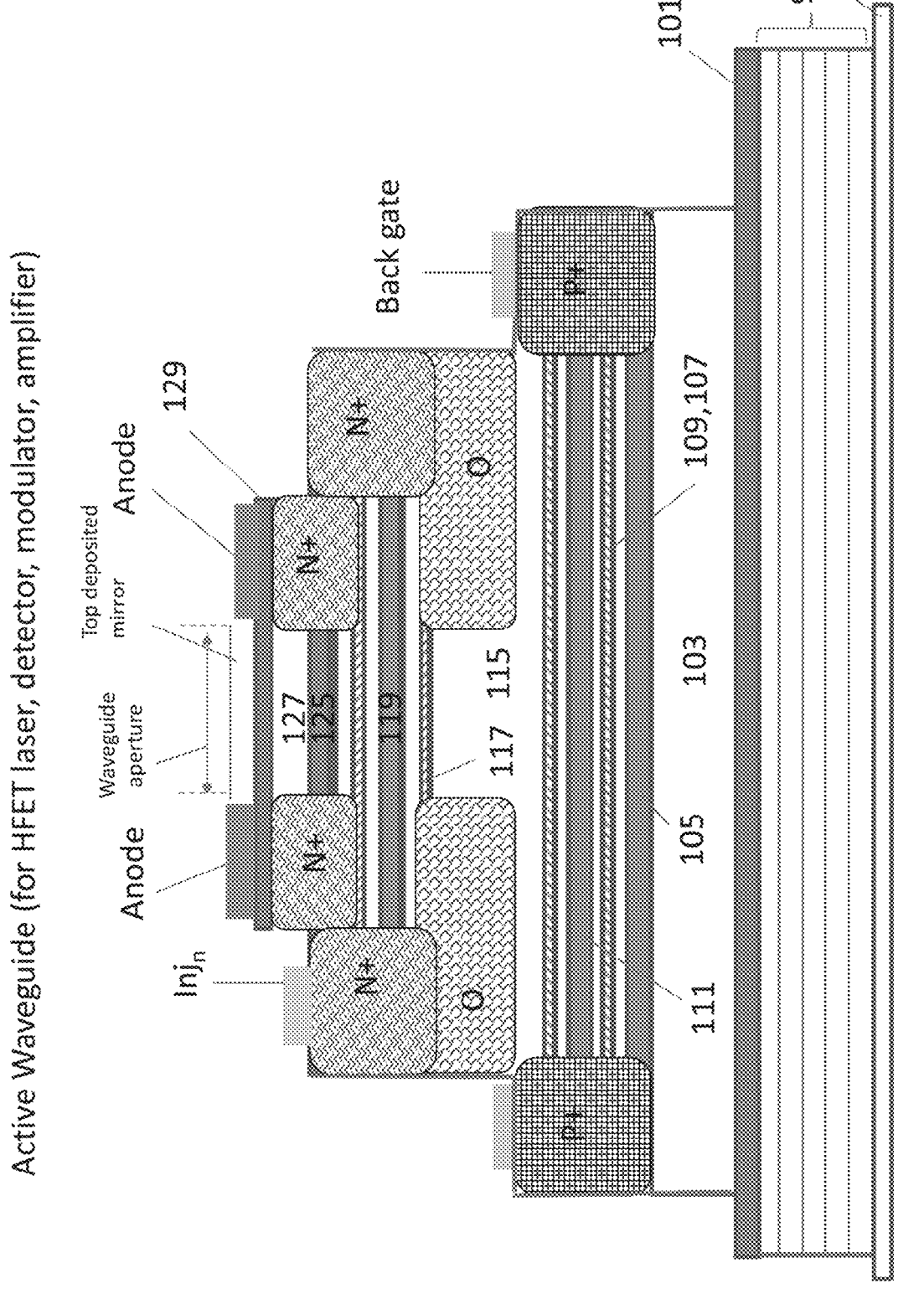
FIG. 18 illustrates an active waveguide (suitable for use with HFET lasers, optical detectors, optical modulators, and optical amplifiers) realized from the epitaxial layer structure and fabrication methodology as described herein.

FIG. 18 illustrates an active waveguide (suitable for use with HFET lasers, optical detectors, optical modulators, and optical amplifiers) realized from the epitaxial layer structure and fabrication methodology as described herein.

Figure 19:
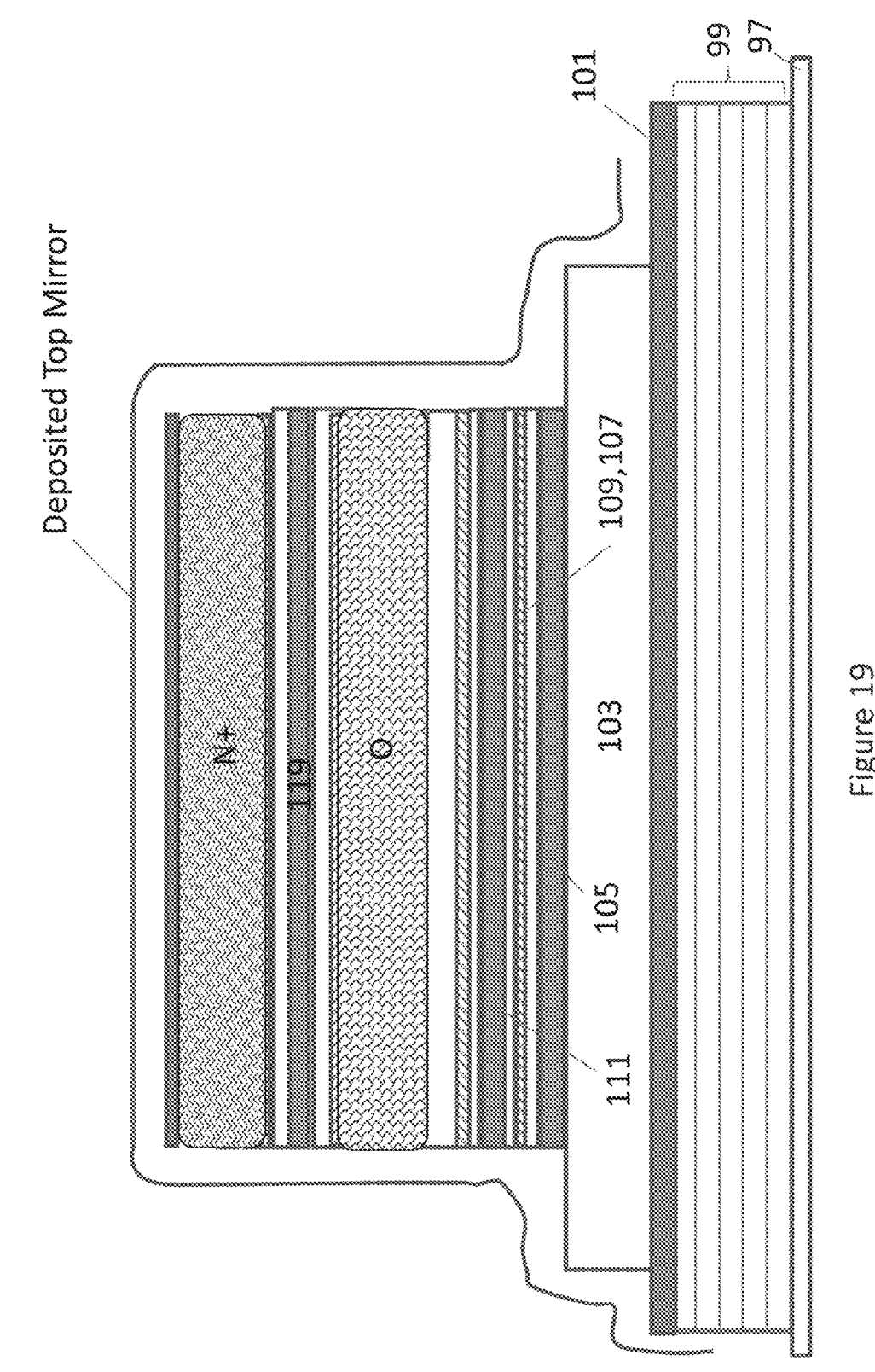
FIG. 19 illustrates a passive waveguide (suitable for use with optical detectors, optical modulators, and optical amplifiers) realized from the epitaxial layer structure and fabrication methodology as described herein.

FIG. 19 illustrates a passive waveguide (suitable for use with optical detectors, optical modulators, and optical amplifiers) realized from the epitaxial layer structure and fabrication methodology as described herein.

Figure 20:
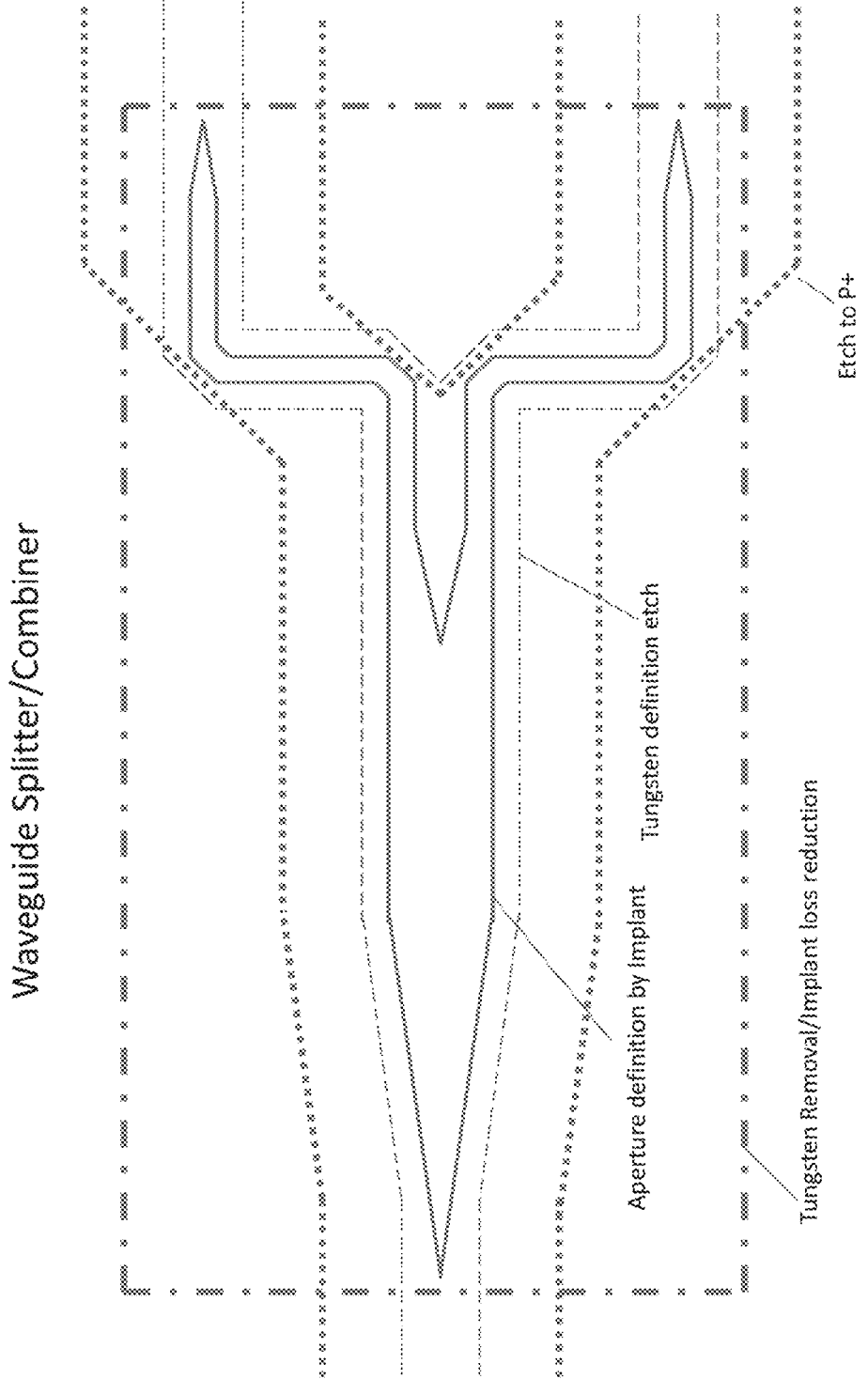
FIG. 20 illustrates a waveguide splitter or waveguide combiner realized from the epitaxial layer structure and fabrication methodology as described herein.

FIG. 20 illustrates a waveguide splitter or waveguide combiner realized from the epitaxial layer structure and fabrication methodology as described herein.

Figure 21:
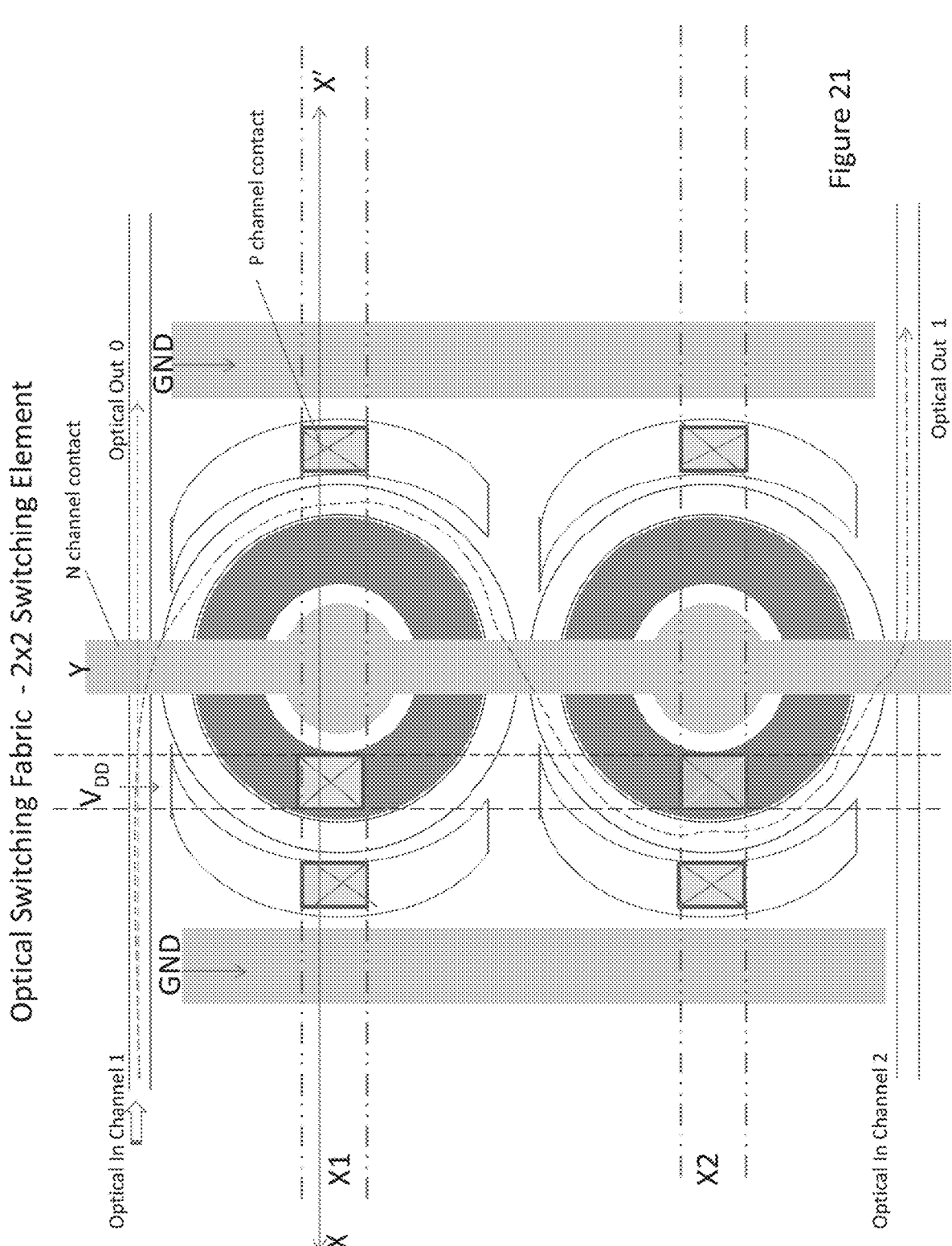
FIG. 21 illustrates an optical switching fabric (with 2×2 optical switching elements) realized from the epitaxial layer structure and fabrication methodology as described herein.

FIG. 21 illustrates an optical switching fabric (with 2×2 optical switching elements) realized from the epitaxial layer structure and fabrication methodology as described herein.

Figure 22:
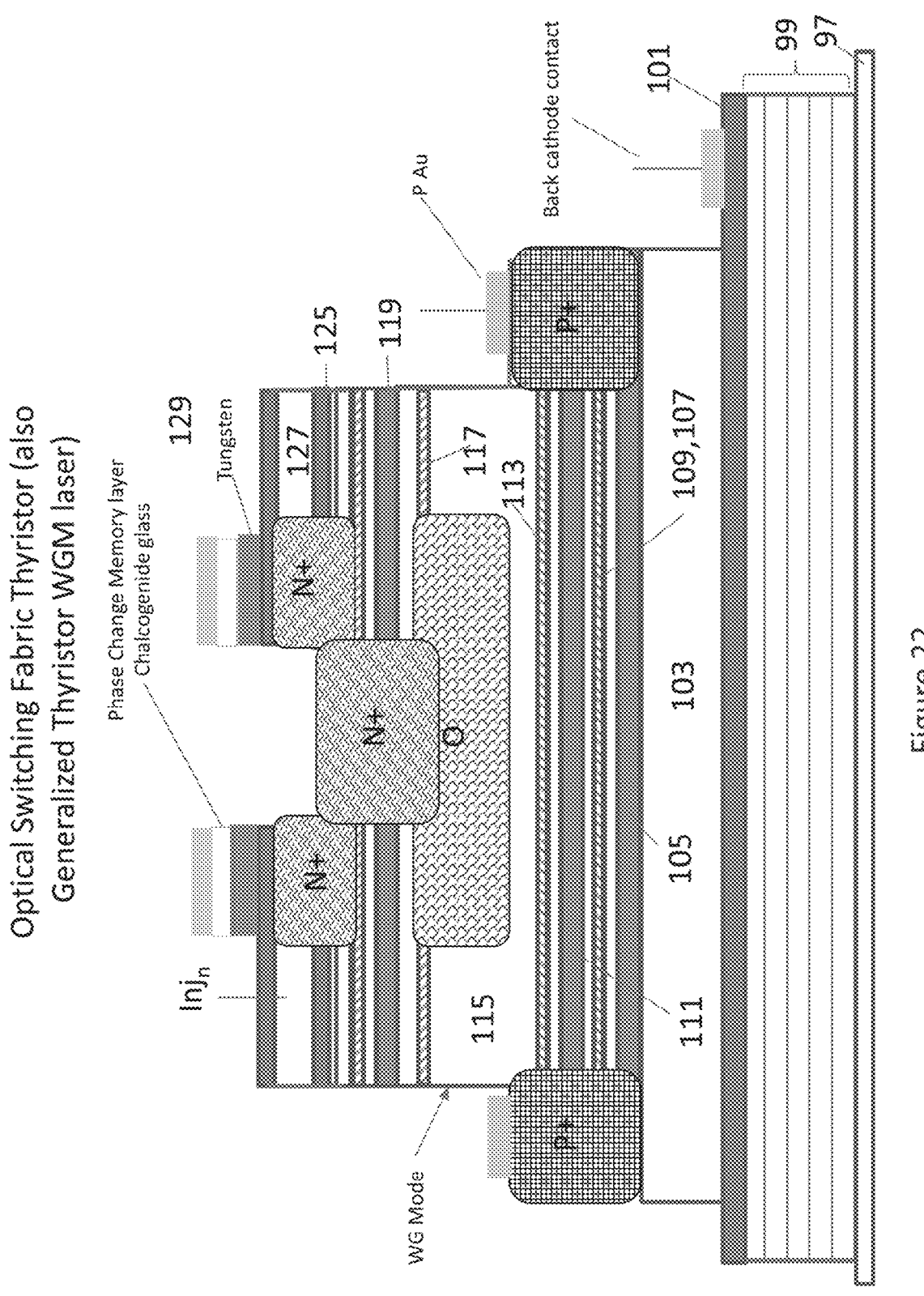
FIG. 22 illustrates a thyristor optical switching node (or a generalized thyristor whispering gallery mode laser) realized from the epitaxial layer structure and fabrication methodology as described herein.

FIG. 22 illustrates a thyristor optical switching node (or a generalized thyristor whispering gallery mode laser) realized from the epitaxial layer structure and fabrication methodology as described herein.

Figure 23:
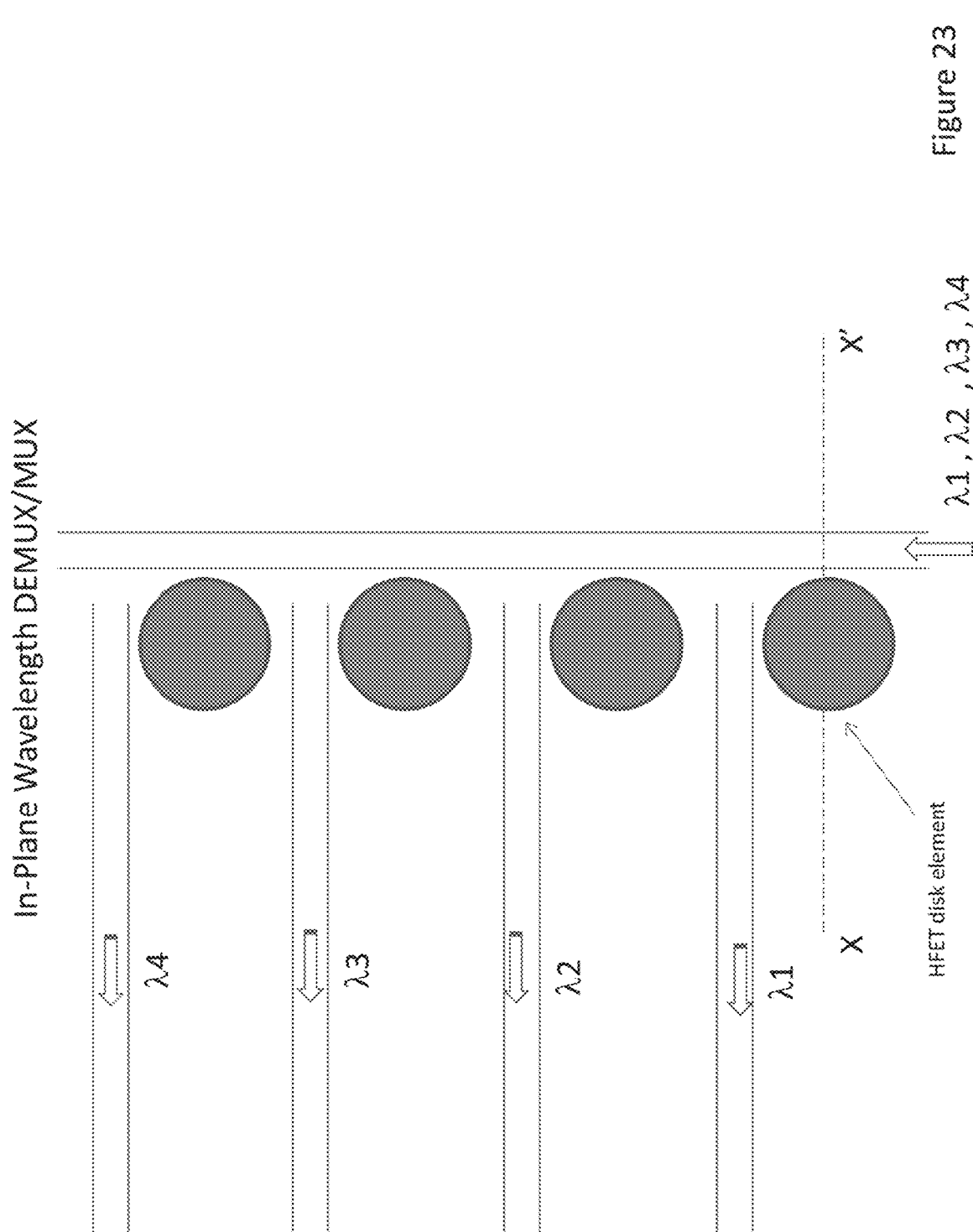
FIGS. 23 and 24 illustrate an array of in-plane wavelength demultiplexers (or array of in-plane wavelength multiplexers) realized from the epitaxial layer structure and fabrication methodology as described herein.
Figure 24:
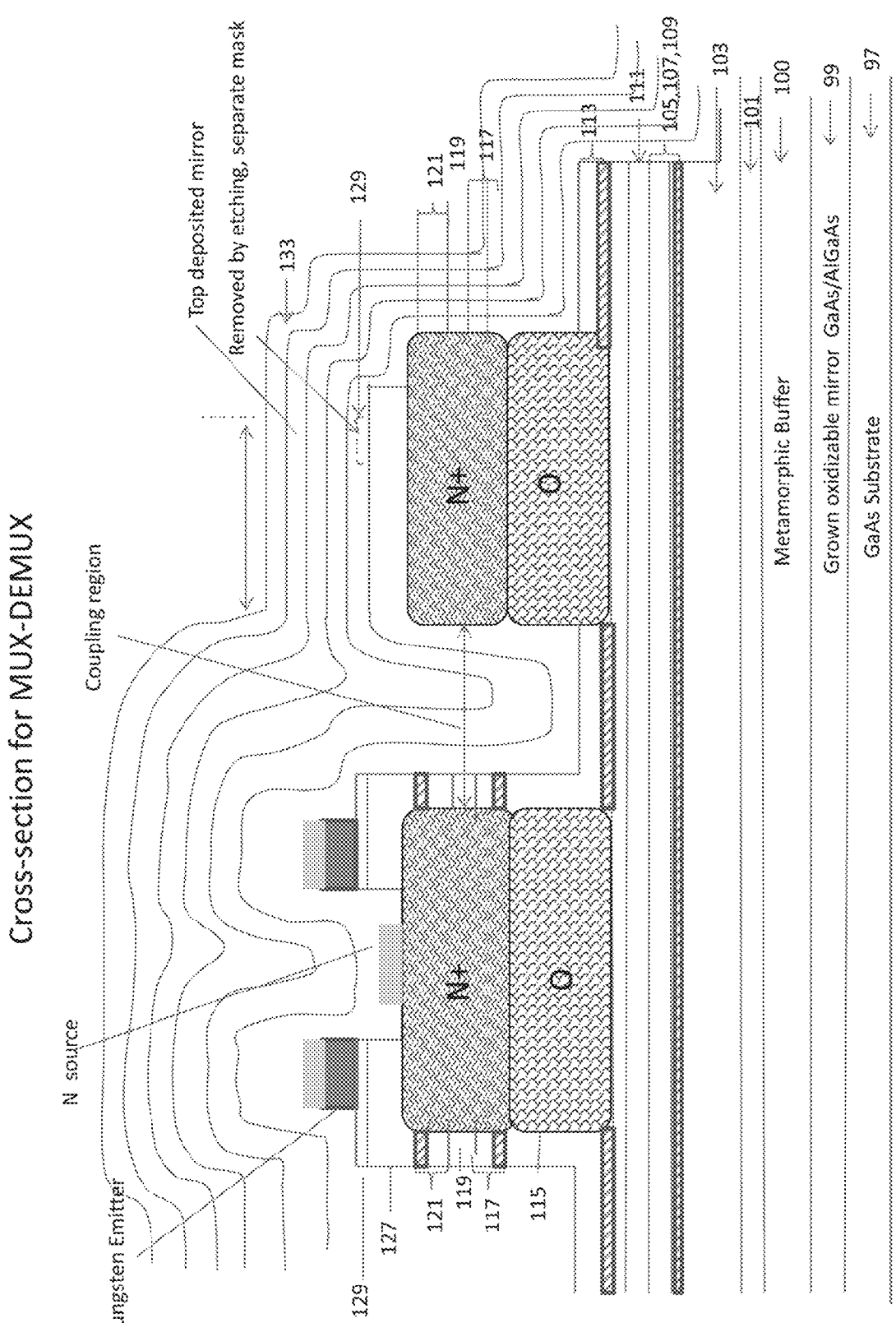

FIGS. 23 and 24 illustrate an array of in-plane wavelength demultiplexers (or array of in-plane wavelength multiplexers) realized from the epitaxial layer structure and fabrication methodology as described herein.

FIG. 25 illustrates a Universal Optical Data Bus with components realized from the epitaxial layer structure and fabrication methodology as described herein.

Figure 26:
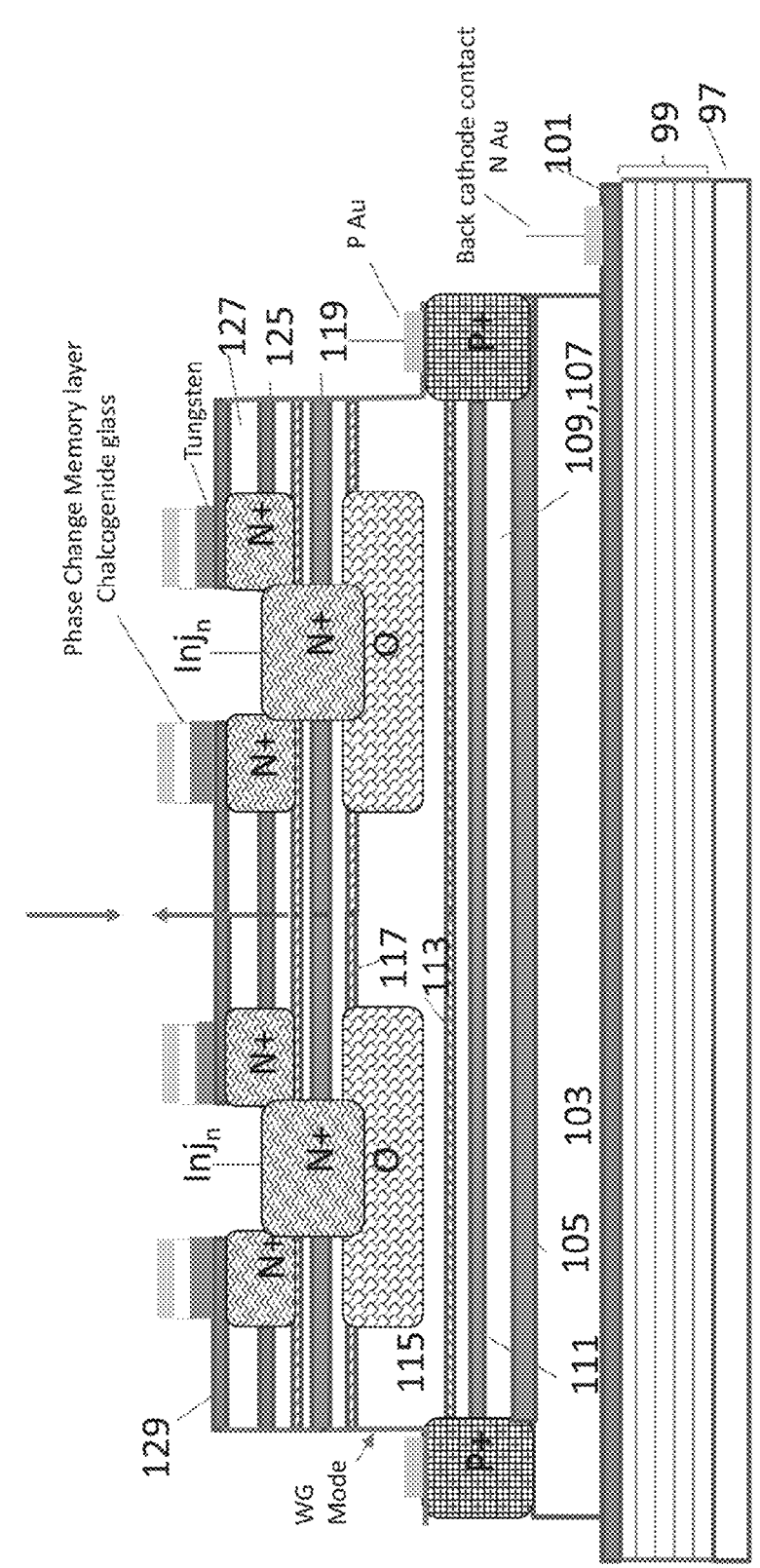
FIG. 26 illustrates an optical device that converts in-plane light to vertical light (or vice-versa), which is realized from the epitaxial layer structure and fabrication methodology as described herein.

FIG. 26 illustrates an optical device that converts in-plane light to vertical light (or vice-versa), which is realized from the epitaxial layer structure and fabrication methodology as described herein.

Figure 27:
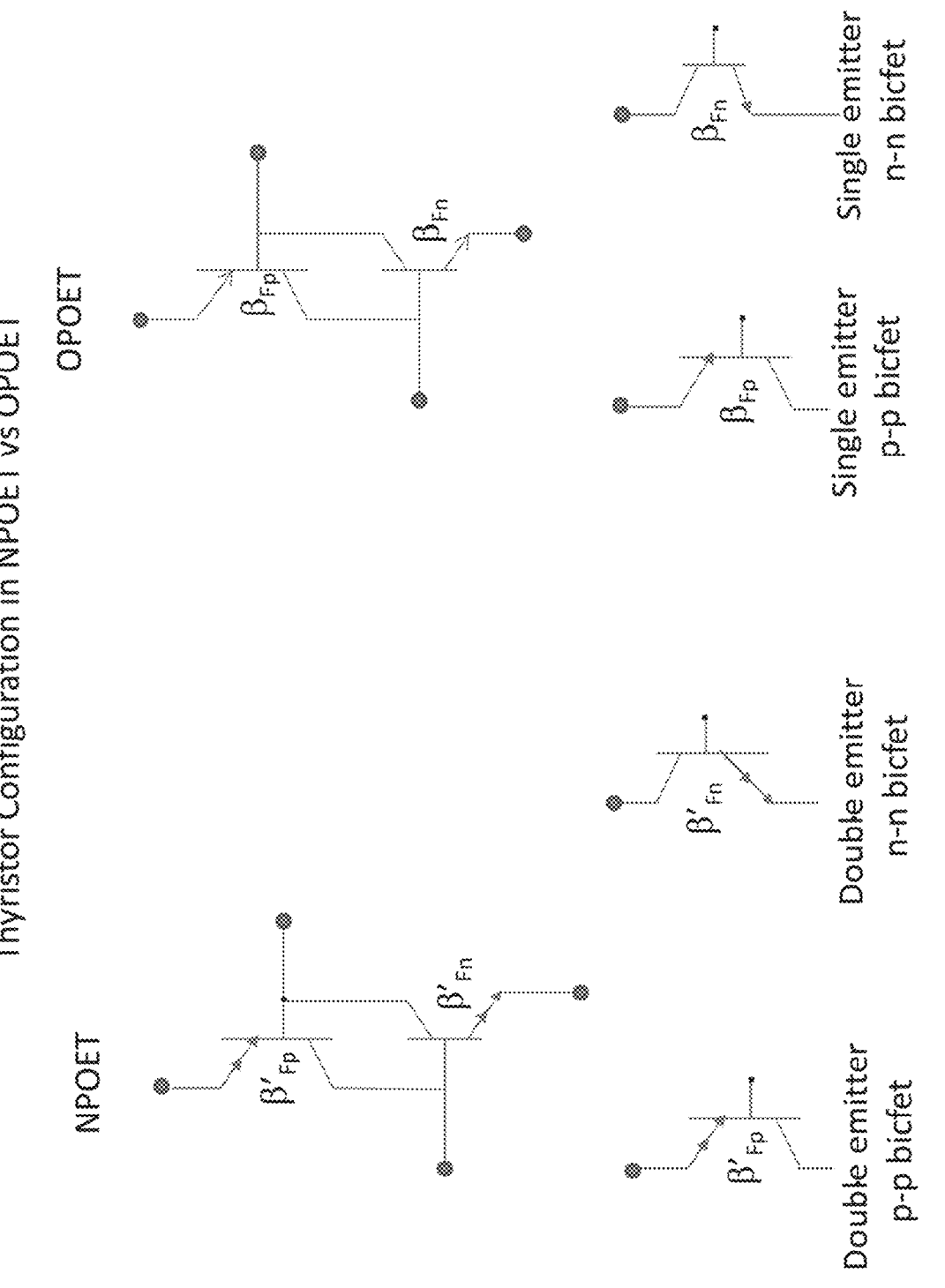
FIG. 27 is a schematic diagram of interconnected bipolar transistors that are equivalent to a thyristor device implemented by the device structure of FIGS. 1 and 2A-2B.

FIG. 27 illustrates the basic function of the thyristor in the device structure of FIGS. 1 and 2A-2B, which consists of two interconnected complementary bipolar transistors.

Figure 28:
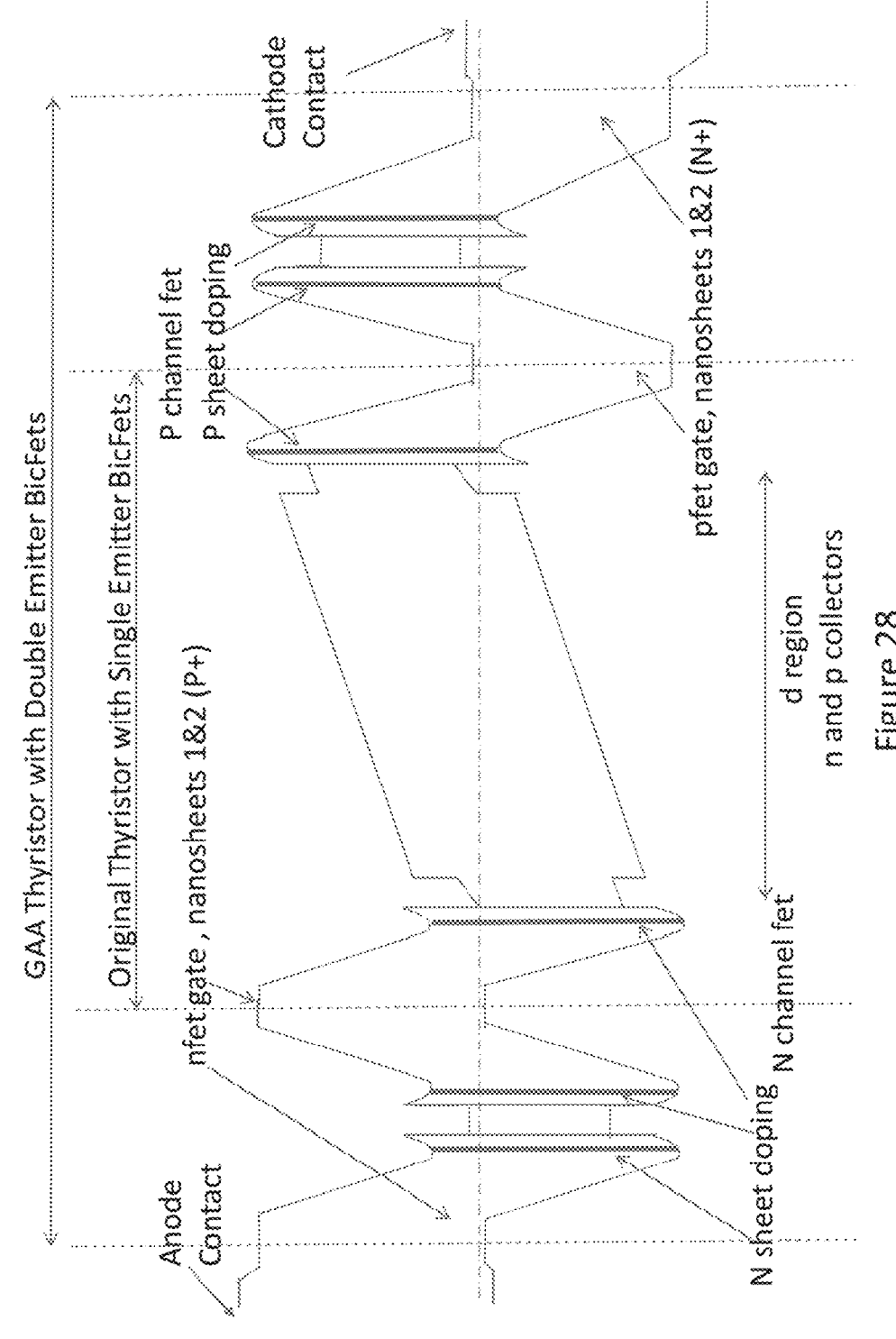
FIG. 28 illustrates an exemplary energy band diagram of a thyristor device implemented by the device structure of FIGS. 1 and 2A-2B.

FIG. 28 illustrates an exemplary energy band diagram of a thyristor at zero bias implemented in the device structure of FIGS. 1 and 2A-2B. For the thyristor labeled GAA thyristor with double emitter BICFETS, the diagram shows two energy barriers to hole flow associated with the anode and two energy barriers to electron flow associated with the cathode. This compares to the thyristor structure (labeled "original thyristor") with single emitter BICFETS which uses one energy barrier at the anode and one at the cathode. Both structures satisfy the requirements for thyristor action which are: i) a complementary pair of bipolar transistors, ii) a common collector region and ii) the base of each component of the pair connected to the collector of the other component. Assuming the inversion layer charge (of electrons in the upper wells and of holes in the lower wells) is equally distributed between the two quantum well sets (either by conduction of electrons over the barrier between 117 and 121/123 in FIG. 2A and conduction of holes over the barrier between 113 and 109/107 in FIG. 2B or due to the common implanted N+ source for electrons and the common implanted P+ source for holes shown in FIG. 11B), then the emitter current injected into the common collector region will be the same for the two structures providing that charge sheets are appropriately reduced (by approximately h) to compensate for the reduction in barrier voltage drop due to the reduced inversion charge. This situation would ensure approximately the same switching voltage ($V_{sw}$) and holding voltage ($V_h$) for the two structures since the barrier voltage drops add in series. Thus, similar performance would be expected for the two structures. Alternatively, the HFET quantum wells (121/123 for electrons and 109/107 for holes) could be designed for smaller voltage drops to achieve smaller values of $V_{sw}$ and $V_h$ if desired by choosing different values for modulation sheet dopings, spacer layer thicknesses, numbers of quantum wells, etc. A good example of this design flexibility is the choice of d (collector region space) in FIG. 27. Since it now has no impact on HFET performance as a back-gate electrode, it may be reduced to much smaller values to achieve desired values of $V_{sw}$ without compromising the HFETs.

Figure 29:
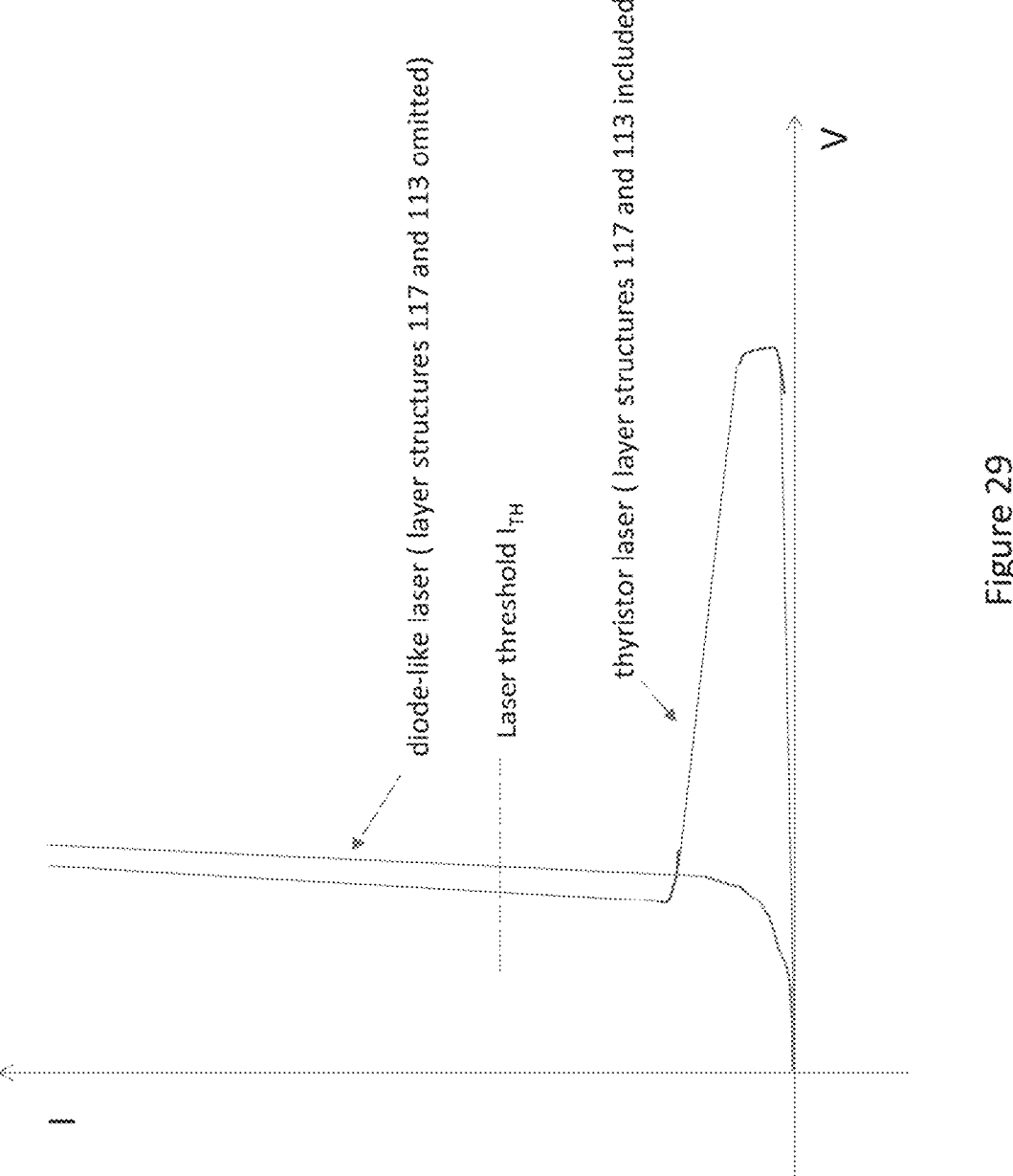
FIG. 29 are plots of current-voltage characteristics of an exemplary thyristor layer device and exemplary diode-like laser device realized from the epitaxial layer structure and fabrication methodology as described herein.

For thyristor laser devices, the device structure switches from a non-conducting/OFF state (where the current I through the device is substantially zero) to a conducting/ON state (where current I is substantially greater than zero) when i) the anode terminal electrode is forward biased with respect to the cathode terminal electrode and ii) the voltage between n-channel source electrode and the anode electrode is biased such that charge is produced in the n-type modulation-doped combined QW structure of 117, 121 and 123 that is greater than the critical switching charge $Q_{CR}$, which is that charge that reduces the forward breakdown voltage such that no off state bias point exists. The voltage between the p-channel source electrode and the cathode electrode can also be configured to produce a charge in the p-type modulation-doped combined QW structure of 113, 109 and 107 that is greater than the critical switching charge $Q_{CR}$. Alternatively, with light incident on the device, absorption may produce the critical switching charge by integrating charge in some or all the sets of quantum wells over time. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through the device falls below the holding current of the device for a sufficient period of time such that the charge in the n-type modulation-doped QW structure 117, 121 and 123 (or the charge in the p-type modulation-doped QW structure 113, 109 and 107) decreases below the holding charge $Q_H$, which is the critical value of the channel charge which will sustain holding action. Thus, if the anode terminal electrode is forward biased with respect to the cathode terminal electrode and the n-channel source electrode (and/or the p-channel source electrode) is biased to produce the critical switching charge $Q_{CR}$ in the n-type modulation-doped QW structure 117, 121 and 123 (or in the p-type modulation-doped QW structure 113, 109 and 107), then the device will switch to its conducting/ON state. In this state there are substantial concentrations of electrons and holes in both sets of quantum wells as required for lasing. If the current I in the conducting/ON state is above the laser threshold $I_{TH}$, then photon emission will occur within the device structure. An example plot of the current-voltage IV characteristics of the thyristor laser is shown in FIG. 29. For the vertical cavity surface emitting laser, the photon emission within the device structure produces the optical mode that is emitted vertically through the top surface of the device structure. For the whispering gallery microresonator, the photon emission within the device structure produces the whispering gallery mode signal that circulates in the waveguide region of the whispering gallery microresonator. For the closed-loop microresonator, the photon emission within the device structure produces the optical mode signal that circulates in the closed-loop waveguide of the closed-loop microresonator.

It is important to note the use of the quantum wells to support laser action in the overall growth structure. There are two groups of quantum wells associated with the NHFET device. The lower one is utilized in switching on and off the thyristor, is not involved in NHFET conduction and is used in generating photons for the thyristor laser and HFET laser. The upper one is utilized in NHFET operation and also generates photons for the thyristor and HFET lasers. There is therefore a design constraint that these groups of quantum wells be spaced apart by $\lambda_{lase}/2$. There are also two groups of quantum wells associated with the PHFET device. The upper one is utilized in switching the thyristor on and off, is not involved in PHFET conduction and may be chosen with the same bandgap as the NHFET quantum wells or with a larger bandgap to prevent interference with the laser function. The lower quantum wells form the conducting channel for the PHFET and are optimized for hole mobility and chosen to not interfere with the laser function.

For the thyristor detector, the device structure switches from a non-conducting/OFF state (where the current I through the device is substantially zero) to a conducting/ON state (where current I is substantially greater than zero) in response to an input optical signal that produces charge in the n-type modulation-doped QW structure 117, 121 and 123 and/or the p-type modulation-doped QW structure 113, 109 and 107 resulting from photon absorption of the input optical signal. Specifically, the anode terminal electrode is forward biased with respect to the cathode terminal electrode and the voltage between n-channel source electrode and the anode electrode (and/or the voltage between the p-channel source electrode and the cathode terminal electrode) is biased such that that charge produced in the n-type modulation-doped QW structure 117, 121 and 123 (and/or the p-type modulation-doped QW structure 113, 109 and 107) resulting from photon absorption of the input optical pulse is greater than the critical switching charge $Q_{CR}$. In this situation the thyristor switches to the ON state and remains there in the presence of the optical input. When the input optical signal is removed, the device switches from the conducting/ON state (where the current I is substantially greater than zero) to a non-conducting/OFF state (where current I is substantially zero) when the free electron charge in the n-type modulation-doped QW structure 17, 121 and 123 (and/or the free hole charge in the p-type modulation-doped QW structure 113, 109 and 107) decreases below the holding charge $Q_H$. For the vertical cavity surface detector, the device structure absorbs the optical mode that is received vertically through the top surface of the device structure. For the whispering gallery microresonator, the device structure absorbs the whispering gallery mode that circulates in the waveguide region of the whispering gallery microresonator. For the closed-loop microresonator, the device structure absorbs the optical mode signal that circulates in the closed-loop waveguide of the closed-loop microresonator.

Figure 30:
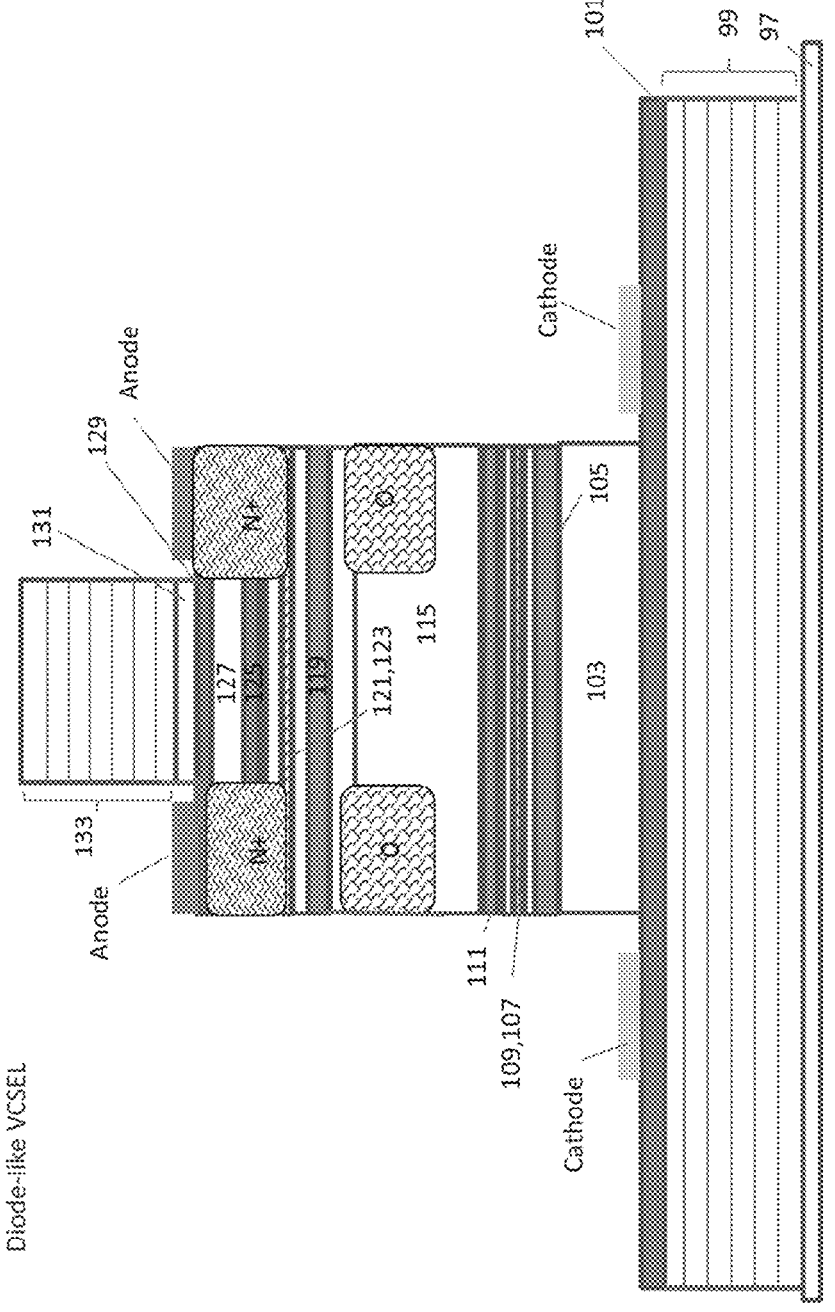
FIGS. 30 and 31 illustrate diode-like laser devices (VCSELs) realized from the epitaxial layer structure and fabrication methodology as described herein.

FIG. 30 illustrates a diode-like laser (analog VCSEL) realized from the epitaxial layer structure and fabrication methodology as described herein. In this embodiment, the epitaxial layer structure omits the inverted p-type modulation-doped quantum well structure 113 spaced vertically below the non-inverted n-type modulation-doped quantum well structure 117, which produces PIN diode-like current-voltage characteristics suitable for analog optical devices that is obtained vertically through the bulk epitaxial layer structure. An example plot of the current-voltage IV characteristics of a diode-like laser (e.g., FIG. 30) is shown in FIG. 29. In this embodiment, if the anode terminal electrode is forward biased with respect to the cathode terminal electrode such that the current I flowing vertically through the device structure is above the laser threshold $I_{TH}$, then photon emission will occur within the device structure. In embodiments, the photon emission can occur in the quantum well layers of both the p-type gate-all-around layer structure (layers 119 to 125) and the n-type gate-all-around layer structure (layers 105 to 111). Light is emitted through the aperture disposed between the anode terminals and through the top mirror 133.

In another embodiment, a device similar to FIG. 30 can be configured to embody an optical detector (analog photodetector) that converts an optical signal to an electrical signal. In this embodiment, if the anode terminal electrode is reversed biased with respect to the cathode terminal electrode, the optical signal received at the optical detector will generate an electrical signal (e.g., current signal at the cathode terminal) whose magnitude matches the intensity of the received optical signal. The received optical signal is directed through the aperture disposed between the anode terminals and into the active device structure. In embodiments, photon absorption can occur in the quantum well layers of both the p-type gate-all-around layer structure (layers 119 to 125) and the n-type gate-all-around layer structure (layers 105 to 111).

Figure 31:
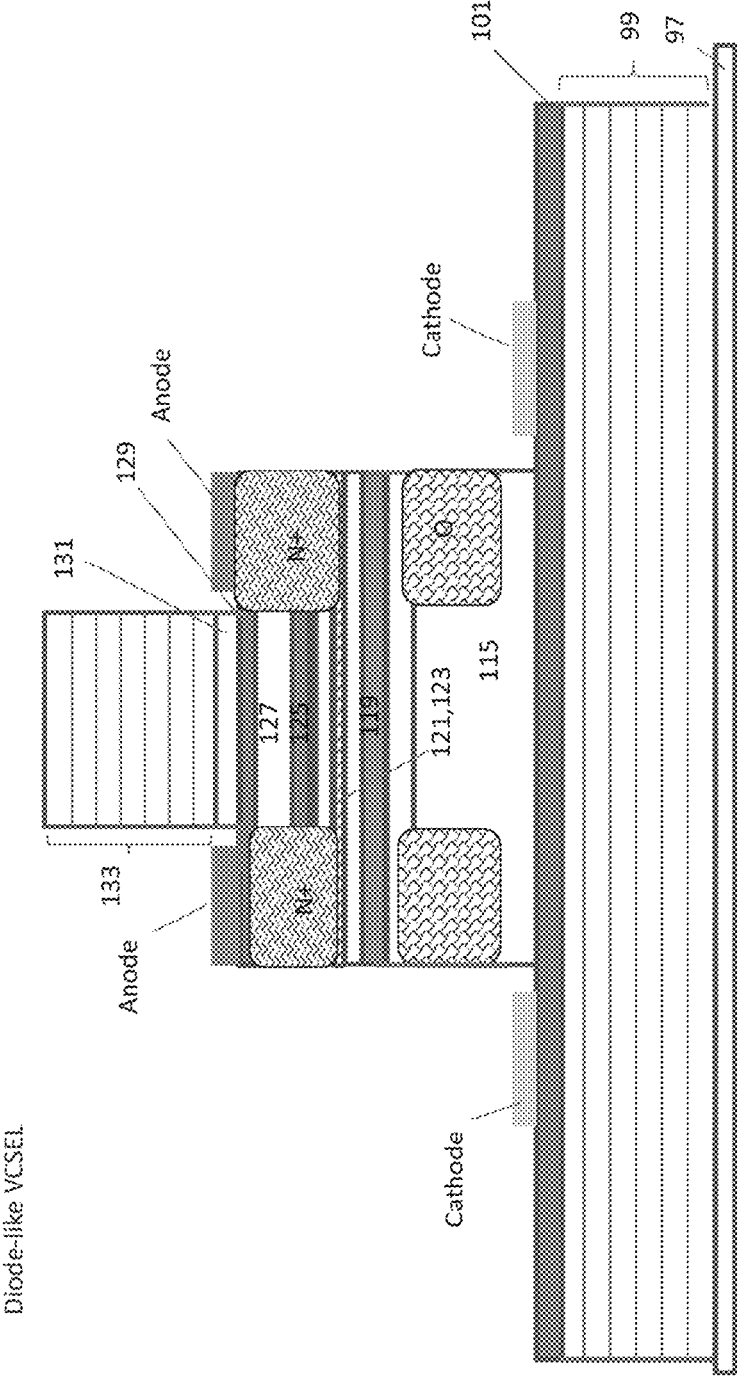

FIG. 31 illustrates another diode-like laser (analog VCSEL) realized from the epitaxial layer structure and fabrication methodology as described herein. In this embodiment, the epitaxial layer structure omits the inverted p-type modulation-doped quantum well structure 113 spaced vertically below the non-inverted n-type modulation-doped quantum well structure 117 as well as the n-type gate-all-around layer structure (layers 105 to 111), which produces PIN diode-like current-voltage characteristics suitable for analog optical devices that is obtained vertically through the bulk epitaxial layer structure. An example plot of the current-voltage IV characteristics of a diode-like laser (e.g., FIG. 31) is shown in FIG. 29. In this embodiment, if the anode terminal electrode is forward biased with respect to the cathode terminal electrode such that the current I flowing vertically through the device structure is above the laser threshold $I_{TH}$, then photon emission will occur within the device structure. In embodiments, the photon emission can occur in the quantum well layers of the p-type gate-all-around layer structure (layers 119 to 125). Light is emitted through the aperture disposed between the anode terminals and through the top mirror 133.

In another embodiment, a device similar to FIG. 31 can be configured to embody an optical detector (analog photodetector) that converts an optical signal to an electrical signal. In this embodiment, if the anode terminal electrode is reversed biased with respect to the cathode terminal electrode, the optical signal received at the optical detector will generate an electrical signal (e.g., current signal at the cathode terminal) whose magnitude matches the intensity of the received optical signal. The received optical signal is directed through the aperture disposed between the anode terminals and into the active device structure. In embodiments, photon absorption can occur in the quantum well layers of the p-type gate-all-around layer structure (layers 119 to 125).

In some embodiments, a diffraction grating can be formed in the device structures described above to provide total reflection in an in-plane waveguide. In effect, the diffraction gating provides a mirror across the waveguide.

It is also contemplated that the layer structure as described herein can include a metamorphic buffer structure formed on the substrate between the bottom mirror layer(s) and the bottom n-type layers of the active device structure. The metamorphic buffer structure can employ a plurality of layers that are configured to accommodate lattice strain due to mismatch between the active device structure and the substrate. An example of such a metamorphic buffer structure is described in U.S. patent application Ser. No. 14/222, 841, filed on Mar. 24, 2014, herein incorporated by reference in its entirety.

There have been described and illustrated herein several embodiments of integrated circuits and associated fabrication methods that employ complementary modulation-doped quantum well structures for both complementary transistor devices and optoelectronic devices that are integrally formed as part of the integrated circuit. While particular embodiments of the invention have been described, it is not intended that the invention be limited thereto, as it is intended that the invention be as broad in scope as the art will allow and that the specification be read likewise. Thus, while particular group III-V material system and hetero-structures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A method of forming an integrated circuit comprising:
depositing or providing a plurality of semiconductor layers supported on a substrate, wherein the plurality of semiconductor layers include a p-type gate-all-around layer structure that includes a plurality of quantum well structures formed between a pair of p-type thin doped layers spaced vertically from each other;
implanting p-type ions into the plurality of semiconductor layers to form at least one ion-implanted p-type gate contact region that extends through the p-type gate-all-around layer structure and contacts the p-type thin doped layers of the p-type gate-all-around layer structure;
implanting n-type ions into the plurality of semiconductor layers to form an ion-implanted n-type source contact region and an ion-implanted n-type drain contact region, both of which are in contact with the p-type gate-all-around layer structure;
forming a gate electrode of an n-channel heterojunction field effect transistor (HFET) device in contact with the at least one ion-implanted p-type gate contact region; and
forming source and drain electrodes of the n-channel HFET device in contact with the ion-implanted n-type source contact region and the ion-implanted n-type drain contact region, respectively.

2. The method according to claim 1, wherein:
the plurality of semiconductor layers further includes a non-inverted n-type modulation-doped quantum well structure formed below the p-type gate-all-around layer structure, wherein the non-inverted n-type modulation-doped quantum well structure includes an n-type charge sheet disposed above at least one pair of quantum well layer and barrier layer.

3. The method according to claim 2, wherein:
the ion-implanted n-type source contact region and the ion-implanted n-type drain contact region are both in contact with the non-inverted n-type modulation-doped quantum well structure.

4. The method according to claim 1, wherein:
the plurality of semiconductor layers further includes at least one additional layer formed above the p-type gate-all-around layer structure;
an etch operation (E1) is performed into the plurality of semiconductor layers, wherein the etch operation (E1) exposes a portion of the at least one additional layer; and
p-type ions are implanted into the plurality of semiconductor layers through the portion of the at least one additional layer exposed by the etch operation (E1) to form the at least one ion-implanted p-type gate contact region.

5. The method according to claim 1, wherein:
the plurality of quantum well structures of the p-type gate-all-around layer structure comprises a non-inverted n-type modulation-doped quantum well structure disposed above an inverted n-type modulation-doped quantum well structure, wherein the non-inverted n-type modulation-doped quantum well structure includes an n-type charge sheet disposed above at least one pair of quantum well layer and barrier layer, and wherein the inverted n-type modulation-doped quantum well structure includes at least one pair of quantum well layer and barrier layer disposed above the n-type charge sheet.

6. The method according to claim 1, further comprising:
performing thermal anneal operations that anneal the at least one ion-implanted p-type gate contact region, the ion-implanted n-type source contact region, and the ion-implanted n-type drain contact region before forming the gate electrode and the source and drain electrodes of the n-channel HFET device.

7. The method according to claim 1, further comprising:
forming a feature from a refractory metal, wherein the feature overlies a quantum well channel region provided by the p-type gate-all-around layer structure, wherein the ion-implanted n-type source contact region and the ion-implanted n-type drain contact region are disposed opposite one another along opposite sides of the feature, and the at least one ion-implanted p-type gate contact region is disposed adjacent at least one end of the feature.

8. The method according to claim 1, wherein:
the plurality of semiconductor layers further includes an n-type gate-all-around layer structure that includes at least one quantum well structure formed between a pair of n-type thin doped layers spaced vertically from one another, wherein at least one spacer layer is disposed between the p-gate-all-around layer structure and the n-type gate-all-around layer structure.

9. The method according to claim 8, further comprising:
implanting n-type ions into the plurality of semiconductor layers to form at least one ion-implanted n-type gate contact region that extends through the n-type gate-all-around layer structure and contacts the n-type thin doped layers of the n-type gate-all-around layer structure;
implanting p-type ions into the plurality of semiconductor layers to form an ion-implanted p-type source contact region and an ion-implanted p-type drain contact region, both of which are in contact with the n-type gate-all-around layer structure;

forming a gate electrode of a p-channel heterojunction field effect transistor (HFET) device in contact with the at least one ion-implanted n-type gate contact region; and forming source and drain electrodes of the p-channel HFET device in contact with the ion-implanted n-type source contact region and the ion-implanted n-type drain contact region, respectively.

10. The method according to claim 9, wherein:

the plurality of semiconductor layers further includes an inverted p-type modulation-doped quantum well structure formed above the n-type gate-all-around layer structure, wherein the inverted p-type modulation-doped quantum well structure includes at least one pair of quantum well layer and barrier layer disposed above a p-type charge sheet by the at least one spacer layer.

11. The method according to claim 10, wherein:

the ion-implanted p-type source contact region and the ion-implanted n-type drain contact region are both in contact with the inverted p-type modulation-doped quantum well structure.

12. The method according to claim 9, further comprising:

performing an etch operation (E2) into the plurality of semiconductor layers, wherein the etch operation (E2) exposes a portion of the at least one spacer layer;

wherein the n-type ions are implanted into the plurality of semiconductor layers through the portion of the at least one spacer layer exposed by the etch operation (E2) to form the at least one ion-implanted n-type gate contact region.

13. The method according to claim 8, wherein:

the at least one quantum well structure of the n-type gate-all-around layer structure comprises a non-inverted p-type modulation-doped quantum well structure disposed above an inverted p-type modulation-doped quantum well structure, wherein the non-inverted p-type modulation-doped quantum well structure includes a p-type charge sheet disposed above at least one pair of quantum well layer and barrier layer, and wherein the inverted p-type modulation-doped quantum well structure includes at least one pair of quantum well layer and barrier layer disposed above the p-type charge sheet.

14. The method according to claim 9, further comprising:

performing thermal anneal operations that anneal the at least one ion-implanted n-type gate contact region, the ion-implanted p-type source contact region, and the ion-implanted p-type drain contact region before forming the gate electrode and the source and drain electrodes of the p-channel HFET device.

15. The method according to claim 9, further comprising:

forming an additional feature from a refractory metal, wherein the additional feature overlies a quantum well channel region provided by the n-type gate-all-around layer structure, wherein the ion-implanted p-type source contact region and the ion-implanted p-type drain contact region are disposed opposite each other along opposite sides of the additional feature, and the at least one ion-implanted n-type gate contact region is disposed adjacent at least one end of the additional feature.

16. The method according to claim 10, wherein:

the plurality of semiconductor layers further includes a non-inverted n-type modulation-doped quantum well structure formed below the p-type gate-all-around layer structure, wherein the non-inverted n-type modulation-doped quantum well structure includes an n-type charge sheet disposed above at least one pair of quantum well layer and barrier layer.

17. The method according to claim 1, further comprising:

while forming the n-channel HFET device, forming at least one optoelectronic device or optical device as part of the integrated circuit;

wherein the at least one optoelectronic device or optical device optionally has PIN diode-like current-voltage characteristics; and wherein the at least one optoelectronic device or optical device optionally has thyristor-like current-voltage characteristics.

18. The method according to claim 1, wherein:

the plurality of semiconductor layers comprises III-V compound semiconductor materials, such as gallium arsenide semiconductor materials.

* * * * *